US010446404B2

(12) United States Patent
Tajima et al.

(10) Patent No.: US 10,446,404 B2
(45) Date of Patent: Oct. 15, 2019

(54) ELECTRON-BEAM IRRADIATED AREA ADJUSTMENT METHOD AND ADJUSTMENT SYSTEM, ELECTRON-BEAM IRRADIATED REGION CORRECTION METHOD, AND ELECTRON BEAM IRRADIATION APPARATUS

(71) Applicant: EBARA CORPORATION, Tokyo (JP)

(72) Inventors: Ryo Tajima, Tokyo (JP); Masahiro Hatakeyama, Tokyo (JP); Kenichi Suematsu, Tokyo (JP); Kiwamu Tsukamoto, Tokyo (JP); Kenji Watanabe, Tokyo (JP); Shoji Yoshikawa, Tokyo (JP); Shinichi Okada, Tokyo (JP); Kenji Terao, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 59 days.

(21) Appl. No.: 15/873,108

(22) Filed: Jan. 17, 2018

(65) Prior Publication Data

US 2018/0233374 A1    Aug. 16, 2018

(30) Foreign Application Priority Data

Feb. 16, 2017 (JP) .................................. 2017-026951

(51) Int. Cl.
| | |
|---|---|
| *H01L 37/00* | (2006.01) |
| *H01L 21/3065* | (2006.01) |
| *H01J 37/147* | (2006.01) |
| *H01J 37/305* | (2006.01) |
| *H01J 37/302* | (2006.01) |
| *H01L 21/027* | (2006.01) |

(52) U.S. Cl.
CPC ...... *H01L 21/3065* (2013.01); *H01J 37/1474* (2013.01); *H01J 37/3023* (2013.01); *H01J 37/3053* (2013.01); *H01L 21/0273* (2013.01)

(58) Field of Classification Search
CPC .............. H01L 21/3065; H01L 21/0273; H01J 37/1474; H01J 37/3023; H01J 37/3053
USPC ........................... 250/306, 307, 492.1–492.3
See application file for complete search history.

(56) References Cited

U.S. PATENT DOCUMENTS

| | | | | |
|---|---|---|---|---|
| 2011/0297826 | A1* | 12/2011 | Madokoro | ............ H01J 37/153 250/307 |
| 2015/0371813 | A1* | 12/2015 | Hatakeyama | ............ H01J 37/20 250/400 |

FOREIGN PATENT DOCUMENTS

JP        2016-027604 A        2/2016

* cited by examiner

*Primary Examiner* — Michael Maskell
(74) *Attorney, Agent, or Firm* — Pearne & Gordon LLP

(57) ABSTRACT

Provided is a method of adjusting an electron-beam irradiated area in an electron beam irradiation apparatus that deflects an electron beam with a deflector to irradiate an object with the electron beam, the method including: emitting an electron beam while changing an irradiation position on an adjustment plate by controlling the deflector in accordance with an electron beam irradiation recipe, the adjustment plate detecting a current corresponding to the emitted electron beam; acquiring a current value detected from the adjustment plate; forming image data corresponding to the acquired current value; determining whether the electron-beam irradiated area is appropriate based on the formed image data; and updating the electron beam irradiation recipe when the electron-beam irradiated area is determined not to be appropriate.

7 Claims, 65 Drawing Sheets

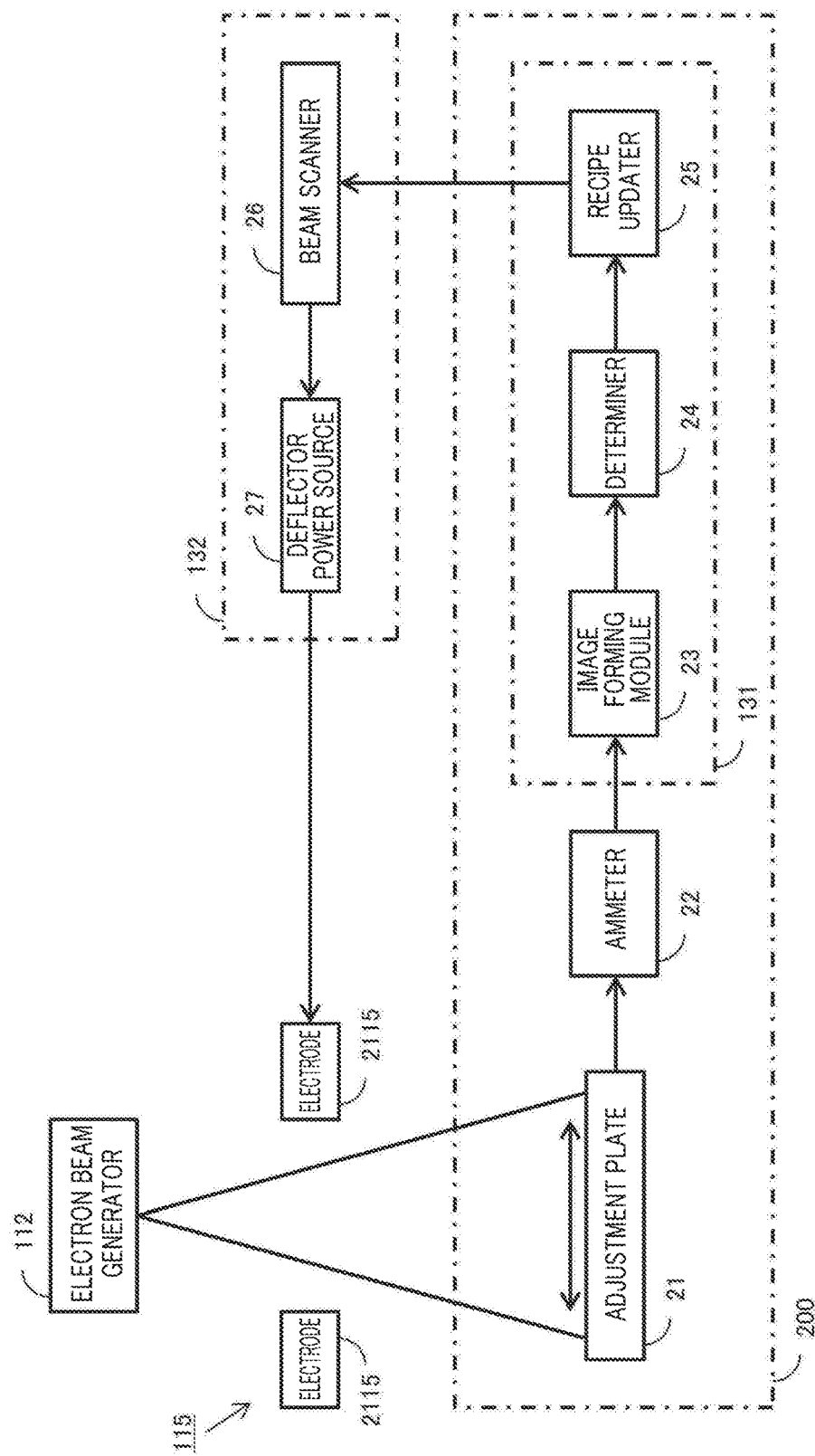

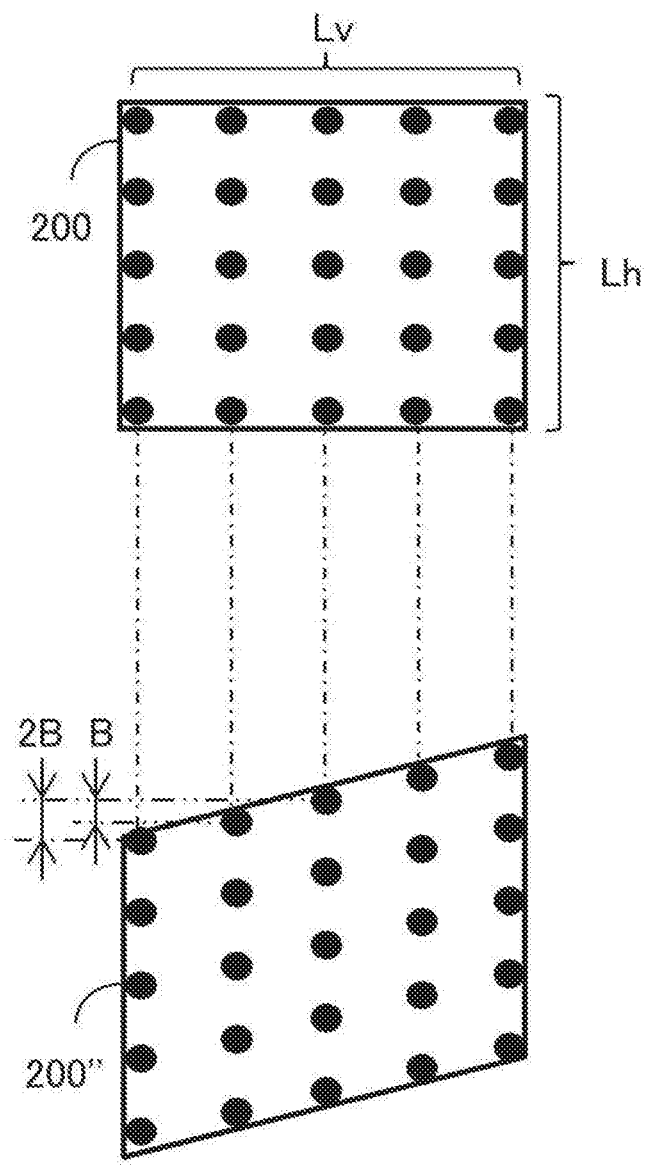

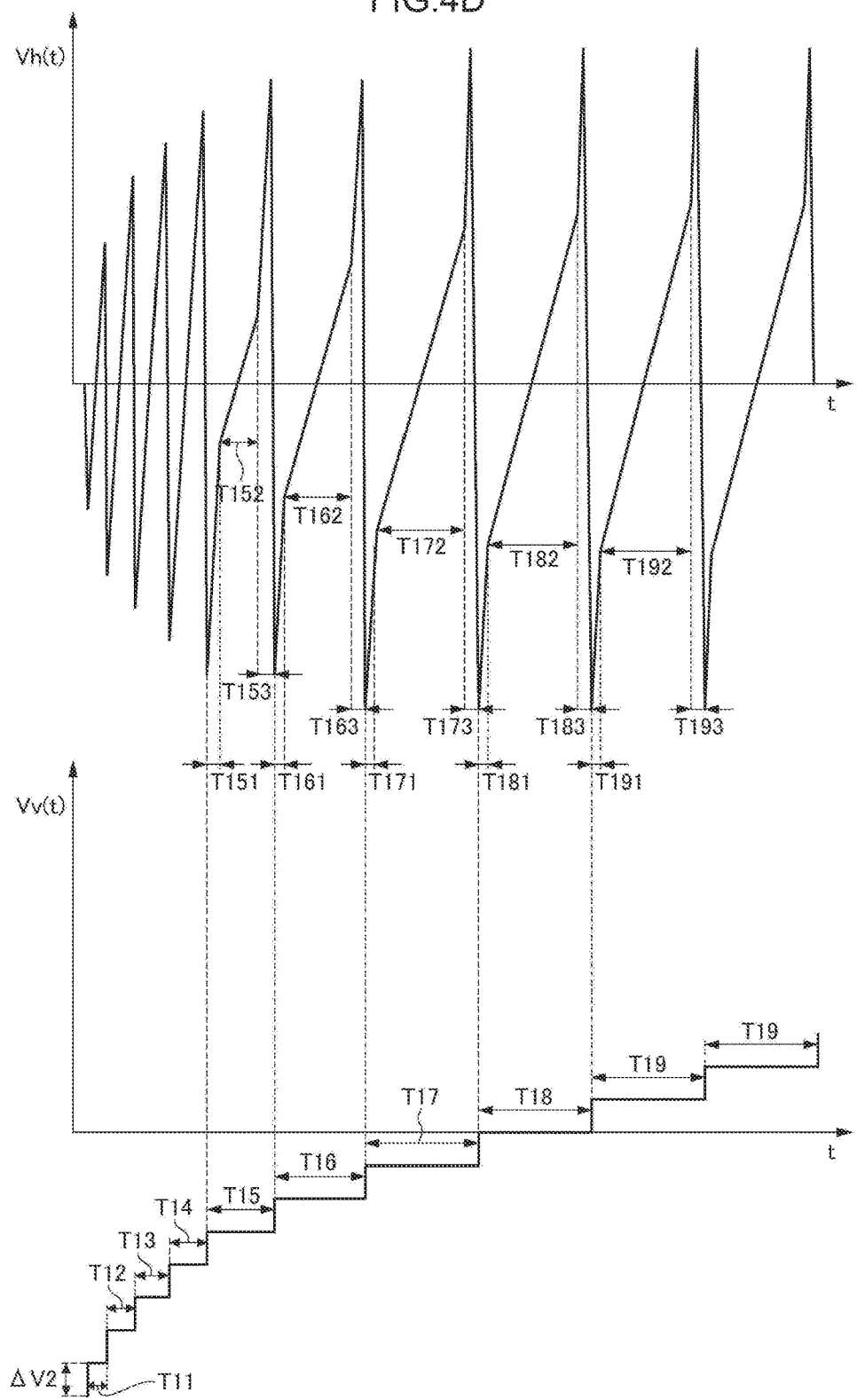

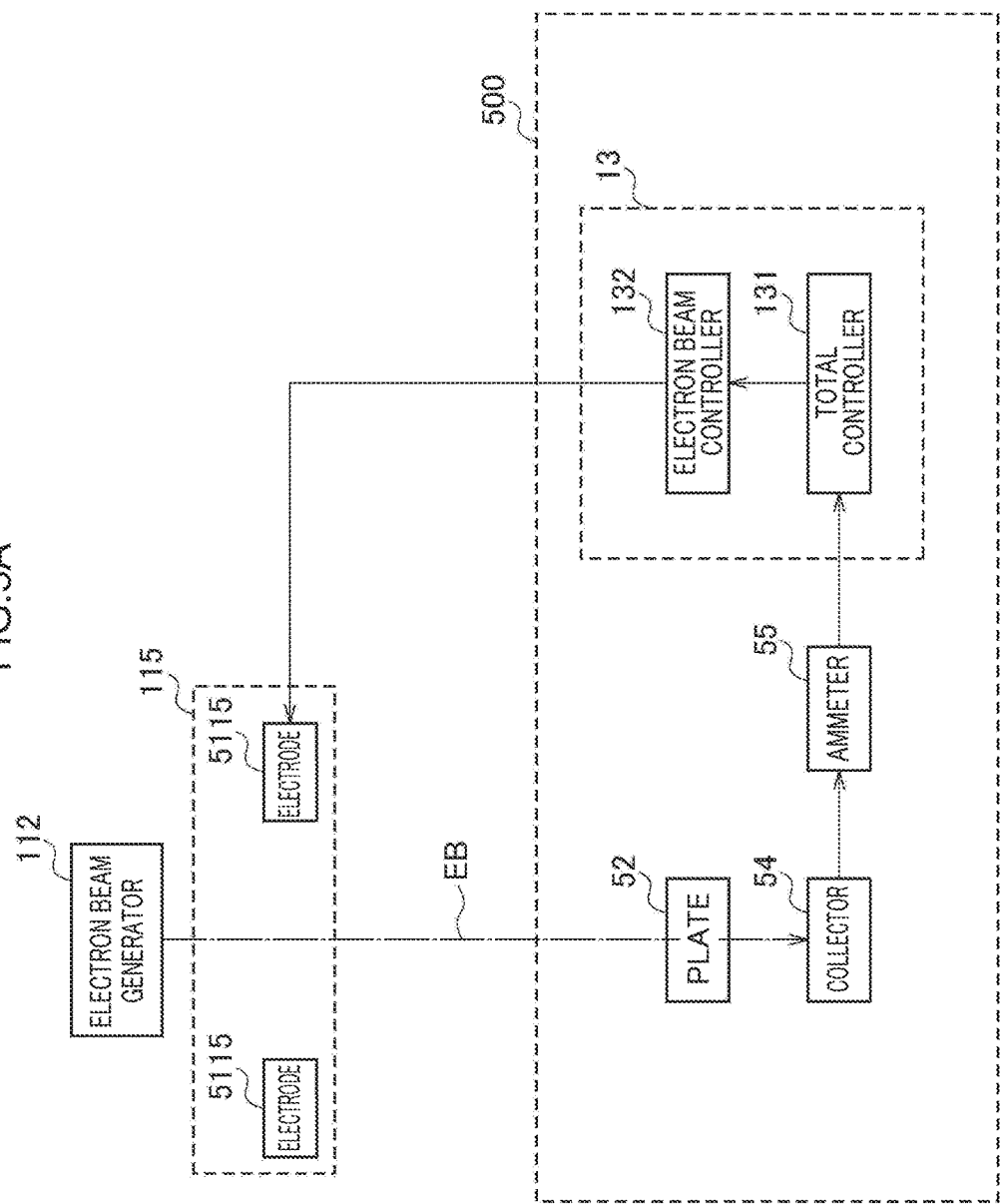

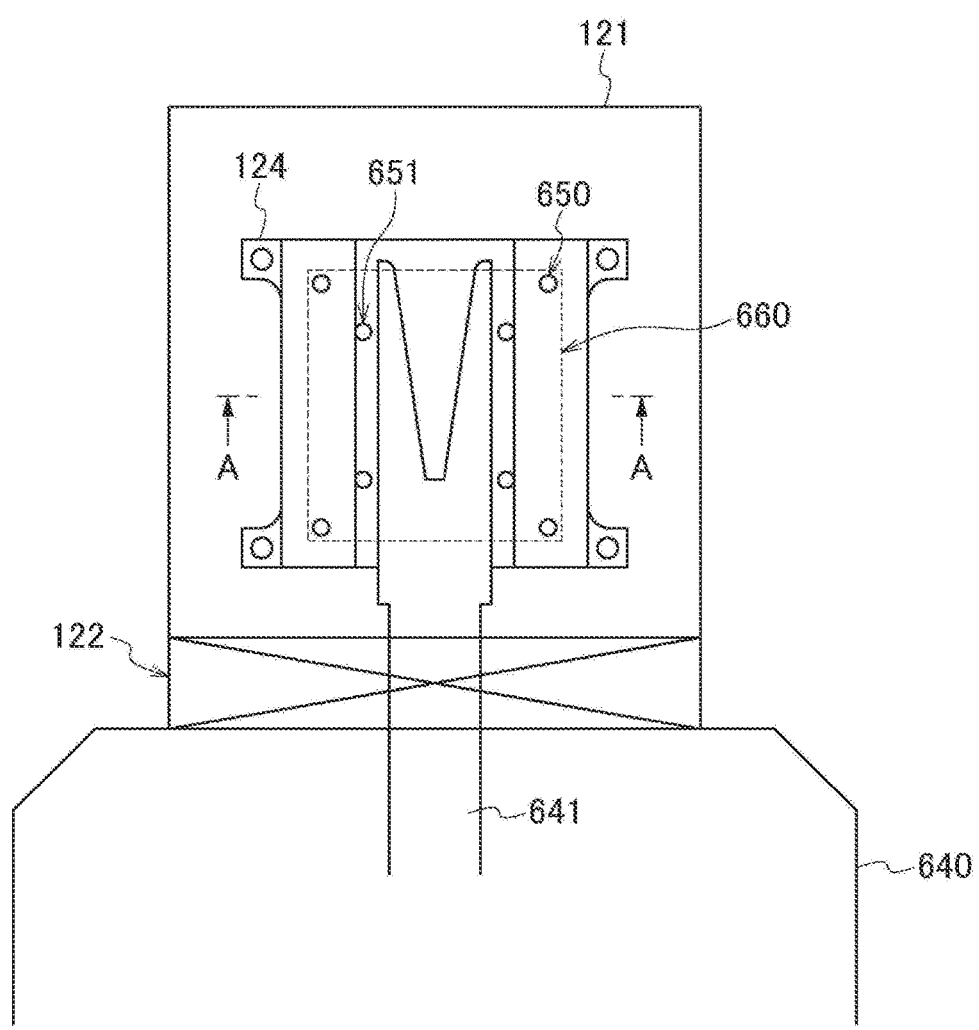

82

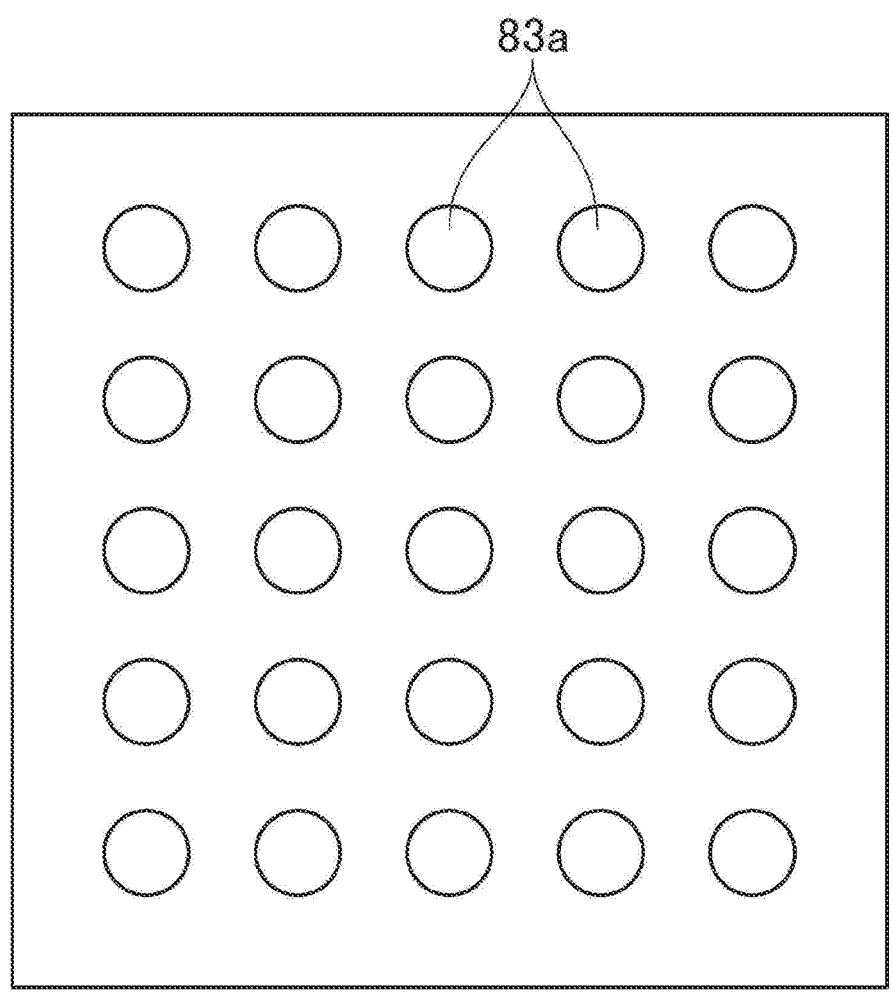

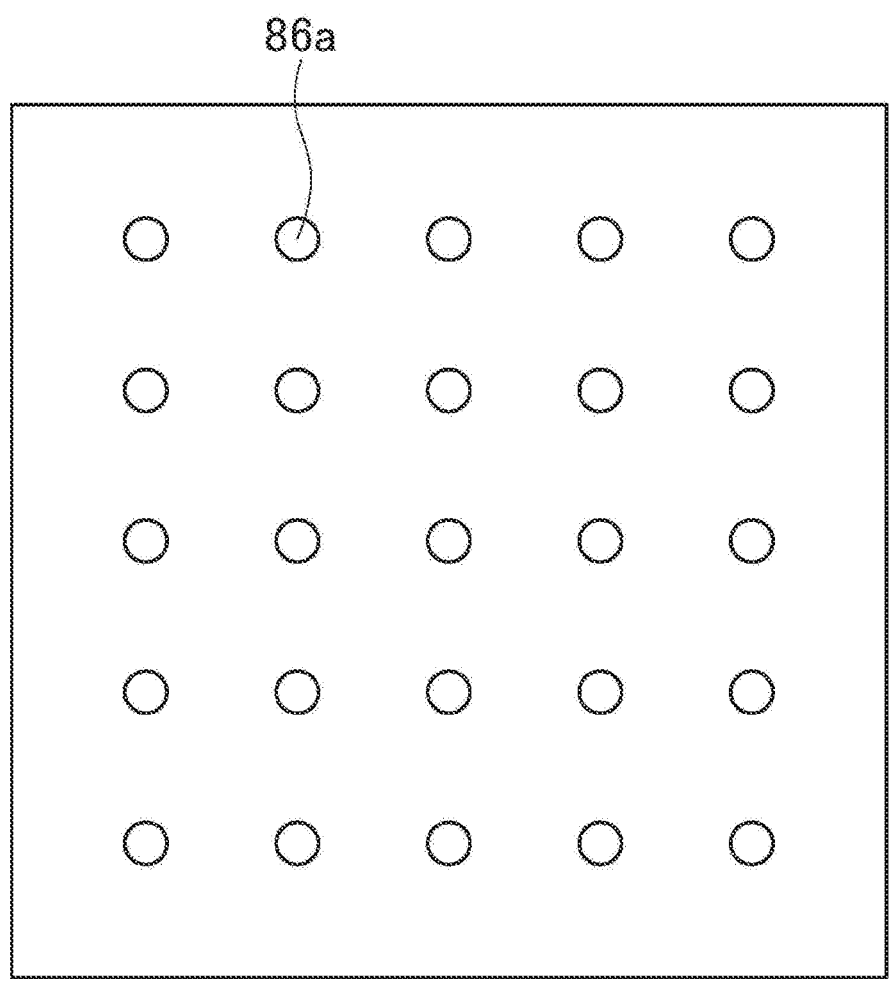

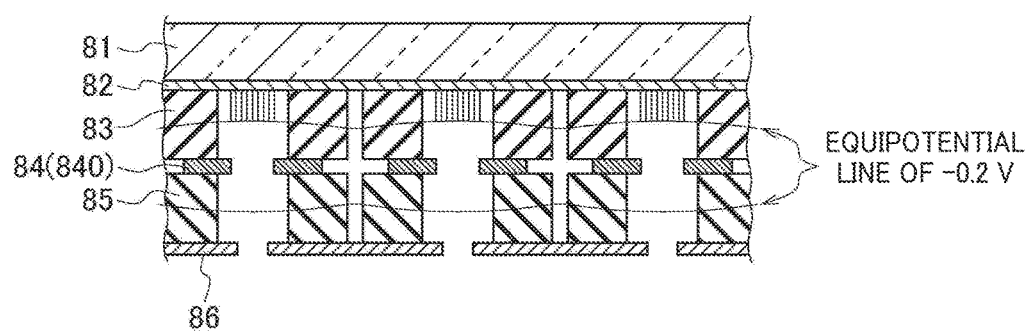

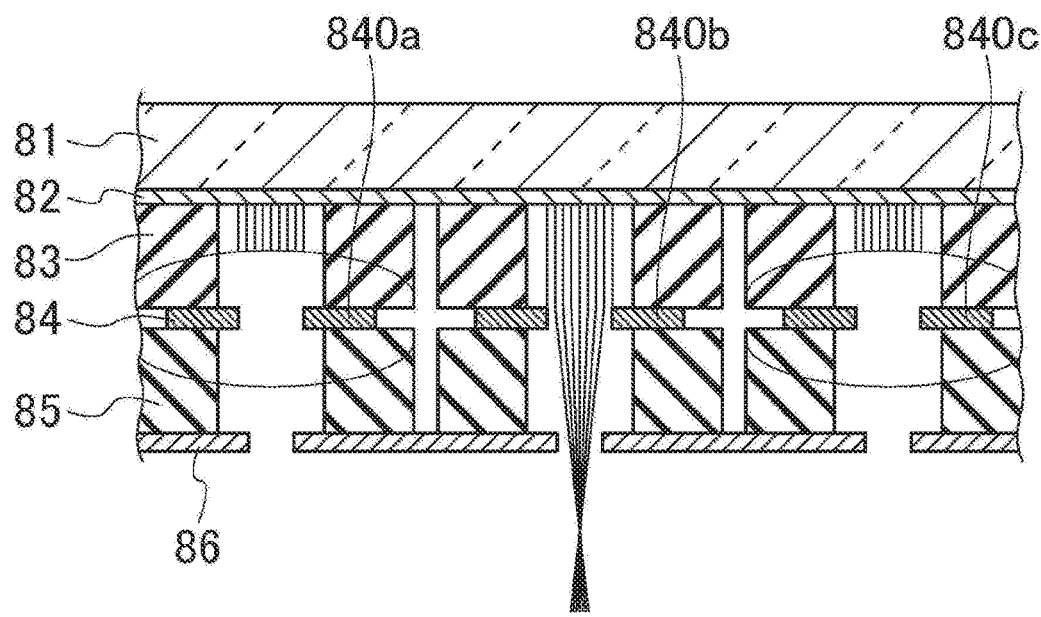

84

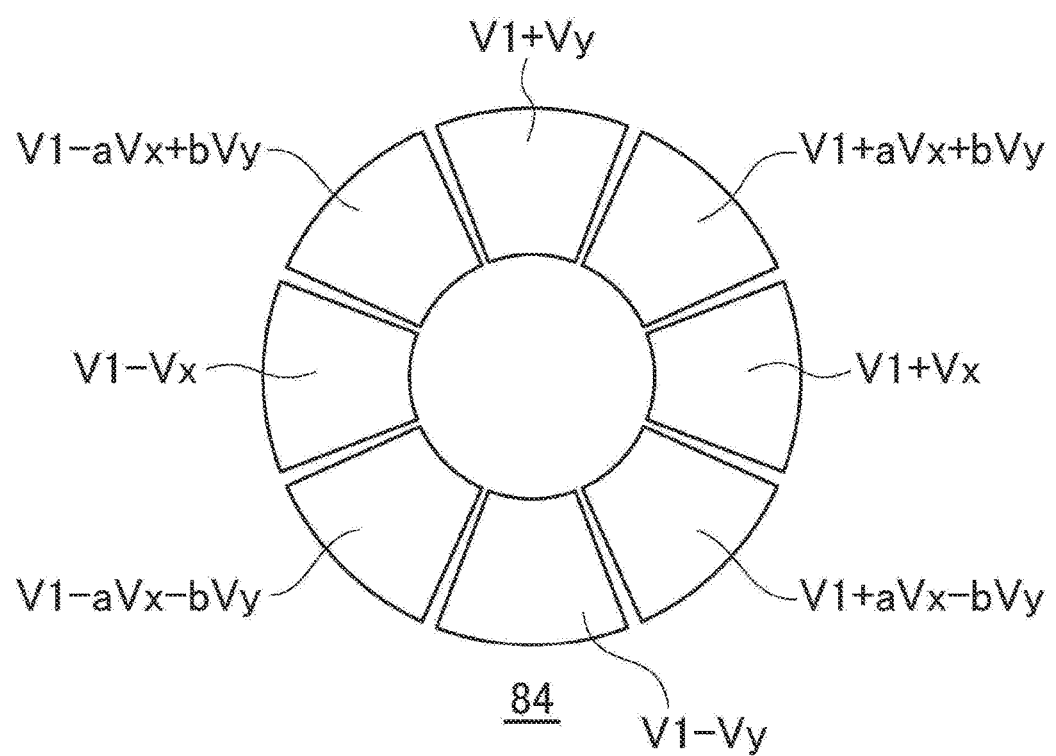

ELECTRON-BEAM IRRADIATED AREA ADJUSTMENT METHOD AND ADJUSTMENT SYSTEM, ELECTRON-BEAM IRRADIATED REGION CORRECTION METHOD, AND ELECTRON BEAM IRRADIATION APPARATUS

CROSS-REFERENCE TO RELATED APPLICATIONS

This application claims the benefit of Japanese Priority Patent Application JP 2017-026951 filed on Feb. 16, 2017, the entire contents of which are incorporated herein by reference.

FIELD

The present technology relates to an electron-beam irradiated area adjustment method and an adjustment system, an electron-beam irradiated region correction method, and an electron beam irradiation apparatus.

BACKGROUND AND SUMMARY

An electron beam irradiation apparatus is designed to increase the etching resistance of a mask by irradiating the mask with an electron beam in a semiconductor device manufacturing process, for example.

There is a demand for a high-performance electron beam irradiation apparatus.

According to one embodiment, provided is a method of adjusting an electron-beam irradiated area in an electron beam irradiation apparatus that deflects an electron beam with a deflector to irradiate an object with the electron beam, the method comprising: emitting an electron beam while changing an irradiation position on an adjustment plate by controlling the deflector in accordance with an electron beam irradiation recipe, the adjustment plate detecting a current corresponding to the emitted electron beam; acquiring a current value detected from the adjustment plate; forming image data corresponding to the acquired current value; determining whether the electron-beam irradiated area is appropriate based on the formed image data; and updating the electron beam irradiation recipe when the electron-beam irradiated area is determined not to be appropriate.

According to another embodiment, provided is an electron-beam irradiated area adjustment system that adjusts an electron-beam irradiated area in an electron beam irradiation apparatus that deflects an electron beam with a deflector to irradiate an object with the electron beam, the electron-beam irradiated area adjustment system comprising: an adjustment plate that detects a current corresponding to an emitted electron beam; an ammeter that acquires a current value detected from the adjustment plate; an image forming module that forms image data corresponding to the acquired current value; a determiner that determines whether the electron-beam irradiated area is appropriate based on the formed image data; and a recipe updater that updates the electron beam irradiation recipe for controlling the deflector when the electron-beam irradiated area is determined not to be appropriate.

According to another embodiment, provided is an electron-beam irradiated region correction method implemented in an electron beam irradiation apparatus that is designed to irradiate a rectangular region as a target with an electron beam by applying a voltage $V1(t)$ to a first electrode to perform scanning in a first direction with an electron beam from an electron beam generator, and applying a voltage $V2(t)$ to a second electrode to perform scanning in a second direction with the electron beam, the voltage $V1(t)$ varying with time t, the voltage $V2(t)$ varying with time t, the second direction being perpendicular to the first direction, the electron-beam irradiated region correction method comprising correcting an electron-beam irradiated region to have a rectangular shape by applying a voltage $V1(t)+kV2(t)$ (k being a constant) to the first electrode and applying the voltage $V2(t)$ to the second electrode, when the electron-beam irradiated region is not a rectangular region but a parallelogram region distorted in the first direction.

According to another embodiment, provided is an electron beam irradiation apparatus that is designed to irradiate a rectangular region as a target with an electron beam by applying a voltage $V1(t)$ to a first electrode to perform scanning in a first direction with an electron beam from an electron beam generator, and applying a voltage $V2(t)$ to a second electrode to perform scanning in a second direction with the electron beam, the voltage $V1(t)$ varying with time t, the voltage $V2(t)$ varying with time t, the second direction being perpendicular to the first direction, the electron beam irradiation apparatus comprising an electron beam control device that applies a voltage $V1(t)+kV2(t)$ (k being a constant) to the first electrode and applies the voltage $V2(t)$ to the second electrode, when an electron-beam irradiated region is not a rectangular region but a parallelogram region distorted in the first direction, whereby the electron beam control device corrects the electron-beam irradiated region to have a rectangular shape.

According to another embodiment, provided is an electron beam irradiation apparatus comprising: an electron beam generator that generates an electron beam; a first electrode that deflects the electron beam from the electron beam generator in a first direction; a second electrode that deflects the electron beam from the electron beam generator in a second direction perpendicular to the first direction; and an electron beam control device that controls voltages to be applied to the first electrode and the second electrode, wherein the electron beam irradiation apparatus is designed to irradiate a rectangular region as a target with an electron beam by applying a voltage $V1(t)$ to the first electrode to perform scanning in the first direction with the electron beam from the electron beam generator, and applying a voltage $V2(t)$ to the second electrode to perform scanning in the second direction with the electron beam, the voltage $V1(t)$ varying with time t, the voltage $V2(t)$ varying with time t, and, when an electron-beam irradiated region is not a rectangular region but a parallelogram region distorted in the first direction, the electron beam control device applies a voltage $V1(t)+kV2(t)$ (k being a constant) to the first electrode and applies the voltage $V2(t)$ to the second electrode, to correct the electron-beam irradiated region to have a rectangular shape.

BRIEF DESCRIPTION OF DRAWINGS

FIG. 2A is a diagram showing the basic configuration of an irradiated area adjustment system 200 in an electron beam irradiation apparatus;

FIG. 2CB is a diagram schematically showing an electron-beam irradiated area with respect to the adjustment plate 21;

FIG. 2FB is a graph showing the relationship between the irradiated area shown in FIG. 2CB and time;

FIG. 2GB is a graph showing temporal changes in the current value to be obtained;

FIG. 2HB is a diagram showing the image data formed in accordance with the current values shown in FIG. 2GA;

FIG. 2I is a graph showing temporal changes in the adjusted voltage to be applied to the electrodes 2115;

FIG. 3D is a diagram schematically showing electron-beam irradiated regions 200 and 200";

FIG. 4D is a graph schematically showing the voltages Vh(t) and Vv(t) to be applied to the electrodes H and V, respectively, in the deflector 115 in the portion from a point 4P1 to a point 4P2 in the irradiated region 42 shown in FIG. 4C;

FIG. 5A is a diagram schematically showing the configuration of an electron beam position detecting system 500 according to this embodiment;

FIG. 6D of a plan view of a structure for robot hand teaching;

FIG. 8C is a diagram showing an insulating layer 83 viewed from below;

FIG. 8E is a diagram showing a diaphragm 86 viewed from below;

FIG. 8G is a simulation result showing the shape of electron beams emitted in a case where the voltage applied to each electrode 840 is −0.50 V;

FIG. 8K is a simulation result showing the shapes of electron beams emitted in a case where the voltages applied to adjacent electrodes 840a through 840c are −0.50 V, −0.13 V, and −0.50 V, respectively;

FIG. 8P is a diagram showing a variation of an electrode 840; and

DETAILED DESCRIPTION OF NON-LIMITING EXAMPLE EMBODIMENTS

The following is a description of an electron beam irradiation apparatus according to an embodiment. It should be noted that the embodiment described below is an example case where the present technology is embodied, and does not limit the present technology to the specific structures described below. In embodying the present technology, any appropriate specific structure according to an embodiment may be adopted.

First, the basic configuration of an electron beam irradiation apparatus is described.

Figure 1A:
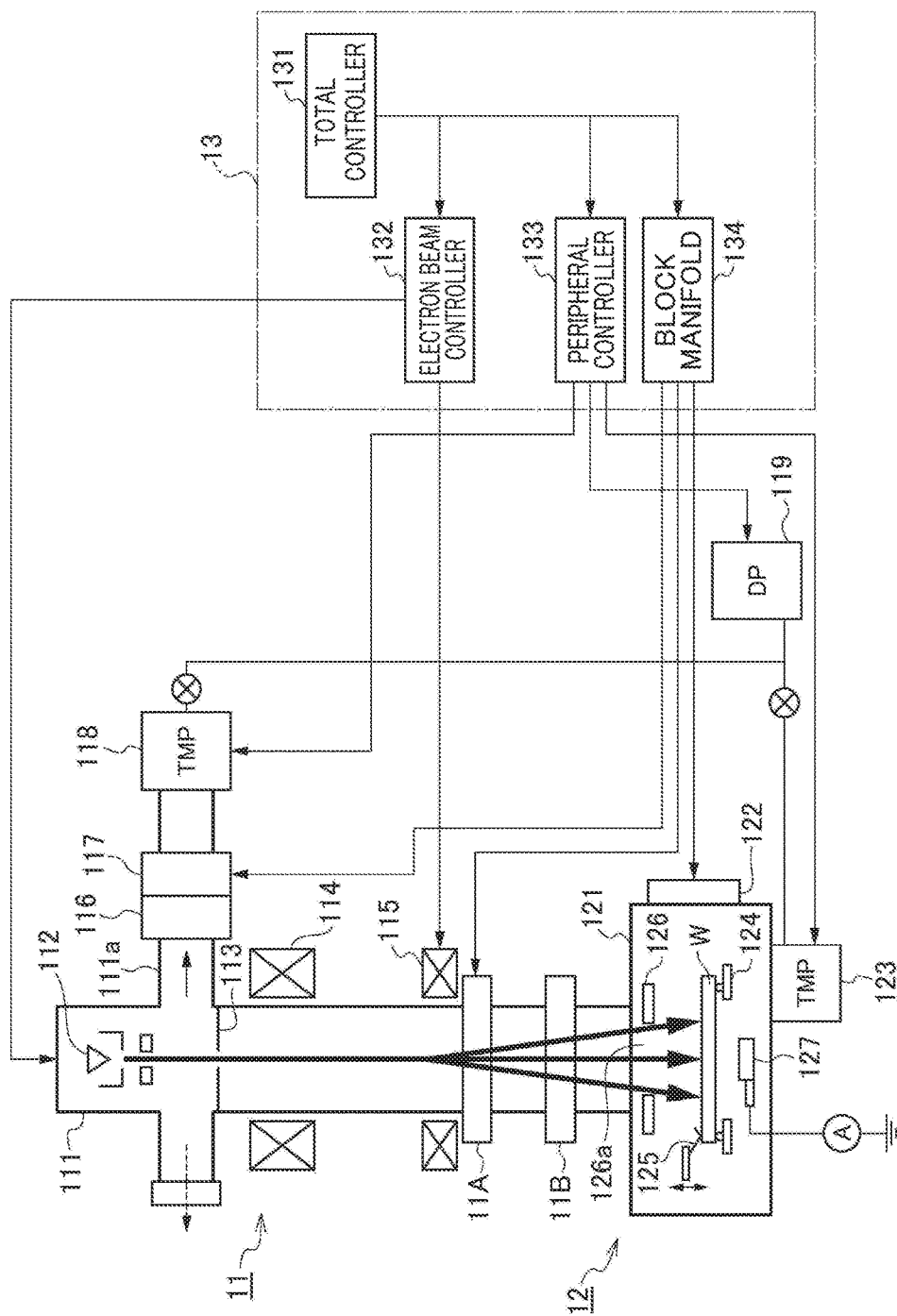
FIG. 1A is a diagram schematically showing the basic configuration of an electron beam irradiation apparatus.

FIG. 1A is a diagram schematically showing the basic configuration of the electron beam irradiation apparatus. A sample W to be processed by this electron beam irradiation apparatus is a nanoimprint lithography (NIL) mask, an extreme ultraviolet lithography (EUV) mask, or the like. The electron beam irradiation apparatus is suitable for processing a mask to be used in manufacturing a fine pattern of 100 nm or smaller, or more particularly, 20 nm or smaller. Alternatively, the sample W may be a semiconductor wafer made of Si, GaAs, or the like.

The electron beam irradiation apparatus includes a column portion 11, a main chamber portion 12 provided under the column portion 11, and a controller 13.

The column portion 11 has a cylindrical vacuum tube 111 extending in the vertical direction, an electron beam generator 112, an aperture 113, a lens 114, a deflector 115, a sensor unit 116, a gate valve 117, a turbo-molecular pump 118, a gate valve 11A, and a particle catcher 11B.

The electron beam generator 112 is provided in an upper part of the vacuum tube 111, and emits an electron beam downward. An example structure of the electron beam generator 112 will be described later in a seventh embodiment. The aperture 113 is provided below the electron beam generator 112, and the electron beam passes through an opening that is formed at the center of the aperture 113 and has a diameter of 2 mm or smaller. The deflector 115 is provided below the lens 114, and can deflect the electron beam. It should be noted that the lens 114 may be an electrostatic lens provided inside the vacuum tube 111, or may be a magnetic lens provided outside the vacuum tube 111. Further, the deflector 115 may be an electrostatic deflector provided inside the vacuum tube 111, or may be a magnetic deflector provided outside the vacuum tube 111.

The vacuum tube 111 has an intermediate evacuation line 111a that horizontally branches between the electron beam generator 112 and the aperture 113, and the sensor unit 116, the gate valve 117, and the turbo-molecular pump 118 are arranged in this order in the intermediate evacuation line 111a.

With this arrangement, the vacuum tube 111 can be differentially evacuated, and the pressure in the vicinity of the electron beam generator 112 can be made lower than the pressure in the main chamber portion 12. In addition to the aperture 113, a small-diameter tube (not shown) may be provided below the aperture 113, to adjust conductance. In this manner, the effect of the differential evacuation may be increased.

Figure 1B:
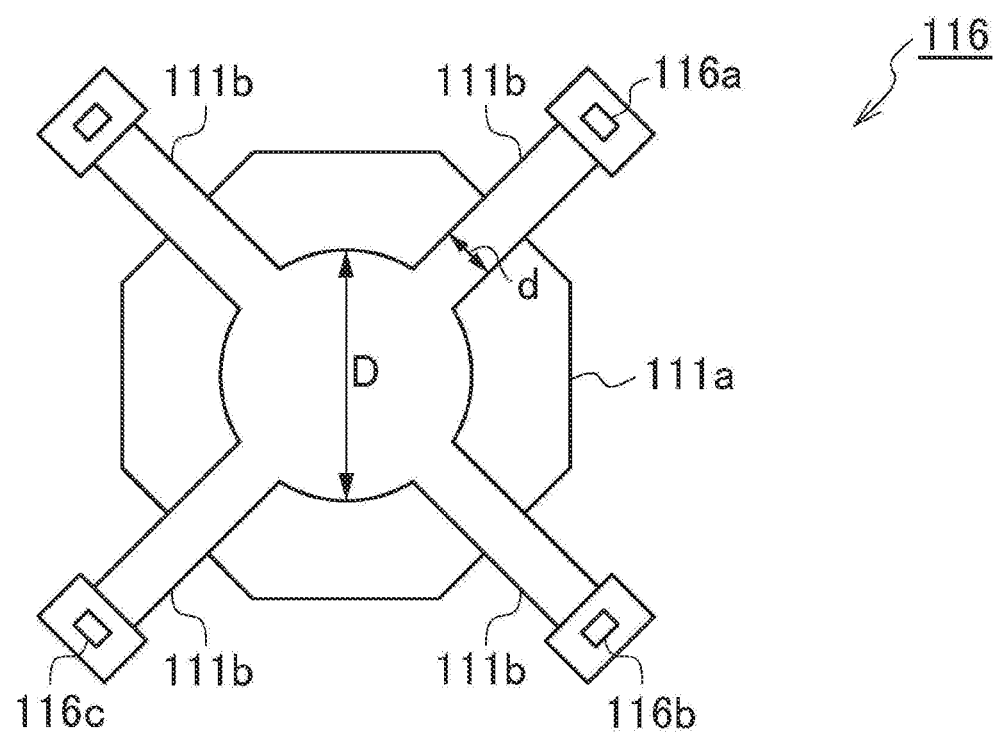
FIG. 1B is a schematic cross-sectional view of a sensor unit 116.

FIG. 1B is a schematic cross-sectional view of the sensor unit 116. To reduce the size of the electron beam irradiation apparatus, ports 111b radially extend from the intermediate evacuation line 111a, and a pressure monitor 116a, a $N_2$ injector 116b, an atmospheric pressure sensor 116c, and the like are disposed on each port 111b. The pressure monitor 116 monitors the pressure in the vacuum tube 111, monitors the degree of deterioration of the electron beam generator 112, and determines the time for replacement.

The diameter d of each port 111b is preferably equal to or greater than a third of the diameter D of the central part of the intermediate evacuation line 111a (d/D≥⅓). This is because, if the diameter d of each port 111b is too small, the pressure monitors 116a cannot accurately monitor the pressure in the vacuum tube 111.

Referring back to FIG. 1A, the gate valve 11A that can be opened and closed is provided in the vacuum tube 11 and between the aperture 113 and the main chamber portion 12. As the gate valve 11A is provided, the vacuum in the main chamber portion 12 and the vacuum in the vacuum tube 111 can be separated from each other.

The particle catcher 11B is detachably inserted in the vacuum tube 111 and between the gate valve 11A and the main chamber portion 12, and prevents particles generated at a time of operation of the gate valve 11A or the like from dropping into the main chamber portion 12.

Figure 1C:
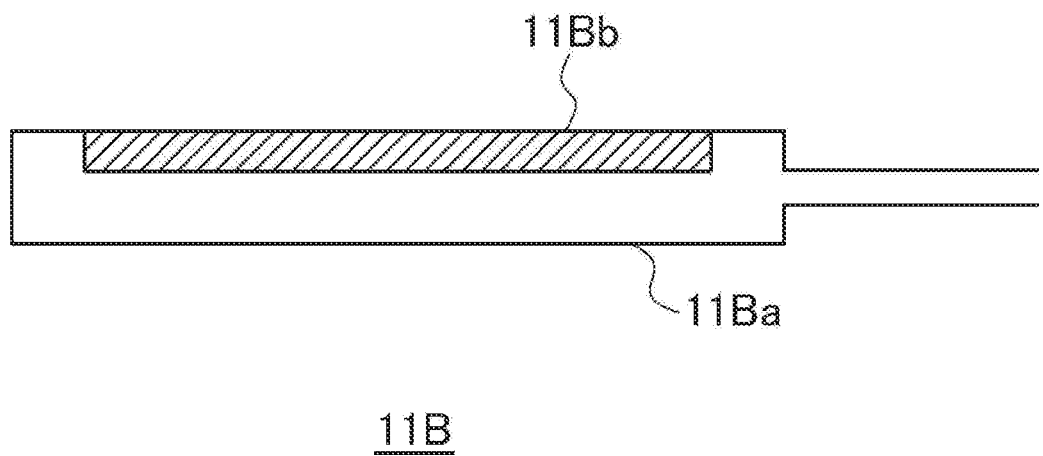
FIG. 1C is a diagram showing an example structure of a particle catcher 11B.

FIG. 1C is a diagram showing an example structure of the particle catcher 11B. The particle catcher 11B includes a base member 11Ba and an adsorbing material 11Bb provided on the base member 11Ba. The adsorbing material 11Bb is a $SiO_2$ gel or the like, and adsorbs particles falling inside the vacuum tube 111. As the particle catcher 11B is provided, the particles falling inside the vacuum tube 11 can be prevented from dropping onto the surface of the sample W disposed in the main chamber portion 12.

Referring back to FIG. 1A, the particle catcher 11B can be inserted into and pulled out from the optical axis of the electron beam inside the vacuum tube 111.

The main chamber portion 12 has a main chamber 121 that is a vacuum chamber, a gate valve 122, a turbo-molecular pump 123, a stage 124, an applicator pin 125, an aperture 126, and a measurement unit 127.

The gate valve 122 for bringing in and out the sample W is provided on a side surface of the main chamber 121, and can be opened and closed. Further, the turbo-molecular pump 123 for evacuating the air from the main chamber 121 is provided on the bottom surface of the main chamber 121.

The stage 124 is provided in the main chamber 121, and the sample W is placed on the stage 124.

An example structure of the applicator pin 125 will be described later in a fifth embodiment. The applicator pin 125 is designed for establishing conduction between pin members 671 and 672 shown in FIG. 6B. The irradiation energy is determined in accordance with the difference between the potential of the electron beam generator 112 (−0.2 to −5 kV, for example) and the potential of the sample W. However, if the potential of the sample W is floating, the irradiation energy becomes unstable. Therefore, the applicator pin 125 is provided to apply a constant potential to the sample W.

The aperture 126 is provided in the main chamber 121, and is located above the stage 124. An opening 126a is formed in the aperture 126, and defines the shape of the electron beam and which region of the sample W is to be irradiated with the electron beam.

Figure 1D:
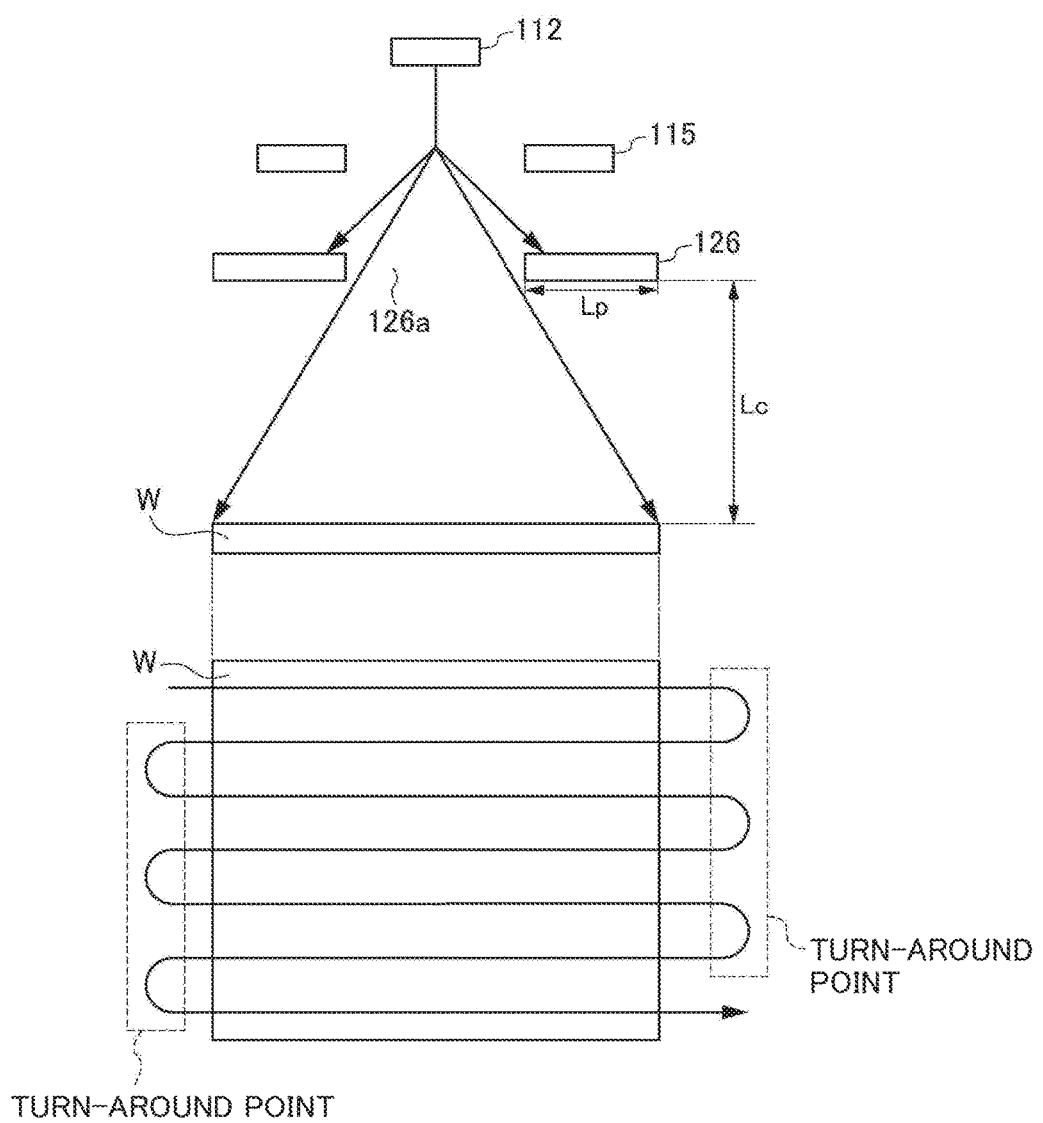
FIG. 1D is a diagram for explaining the role of an aperture 126.

FIG. 1D is a diagram for explaining the role of the aperture 126. The upper part of the drawing is a schematic view of the electron beam irradiation apparatus viewed from a side, and the lower part of the drawing is a schematic view of the sample W and the scanning electron beam viewed from above. The deflector 115 deflects the electron beam so that the electron beam from the electron beam generator 112 scans the upper surface of the sample W. In the scanning, the electron beam might not be uniform at the turn-around points. Therefore, the portions of the electron beam corresponding to the turn-around points are blocked by the aperture 126 so that the sample W can be irradiated with a uniform electron beam.

Where Lc represents the distance between the aperture 126 and the surface of the sample W, and Lp represents the distance between the rim of the opening 126a and the rim of the aperture 126, Lp/Lc is preferably equal to or higher than 1.5. That is, the aspect ratio of the space between the lower surface of the aperture 126 and the upper surface of the sample W is preferably 1.5 or higher. With this design, the electrons reflected by the surface of the sample W are reflected a few more times and are dispersed to the outer peripheral parts. Thus, the influence of noise can be reduced.

Referring back to FIG. 1A, the measurement unit 127 measures the electron beam, and is provided below the stage 124 in the main chamber 121. The measurement unit 127 will be described later in a fourth embodiment.

The controller 13 has a total controller 131, an electron beam controller 132, a peripheral controller 133, and a block manifold 134.

The total controller 131 controls operation of the entire electron beam irradiation apparatus including the electron beam controller 132, the peripheral controller 133, and the block manifold 134. The total controller 131 may be formed with a processor and a memory. Various programs to be executed by the processor may be stored into the memory in advance, or may be additionally stored into the memory in a later stage (or can be updated).

The electron beam controller 132 controls electron beam irradiation and deflection by controlling the electron beam generator 112 and the deflector 115. Examples of such control will be described later in first through third embodiments.

The peripheral controller 133 controls the turbo-molecular pumps 118 and 123, a dry pump 119, and the like.

The block manifold 134 controls opening and closing of the gate valves 117, 11A, and 122 (air pressure control).

The electron beam irradiation apparatus operates as follows. In a case where the sample W is to be irradiated with an electron beam, the gate valve 11A is opened, and the particle catcher 11B is moved away from the optical axis of the electron beam. Further, the air is evacuated from the vacuum tube 11 and the main chamber 121. In this condition, the electron beam generator 112 emits the electron beam. The electron beam passes through the opening of the aperture 113, is deflected by the deflector 115, and further passes through the opening of the aperture 126, to reach the surface of the sample W. The electron-beam irradiated region is wide, and is 10×10 mm to 500×500 mm, for example.

Scanning of the sample W with an electron beam is now described. In this electron beam irradiation apparatus, under the control of the electron beam controller 132, the deflector 115 deflects an electron beam in the X-Y direction (a two-dimensional direction on the surface of the sample W), so that the surface of the sample W is uniformly irradiated with the electron beam.

Figure 1E:
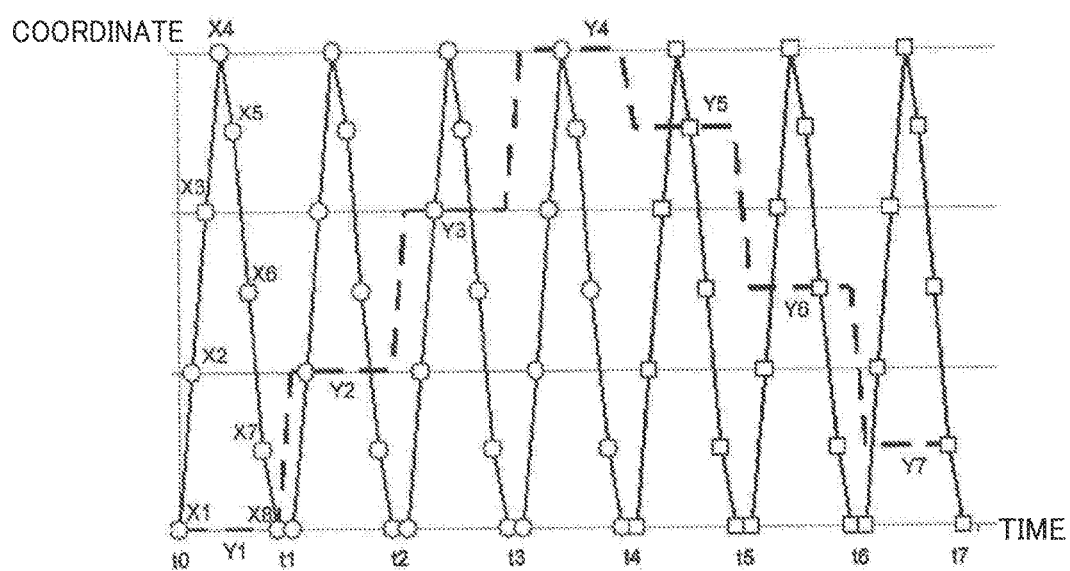
FIG. 1E is a diagram for explaining control for deflecting an electron beam in the X-Y direction.
Figure 1F:
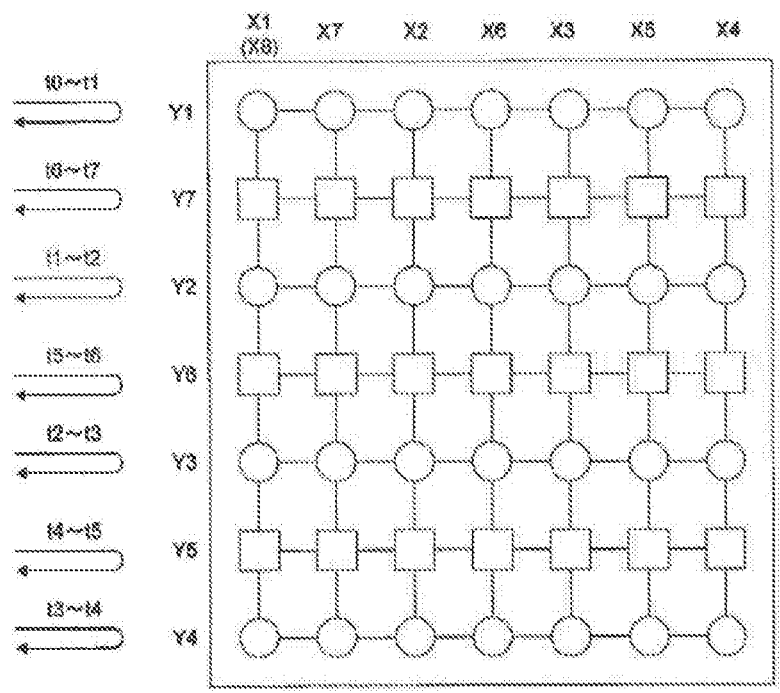
FIG. 1F is a diagram for explaining control for deflecting an electron beam in the X-Y direction.

FIGS. 1E and 1F are diagrams for explaining control for deflecting an electron beam in the X-Y direction. More specifically, FIG. 1E is a diagram showing temporal changes in the coordinates (the X-coordinate and the Y-coordinate) of the deflected electron beam. FIG. 1F is a plan view showing a situation where the electron beam is deflected in the X-Y direction (a plan view of the sample W viewed from the electron beam source side). In this specification, the X-direction is also referred to as the horizontal direction, and the Y-direction is also referred to as the vertical direction, for convenience sake.

During the period from time t0 to time t1, the electron beam is deflected in such a direction (X1, X2, X3, and X4) that the X-coordinate indicating the electron-beam reaching position on the sample W becomes larger (this direction is also called the positive direction of the X-coordinate, the rightward direction in FIG. 1F, and the outward path), and is then deflected in such a direction (X4, X5, X6, and X7) that the X-coordinate becomes smaller (this direction is also called the negative direction, the leftward direction in FIG. 1F, and the return path). During this period, the Y-coordinate of the electron beam remains Y1.

Here, the X-coordinate magnitude relationship is expressed as X1<X7<X2<X6<X3<X5<X4, as shown in FIG. 1F. That is, the electron beam is discretely emitted onto the sample W, and irradiation positions alternate in the outward path and the return path. In this manner, the surface of the sample W can be uniformly irradiated with the electron beam.

When the X-coordinate indicating the electron-beam reaching position becomes X8 (=X1) in the return path, the electron beam is deflected in such a direction that the Y-coordinate becomes greater (this direction is the positive direction of the Y-coordinate, and the downward direction in FIG. 1F), and the Y-coordinate of the electron beam changes to Y2.

Likewise, during the period from time t1 to time 12, the electron beam is deflected in such a direction that the X-coordinate becomes greater, and is then deflected in such a direction that the X-coordinate becomes smaller. During this period, the Y-coordinate of the electron beam remains Y2. When the X-coordinate becomes X8 (=X1), the electron beam is deflected in such a direction that the Y-coordinate becomes greater, and the Y-coordinate of the electron beam becomes Y3.

Further, during the period from time t2 to time t3, the electron beam is first deflected in such a direction that the X-coordinate becomes greater, and is then deflected in such a direction that the X-coordinate becomes smaller. During this period, the Y-coordinate of the electron beam remains Y3. When the X-coordinate becomes X8 (=X1), the electron beam is deflected in such a direction that the Y-coordinate becomes greater, and the Y-coordinate of the electron beam becomes Y4.

During the period from time t3 to time t4, the electron beam is first deflected in such a direction that the X-coordinate becomes greater, and is then deflected in such a direction that the X-coordinate becomes smaller. During this period, the Y-coordinate of the electron beam remains Y4. When the X-coordinate becomes X8 (=X1), the electron beam is deflected in such a direction that the Y-coordinate becomes smaller (the negative direction of the Y-coordinate, and the upward direction in FIG. 1F), and the Y-coordinate of the electron beam becomes Y5.

Likewise, during the period from time t4 to time t5, the electron beam is first deflected in such a direction that the X-coordinate becomes greater, and is then deflected in such a direction that the X-coordinate becomes smaller. During this period, the Y-coordinate of the electron beam remains Y5. When the X-coordinate becomes X8 (=X1), the electron beam is deflected in such a direction that the Y-coordinate becomes smaller, and the Y-coordinate of the electron beam becomes Y6.

Further, during the period from time t5 to time t6, the electron beam is first deflected in such a direction that the X-coordinate becomes greater, and is then deflected in such a direction that the X-coordinate becomes smaller. During this period, the Y-coordinate of the electron beam remains Y6. When the X-coordinate becomes X8 (=X1), the electron beam is deflected in such a direction that the Y-coordinate becomes smaller, and the Y-coordinate of the electron beam becomes Y7.

During the period from time t6 to time t7, the electron beam is first deflected in such a direction that the X-coordinate becomes greater, and is then deflected in such a direction that the X-coordinate becomes smaller. During this period, the Y-coordinate of the electron beam remains Y7. When the X-coordinate becomes X8 (=X1), the electron beam is deflected in such a direction that the Y-coordinate becomes smaller (the negative direction of the Y-coordinate, and the upward direction in FIG. 1F), and the Y-coordinate of the electron beam becomes Y1.

Here, the Y-coordinate magnitude relationship is expressed as Y1<Y7<Y2<Y6<Y3<Y5<Y4, as shown in FIG. 1F. That is, the electron beam is also discretely emitted onto the sample W in the Y-direction, and irradiation positions alternate in the outward path and the return path. In this manner, the surface of the sample W can be uniformly irradiated with the electron beam.

When the air is evacuated from the main chamber 121, the particle catcher 11B is moved away from the optical axis of the electron beam before the turbo-molecular pump 123 is activated. With this arrangement, the particles adsorbed by the particle catcher 11B can be prevented from separating from the particle catcher 11B and dropping onto the sample W due to the air current caused by the evacuation.

The flow showing the steps in the process of conveying the next sample W after irradiation of a sample W with an electron beam is completed, and irradiating the next sample W with an electron beam will be described later in detail in a fifth embodiment with reference to FIG. 6C.

REFERENCE SIGNS LIST

11 Column portion
11 Vacuum tube
111a Intermediate evacuation line
112 Electron beam generator
113 Aperture
114 Lens
115 Deflector
116 Sensor unit
116a Pressure monitor
116b N$_2$ introducer
116c Atmospheric pressure sensor
117 Gate valve
118 Turbo-molecular pump
119 Dry pump
11A Gate valve
11Aa Base member
11Ab Adsorbing material
11B Particle catcher
12 Main chamber portion
121 Main chamber
122 Gate valve
123 Turbo-molecular pump
124 Stage
125 Applicator pin
126 Aperture
126a Opening
127 Measurement unit
13 Controller
131 Total controller
132 Electron beam controller
133 Peripheral controller
134 Block manifold Each of the embodiments described below can be partially or wholly applied to the above described electron beam irradiation apparatus.

First Embodiment

Technical Field

This embodiment relates to an electron-beam irradiated area adjustment method and an adjustment system.

Related Art

In an electron beam irradiation apparatus, an electron beam from an electron beam generator 112 is deflected by a deflector 115, and a specific area of a sample W is irradiated with the electron beam (see FIG. 1A). However, depending on the characteristics of the deflector 115, a different area from the intended area might be irradiated with an electron beam.

Problem to be Solved by this Embodiment

This embodiment is to provide a method and a system for adjusting an electron-beam irradiated area in an electron beam irradiation apparatus.

Solution to Problem

<Aspect 1>

A method of adjusting an electron-beam irradiated area in an electron beam irradiation apparatus that deflects an electron beam with a deflector to irradiate an object with the electron beam,
the method comprising:
emitting an electron beam while changing an irradiation position on an adjustment plate by controlling the deflector in accordance with an electron beam irradiation recipe, the adjustment plate detecting a current corresponding to the emitted electron beam;
acquiring a current value detected from the adjustment plate;
forming image data corresponding to the acquired current value;
determining whether the electron-beam irradiated area is appropriate based on the formed image data; and updating the electron beam irradiation recipe when the electron-beam irradiated area is determined not to be appropriate.

<Aspect 2>

The electron-beam irradiated area adjustment method according to aspect 1, wherein emitting the electron beam, acquiring the current value, formation the image data, determining, and updating the electron beam irradiation recipe are repeated until the electron-beam irradiated area is determined to be appropriate.

<Aspect 3>

The electron-beam irradiated area adjustment method according to aspect 1, wherein the adjustment plate comprises a portion that detects a current corresponding to the emitted electron beam, and a portion that does not detect the current even when being irradiated with an electron beam.

<Aspect 4>

The electron-beam irradiated area adjustment method according to aspect 1, wherein upon formation the image data, the image data is formed by converting the acquired current value at each time into a tone of each pixel in the image data.

<Aspect>

The electron-beam irradiated area adjustment method according to aspect 1, wherein upon determining, determination is performed by comparing the formed image data with image data prepared in advance.

<Aspect>

The electron-beam irradiated area adjustment method according to aspect 5, wherein
the adjustment plate comprises a first pattern,
the image data prepared in advance comprises a second pattern corresponding to the first pattern, and
upon determining, the determination is performed in accordance with a positional relationship between the first pattern in the formed image data and the second pattern in the image data prepared in advance.

<Aspect 7>

The electron-beam irradiated area adjustment method according to aspect 1, wherein
the deflector is an electrostatic deflector comprising an electrode, and deflects the electron beam in accordance with a voltage applied on the electrode, and
the electron beam irradiation recipe comprises information about a voltage to be applied to the electrode.

<Aspect 8>

The electron-beam irradiated area adjustment method according to aspect 1, wherein
the deflector is an electrostatic deflector comprising an electrode, and deflects the electron beam in accordance with a voltage applied on the electrode,
the electron beam irradiation recipe comprises information about a voltage to be applied to the electrode,
the adjustment plate comprises a first pattern,
image data prepared in advance comprises a second pattern corresponding to the first pattern,
upon determining, determination is performed in accordance with a positional relationship between the first pattern in the formed image data and the second pattern in the image data prepared in advance, and
upon updating the electron beam irradiation recipe, the voltage to be applied to the electrode in the electron beam irradiation recipe in the electron beam irradiation recipe, in accordance with a distance between a position of the first pattern in the formed image data and a position of the second pattern.

<Aspect 9>

The electron-beam irradiated area adjustment method according to aspect 1, wherein
the deflector is a magnetic deflector comprising a magnetic pole, and deflects the electron beam in accordance with a current flowing in the magnetic pole,
the electron beam irradiation recipe comprises information about a current to be applied to the electrode,
the adjustment plate comprises a first pattern,
image data prepared in advance comprises a second pattern corresponding to the first pattern,
upon determining, determination is performed in accordance with a positional relationship between the first pattern in the formed image data and the second pattern in the image data prepared in advance, and
upon updating the electron beam irradiation recipe, the current to be applied to the magnetic pole in the electron beam irradiation recipe in the electron beam irradiation recipe, in accordance with a distance between a position of the first pattern in the formed image data and a position of the second pattern.

<Aspect 10>

An electron-beam irradiated area adjustment system that adjusts an electron-beam irradiated area in an electron beam irradiation apparatus that deflects an electron beam with a deflector to irradiate an object with the electron beam,
the electron-beam irradiated area adjustment system comprising:
an adjustment plate that detects a current corresponding to an emitted electron beam;
an ammeter that acquires a current value detected from the adjustment plate;
an image forming module that forms image data corresponding to the acquired current value;
a determiner that determines whether the electron-beam irradiated area is appropriate based on the formed image data; and
a recipe updater that updates the electron beam irradiation recipe for controlling the deflector when the electron-beam irradiated area is determined not to be appropriate.

Effect of this Embodiment

An electron beam can be adjusted.

Brief Description of Drawings

Figure 2B:
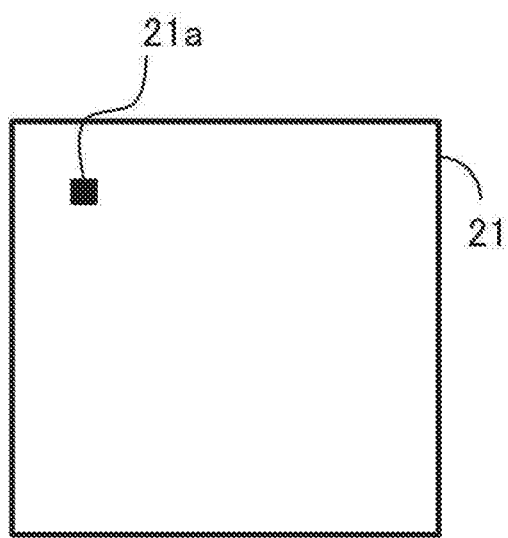
FIG. 2B is a schematic top view of an adjustment plate 21.
Figure 2C:
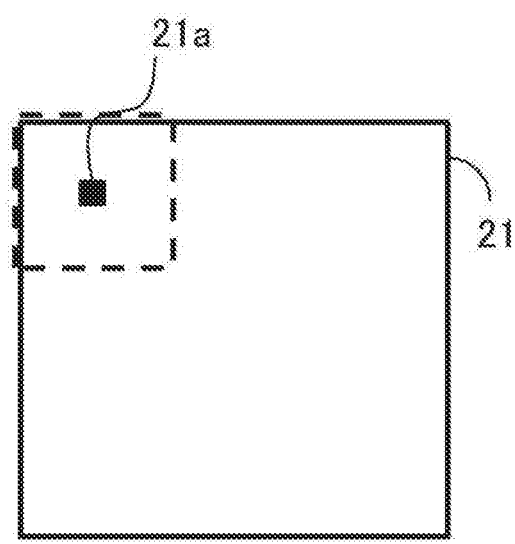
FIG. 2CA is a diagram schematically showing an electron-beam irradiated area with respect to the adjustment plate 21.
Figure 2C:
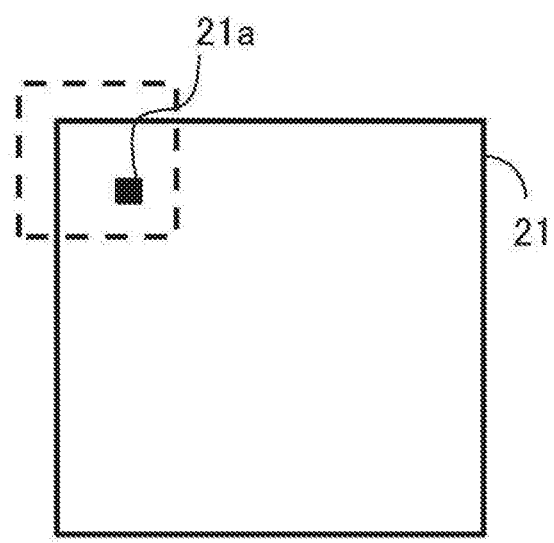
Figure 2D:
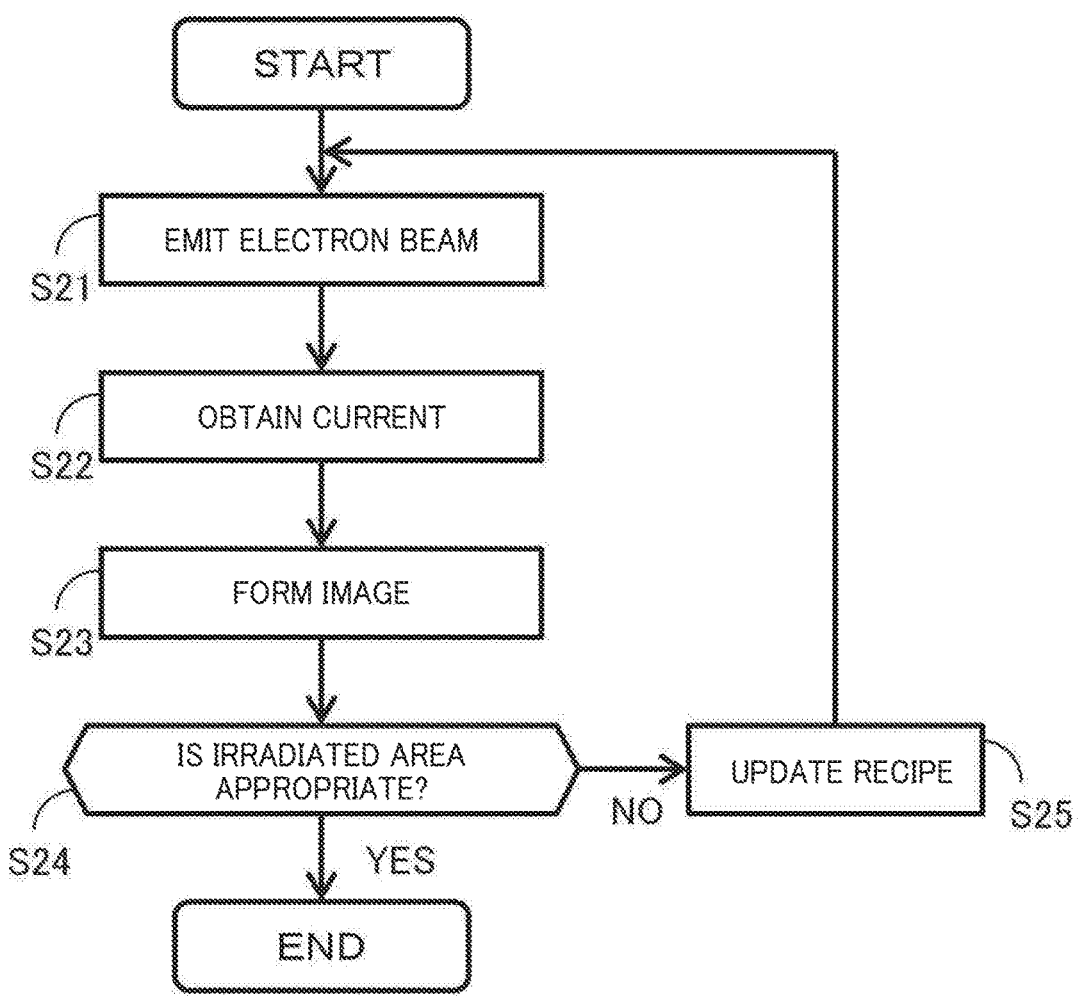
FIG. 2D is a flowchart showing the steps in an irradiated area adjustment process.
Figure 2E:
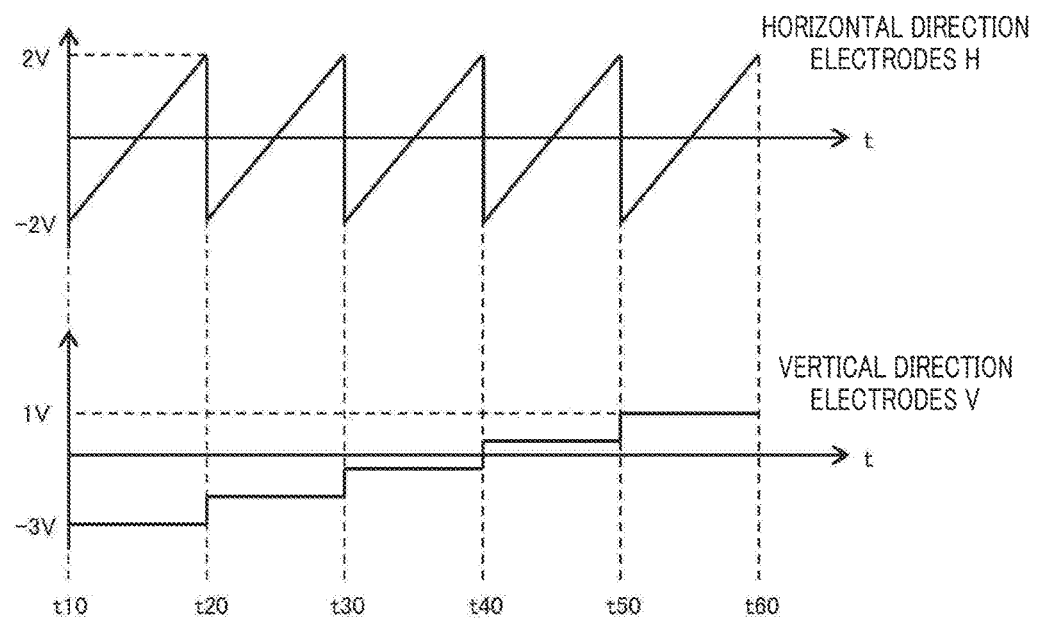
FIG. 2E is a graph showing temporal changes in the voltage to be applied to electrodes 2115.
Figure 2F:
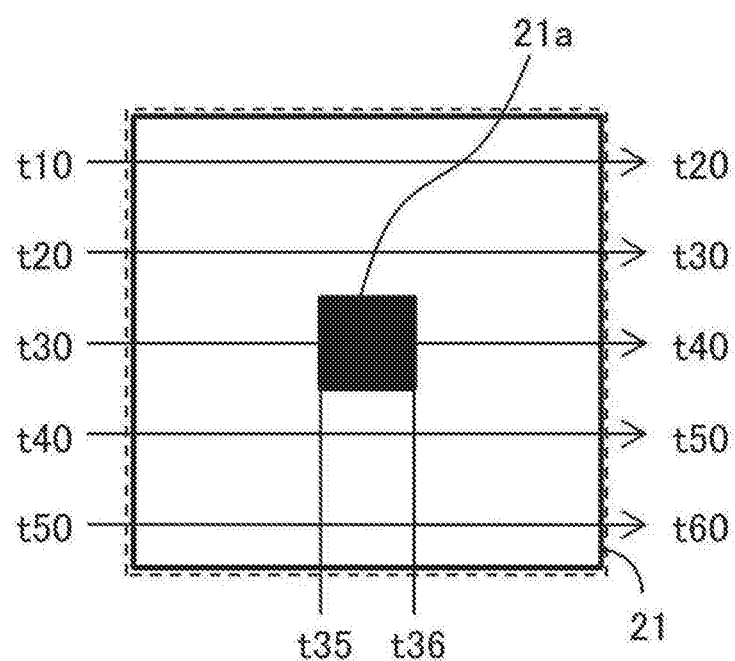
FIG. 2FA is a graph showing the relationship between the irradiated area shown in FIG. 2CA and time.
Figure 2F:
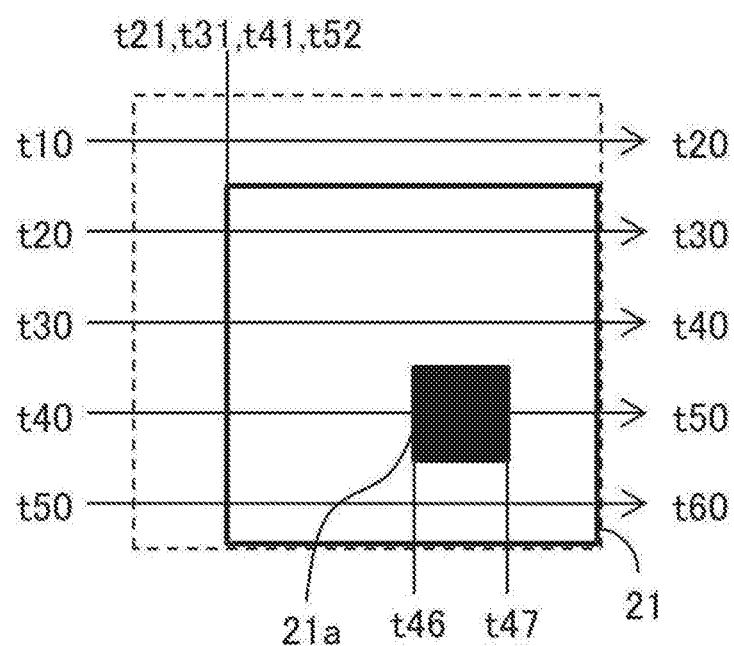
Figure 2G:
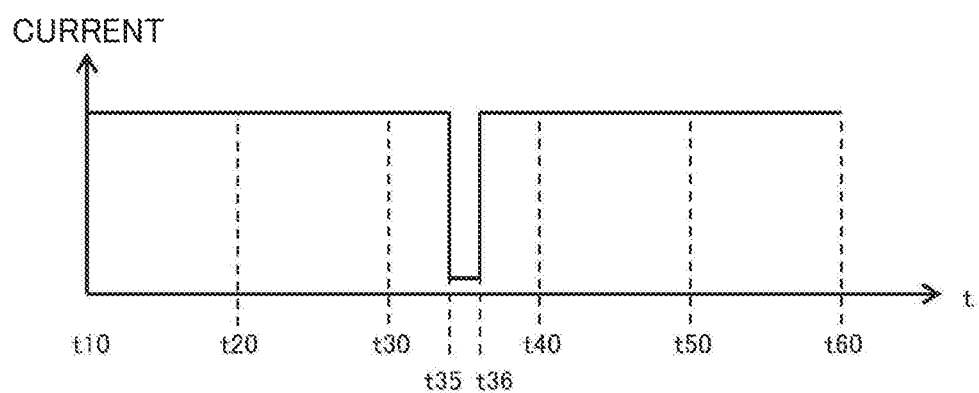
FIG. 2GA is a graph showing temporal changes in the current value to be obtained.
Figure 2G:
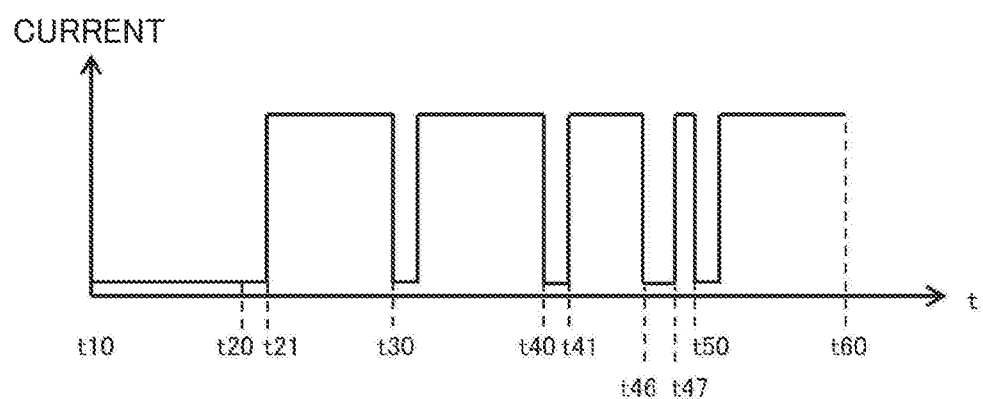
Figure 2H:
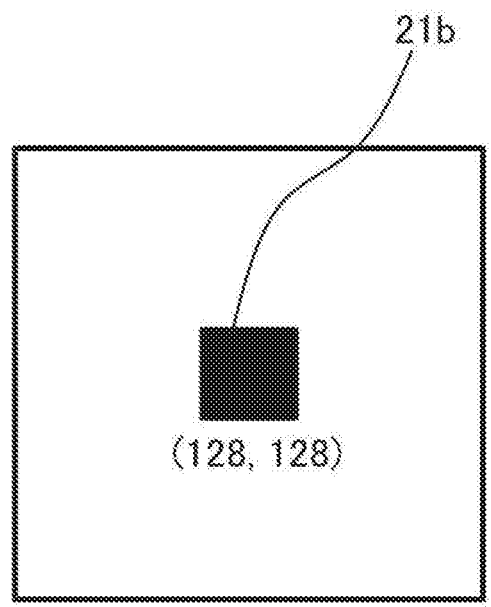
FIG. 2HA is a diagram showing the image data formed in accordance with the current values shown in FIG. 2GA.
Figure 2H:
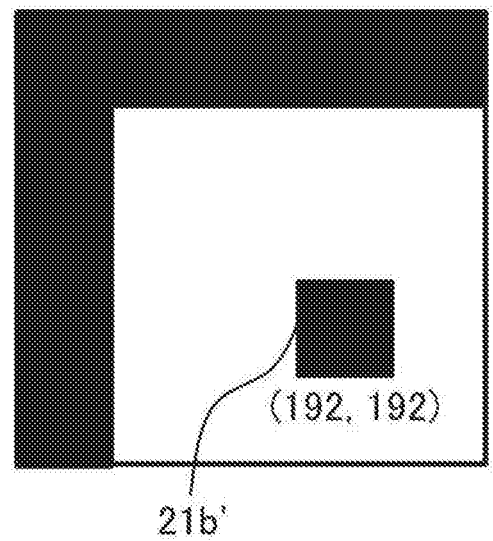
Figure 21:
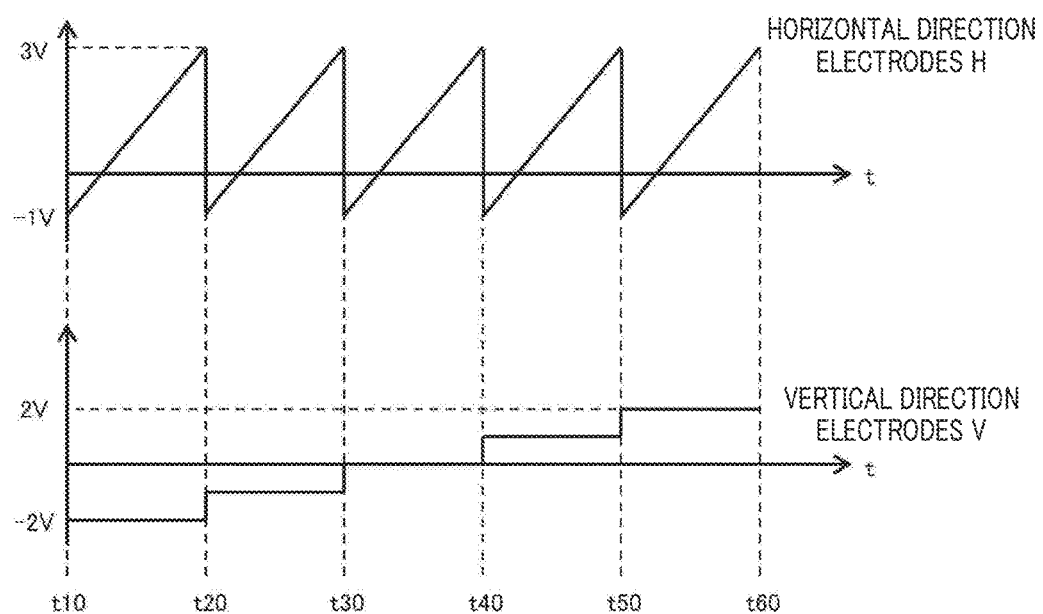

FIG. 2A is a diagram showing the basic configuration of an irradiated area adjustment system 200 in an electron beam irradiation apparatus;

FIG. 2B is a schematic top view of an adjustment plate 21;

FIG. 2CA is a diagram schematically showing an electron-beam irradiated area with respect to the adjustment plate 21;

FIG. 2CB is a diagram schematically showing an electron-beam irradiated area with respect to the adjustment plate 21;

FIG. 2D is a flowchart showing the steps in an irradiated area adjustment process;

FIG. 2E is a graph showing temporal changes in the voltage to be applied to electrodes 2115;

FIG. 2FA is a graph showing the relationship between the irradiated area shown in FIG. 2CA and time;

FIG. 2FB is a graph showing the relationship between the irradiated area shown in FIG. 2CB and time;

FIG. 2GA is a graph showing temporal changes in the current value to be obtained;

FIG. 2GB is a graph showing temporal changes in the current value to be obtained;

FIG. 2HA is a diagram showing the image data formed in accordance with the current values shown in FIG. 2GA;

FIG. 2HB is a diagram showing the image data formed in accordance with the current values shown in FIG. 2GA; and FIG. 2I is a graph showing temporal changes in the adjusted voltage to be applied to the electrodes 2115.

Mode for Carrying Out this Embodiment

FIG. 2A is a diagram showing the basic configuration of an irradiated area adjustment system 200 in an electron beam irradiation apparatus. It should be noted that the irradiated area adjustment system 200 performs adjustment when a sample is not placed on a stage 124 (FIG. 1A), such as when the electron beam irradiation apparatus is activated.

First, as described above with reference to FIG. 1A, the electron beam irradiation apparatus includes an electron beam generator 112, a deflector 115, an electron beam controller 132, and the like.

The deflector 115 in this embodiment is an electrostatic deflector having electrodes 2115. More specifically, the electrodes 2115 in the deflector 115 include two electrodes for deflecting an electron beam in a horizontal direction on a sample (these two electrodes will be hereinafter referred to as the electrodes H, though not shown in the drawing), and two electrodes for deflecting the electron beam in a vertical direction (these two electrodes will be hereinafter referred to as the electrodes V, though not shown in the drawing). An electron beam is deflected in accordance with voltages applied to these electrodes H and V.

The electron beam controller 132 has a beam scanner 26 and a deflector power source 27. The beam scanner 26 generates a waveform for deflecting an electron beam, in accordance with an electron beam irradiation recipe including information about voltages to be applied to the electrodes 2115. The deflector power source 27 generates the voltage corresponding to the waveform, and applies the waveform to the electrodes 2115.

The irradiated area adjustment system 200 includes an adjustment plate 21, an ammeter 22, an image forming module 23, a determiner 24, and a recipe updater 25. The image forming module 23, the determiner 24, and the recipe updater 25 may be included in the total controller 131 shown in FIG. 1A, and may be formed by at least part of the total controller 131 executing a predetermined program.

The adjustment plate 21 detects the current corresponding to an emitted electron beam, and is placed in a predetermined position on a stage 124 (FIG. 1A). That is, the adjustment plate 21 is placed below the sample to be irradiated with the electron beam.

FIG. 2B is a schematic top view of the adjustment plate 21. The adjustment plate 21 is a 45-mm square, for example. The adjustment plate 21 includes a predetermined pattern. In the specific example shown in the drawing, a hole 21a is formed as the pattern at an upper left part. In a case where a different position from the hole 21a is irradiated with an electron beam, the adjustment plate 21 detects a current. In a case where the hole 21a is irradiated with an electron beam, on the other hand, the adjustment plate 21 does not detect any current.

FIGS. 2CA and 2CB are diagrams each schematically showing an electron-beam irradiated area with respect to the adjustment plate 21. An electron beam is supposed to be emitted onto the area indicated by a dashed line in FIG. 2CA. However, as indicated by a dashed line in FIG. 2CB, an electron beam might be emitted onto a different area (an area displaced to an upper left position in the drawing) from the intended area. Therefore, the state shown in FIG. 2CB is to be adjusted to the state shown in FIG. 2CA in this embodiment.

Referring back to FIG. 2A, the ammeter 22 in the irradiated area adjustment system 200 is connected between the adjustment plate 21 and a ground terminal (not shown), and obtains the current detected by the adjustment plate 21. The obtained current value is detected by the image forming module 23. The ammeter 22 sequentially obtains currents detected at respective times.

The image forming module 23 forms the image data corresponding to the current obtained by the ammeter 22. Specifically, the image forming module 23 operates as follows. First, the image forming module 23 converts the current value at each time into a voltage value. The image forming module 23 then converts the voltage values into tones of 256 tone levels, for example. The image forming module 23 then sets the obtained tones as the tones of the respective pixels in the image data.

For example, at a time when a different position from the hole 21a is irradiated with an electron beam, the adjustment plate 21 detects a current. Accordingly, the voltage value becomes greater, and the tone level is 255, for example. Thus, the pixel corresponding to this time is bright. At a time when the hole 21a is irradiated with an electron beam, on the other hand, the adjustment plate 21 does not detect any current. Accordingly, the voltage value becomes smaller, and the tone level is 0, for example. Thus, the pixel corresponding to this time is dark.

The determiner 24 determines whether the electron-beam irradiated area is appropriate, in accordance with the image data formed by the image forming module 23. Specifically, the determiner 24 stores beforehand the image data to be formed in a case where the electron-beam irradiated area is appropriate (the image data will be hereinafter referred to as the template image data), and makes a determination by comparing image data formed by the image forming module 23 with the template image data. More specifically, the determiner 24 makes a determination in accordance with a difference in position between the predetermined pattern (equivalent to the hole 21a in FIG. 2B, for example) in the formed image data and the predetermined pattern in the template image data.

In a case where the electron-beam irradiated area is determined not to be appropriate, the recipe updater 25 updates the electron beam irradiation recipe, taking the difference in position into account. The beam scanner 26 is notified of the updated electron beam irradiation recipe, and thereafter, the updated electron beam irradiation recipe is used. The specific updating method will be described later.

FIG. 2D is a flowchart showing the steps in an irradiated area adjustment process. In accordance with the electron beam irradiation recipe, the electron beam controller 132 controls the voltage to be applied to the electrodes 2115 in the deflector 115, so that an electron beam is emitted (step S21) while the irradiation position with respect to the adjustment plate 21 is changed. For ease of explanation, the electron-beam irradiated area is scanned as described below, though the scanning described below differs from that described above with reference to FIGS. 1E and 1F.

FIG. 2E is a graph showing temporal changes in the voltage to be applied to the electrodes 2115. More specifically, the upper half of FIG. 2E shows temporal changes in the voltage to be applied to the electrodes H for deflecting the electron beam in the horizontal direction, and the lower half shows temporal changes in the voltage to be applied to the electrodes V for deflecting the electron beam in the vertical direction. These waveforms are included in the electron beam irradiation recipe. FIGS. 2FA and 2FB are graphs showing the relationships between time and the irradiated areas shown in FIGS. 2CA and 2CB, respectively.

During the period from time t10 to time t20 in FIG. 2E, the voltage to be applied to the electrodes V is constant (−3 V, for example), and the voltage to be applied to the electrodes H linearly increases from −2 V to 2 V, for example. Therefore, as shown in FIGS. 2FA and 2FB, during the period from time t10 to t20, the electron beam irradiation position is constant in the vertical direction, but moves in the horizontal direction (this is called the first line).

At time t20 in FIG. 2E, the voltage to be applied to the electrodes V increases (to −2.25 V, for example). During the period from time t20 to time t30, the voltage to be applied to the electrodes H also linearly increases. Therefore, as shown in FIGS. 2FA and 2FB, during the period from time t20 to time t30, the electron beam irradiation position is constant in the vertical direction at a different position from that between time t10 and time t20, and moves in the horizontal direction (this is called the second line). Thereafter, the same process is repeated until the fifth line, and the scanning of the irradiated area is then completed.

Referring back to FIG. 2D, the ammeter 22 obtains the current detected at each time from the adjustment plate 21 (step S22).

FIG. 2GA is a graph showing temporal changes in the obtained current value, and corresponds to FIG. 2FA.

During the period from time t10 to time t20 of the first line, a position that is not the hole 21a of the adjustment plate 21 is irradiated with the electron beam (FIG. 2FA). Therefore, during the period from time t10 to time t20, a constant current value is obtained (FIG. 2GA). The same goes for time t20 to time t30 of the second line.

On the third line, during the period from time t30 to time t35, a position that is not the hole 21a of the adjustment plate 21 is irradiated with the electron beam (FIG. 2FA), and therefore, the same current value as that during the period from time t10 to time t30 is obtained (FIG. 2GA). During the period from time t35 to time t36, however, the hole 21a of the adjustment plate 21 is irradiated with the electron beam (FIG. 2FA), and therefore, current hardly flows (FIG. 2GA). Thereafter, during the period from time t36 to time t40, a position that is not the hole 21a of the adjustment plate 21 is irradiated with the electron beam, and therefore, the same current value as that during the period from time t10 to time t35 is obtained (FIG. 2GA).

The same process as that for the first line and the second line is performed during the period from time t40 to time t50 of the fourth line, and during the period from time t50 to time t60 of the fifth line. In this manner, the current values shown in FIG. 2GA are obtained.

FIG. 2GB is a graph showing temporal changes in the obtained current value, and corresponds to FIG. 2FB.

During the period from time t10 to time t20 of the first line, the adjustment plate 21 is not located in a position to be irradiated with the electron beam (FIG. 2FB), and therefore, current hardly flows (FIG. 2GB).

On the second line, during the period from time t20 to time t21, the adjustment plate 21 is not located in a position to be irradiated with the electron beam (FIG. 2FB), and therefore, current hardly flows (FIG. 2GB). Thereafter, during the period from time t21 to time t30, a position that is not the hole 21a of the adjustment plate 21 is irradiated with the electron beam, and therefore, a constant current value is obtained (FIG. 2GB). The same goes for the third line.

On the fourth line, during the period from time t40 to time t41, the adjustment plate 21 is not located in a position to be irradiated with the electron beam (FIG. 2FB), and therefore, current hardly flows (FIG. 2GB). Thereafter, during the period from time t41 to time t46, a position that is not the hole 21a of the adjustment plate 21 is irradiated with the electron beam, and therefore, the same current value as that during the period from time t21 to time t30 is obtained (FIG. 2GB). During the next period from time t46 to time t47, the hole 21a of the adjustment plate 21 is irradiated with the electron beam (FIG. 2FB), and therefore, current hardly flows (FIG. 2GB). Thereafter, during the period from time t47 to time t50, a position that is not the hole 21a of the adjustment plate 21 is irradiated with the electron beam, and therefore, the same current value as that during the period from time t21 to time t30 is obtained (FIG. 2GB).

The same process as that for the second line and the third line is performed during the period from time t50 to time t60 of the fifth line. In this manner, the current values shown in FIG. 2GB are obtained.

Referring back to FIG. 2D, the image forming module 23 forms the image data corresponding to the obtained current values (step S23).

FIG. 2HA is a diagram showing the image data formed in accordance with the current values shown in FIG. 2GA. The current value during the period from time t10 to time t20 corresponds to each pixel value on the first line in the image data. Since the current value is large during the period from time t10 to time t20, each pixel value on the first line is large, and each pixel on the first line is bright. As the same applies to the later lines, only the pixels corresponding to time t35 to time t36 of the third line are dark in the image data shown in FIG. 2HA. This dark position corresponds to the hole 21a shown in FIG. 2B.

This image data is the image data formed in a case where the intended area shown in FIG. 2C is irradiated with the electron beam. In other words, this image data is the template image data. The template image data can be theoretically created in accordance with the pattern of the intended irradiated area on the adjustment plate 21, and the determiner 24 that will be next explained stores the template image data therein in advance. The template image data includes a pattern 21b corresponding to the pattern (the hole 21a) of the adjustment plate 21.

FIG. 2HB is a diagram showing the image data formed in accordance with the current values shown in FIG. 2GB. In FIG. 2GB, current hardly flows during the period from time t10 to time t20. Therefore, the first line of the image data shown in FIG. 2HB is dark. Also, current hardly flows during the periods from time t20 to time t21, from time t30 to time t31, from time t40 to time t41, and from time t50 to time t51. Therefore, the left edge of the image data is also dark. Further, current hardly flows during the period from time T46 to time t47 of the fourth line. Therefore, a dark pattern 21b' appears at part of the fourth line. This pattern 21b' corresponds to the pattern (the hole 21a) of the adjustment plate 21.

Referring back to FIG. 2D, the determiner 24 determines whether the electron-beam irradiated area is appropriate (step S24). Specifically, the determiner 24 performs pattern matching between the template image data stored in advance and the image data formed in step S23.

The template image data is shown in FIG. 2HA, and the image data formed in step S23 is shown in FIG. 2HB. The determiner 24 calculates the positional relationship, which is a distance D, between the pattern 21b in the template image data shown in FIG. 2HA and the pattern 21b' in the image data shown in FIG. 2HB. If the distance D is equal to or shorter than a predetermined allowable value, the determiner 24 determines the irradiated area to be appropriate (YES in step S24 in FIG. 2D), and ends the adjustment process.

If the distance D is longer than the allowable value, on the other hand, the irradiated area is determined not to be appropriate (NO in step S24). In this case, the recipe updater 25 updates the electron beam irradiation recipe (step S25). More specifically, the recipe updater 25 changes the waveform to be generated by the beam scanner 26 (for example, to the voltage waveform shown in FIG. 2E). Where the distance D is longer, the amount of change is larger.

For example, the number of pixels in each set of image data is 256×256, and the position (128, 128) of the pattern 21b in the template image data (FIG. 2HA) is the position (192, 192) of the pattern 21b' in the image data (FIG. 2HB) formed in step S23. In this case, the irradiated area is shifted 25% of the image size in the horizontal direction and in the vertical direction. Therefore, the waveform shown in FIG. 2E is adjusted 25%. That is, a voltage in the range of −2 V to 2 V is applied to the electrodes H in the horizontal direction in FIG. 2E, but the voltage range is changed to −1 V to 3 V (the upper half of FIG. 2I). A voltage in the range of −3 V to 1 V is applied to the electrodes V in the vertical direction, but the voltage range is changed to −2 V to 2 V (the lower half of FIG. 2I). As a result, the electron-beam irradiated area moves in the horizontal direction and the vertical direction, so that an appropriate area is irradiated with the electron beam.

The adjustment process may end at this point, but steps S21 and the following steps are preferably repeated until the irradiated area is determined to be appropriate in step S24. While these steps are repeated, the electron beam irradiation recipe updated in step S25 is used in step S21.

As described above, the adjustment plate 21 having a predetermined pattern formed thereon is used in this embodiment so that the electron-beam irradiated area can be adjusted. By this adjustment method, there is no need to use any actual mask, and no masks are wasted.

Although the deflector 115 is an electrostatic deflector in this embodiment as described above, the deflector 115 may be a magnetic deflector having two or more magnetic poles. In such a case, the deflector power source 27 supplies a current for deflecting an electron beam to each of the magnetic poles.

Although the scanning shown in FIG. 2E is adopted in this embodiment for ease of explanation, the same adjustment as above can be performed in cases where the scanning shown in FIGS. 1E and 1F is performed.

REFERENCE SIGNS LIST

200 Irradiated area adjustment system
21 Adjustment plate
21a Hole
21b, 21b' Pattern
22 Ammeter
23 Image forming module
24 Determiner
25 Recipe updater
26 Beam scanner
27 Deflector power source
112 Electron beam generator
115 Deflector
2115 Electrode
131 Total controller
132 Electron beam controller Second Embodiment Technical Field This embodiment relates to an electron beam irradiation apparatus and an electron-beam irradiated region correction method.

Related Art

As described above with reference to FIG. 1F, in a conventional electron beam irradiation apparatus, the electron beam controller 132 controls the deflector 115 so that the irradiated region (the electron-beam reaching position) has a rectangular shape (or a square shape). However, depending on the characteristics of the deflector 115, the irradiated region might not have a rectangular shape as intended.

Problem to be Solved by this Embodiment

This embodiment aims to provide an electron beam irradiation apparatus that can reshape an electron-beam irradiated region to a rectangular shape, and a method of correcting the electron-beam irradiated region in a case where the irradiated region does not have an intended rectangular shape.

Solution to Problem

<Aspect 1>

An electron-beam irradiated region correction method implemented in an electron beam irradiation apparatus that is designed to irradiate a rectangular region as a target with an electron beam by applying a voltage V1(t) to a first electrode to perform scanning in a first direction with an electron beam from an electron beam generator, and applying a voltage V2(t) to a second electrode to perform scanning in a second direction with the electron beam, the voltage V1(t) varying with time t, the voltage V2(t) varying with time t, the second direction being perpendicular to the first direction, the electron-beam irradiated region correction method comprising correcting an electron-beam irradiated region to have a rectangular shape by applying a voltage V1(t)+kV2(t) (k being a constant) to the first electrode and applying the voltage V2(t) to the second electrode, when the electron-beam irradiated region is not a rectangular region but a parallelogram region distorted in the first direction.

When the irradiated region is distorted in the first direction, it is possible to correct the irradiated region by applying a voltage V1(t)+kV2(t) to the first electrode.

<Aspect 2>

The electron-beam irradiated region correction method according to aspect 1, wherein the constant k is set to make the electron-beam irradiated region closer to a rectangular shape.

By this method, the irradiated region becomes closer to a rectangular shape.

\<Aspect 3\>

The electron-beam irradiated region correction method according to aspect 1, wherein an absolute value of the constant k is set at a greater value when the distortion in the first direction is larger.

By this method, the irradiated region becomes closer to a rectangular shape.

\<Aspect 4\>

The electron-beam irradiated region correction method according to aspect 1, wherein the voltage $V2(t)$ repeats N0 times a process of changing to another value after a period T0 has passed since the voltage $V2(t)$ became a certain value, the voltage $V1(t)$ repeats N0 times a process of linearly changing in cycles of the period T0, the period T0 corresponds to a length of the rectangular shape in the first direction, and the number N0 of times corresponds to a length of the rectangular shape in the second direction.

When the first direction and the second direction are a horizontal direction and a vertical direction, respectively, the irradiated region distorted in the horizontal direction can be corrected to have a rectangular shape.

\<Aspect 5\>

The electron-beam irradiated region correction method according to aspect 1, wherein the voltage $V1(t)$ repeats N0 times a process of changing to another value after a period T0 has passed since the voltage $V1(t)$ became a certain value, the voltage $V2(t)$ repeats N0 times a process of linearly changing in cycles of the period T0, the period T0 corresponds to a length of the rectangular shape in the second direction, and the number N0 of times corresponds to a length of the rectangular shape in the first direction.

When the first direction and the second direction are a vertical direction and a horizontal direction, respectively, the irradiated region distorted in the vertical direction can be corrected to have a rectangular shape.

\<Aspect 6\>

An electron beam irradiation apparatus that is designed to irradiate a rectangular region as a target with an electron beam by applying a voltage $V1(t)$ to a first electrode to perform scanning in a first direction with an electron beam from an electron beam generator, and applying a voltage $V2(t)$ to a second electrode to perform scanning in a second direction with the electron beam, the voltage $V1(t)$ varying with time t, the voltage $V2(t)$ varying with time t, the second direction being perpendicular to the first direction, the electron beam irradiation apparatus comprising an electron beam control device that applies a voltage $V1(t)+kV2(t)$ (k being a constant) to the first electrode and applies the voltage $V2(t)$ to the second electrode, when an electron-beam irradiated region is not a rectangular region but a parallelogram region distorted in the first direction, whereby the electron beam control device corrects the electron-beam irradiated region to have a rectangular shape.

In a case where the irradiated region is distorted in the first direction, a voltage $V1(t)+kV2(t)$ is applied to the first electrode for scanning the electron beam in the first direction, to correct the irradiated region.

\<Aspect 7\>

An electron beam irradiation apparatus comprising:

an electron beam generator that generates an electron beam;

a first electrode that deflects the electron beam from the electron beam generator in a first direction;

a second electrode that deflects the electron beam from the electron beam generator in a second direction perpendicular to the first direction; and an electron beam control device that controls voltages to be applied to the first electrode and the second electrode, wherein the electron beam irradiation apparatus is designed to irradiate a rectangular region as a target with an electron beam by applying a voltage $V1(t)$ to the first electrode to perform scanning in the first direction with the electron beam from the electron beam generator, and applying a voltage $V2(t)$ to the second electrode to perform scanning in the second direction with the electron beam, the voltage $V1(t)$ varying with time t, the voltage $V2(t)$ varying with time t, and, when an electron-beam irradiated region is not a rectangular region but a parallelogram region distorted in the first direction, the electron beam control device applies a voltage $V1(t)+kV2(t)$ (k being a constant) to the first electrode and applies the voltage $V2(t)$ to the second electrode, to correct the electron-beam irradiated region to have a rectangular shape.

In a case where the irradiated region is distorted in the first direction, a voltage $V1(t)+kV2(t)$ is applied to the first electrode for scanning the electron beam in the first direction, to correct the irradiated region.

Effect of this Embodiment

An electron-beam irradiated region can be made closer to a rectangular shape.

Brief Description of Drawings

Figure 3A:
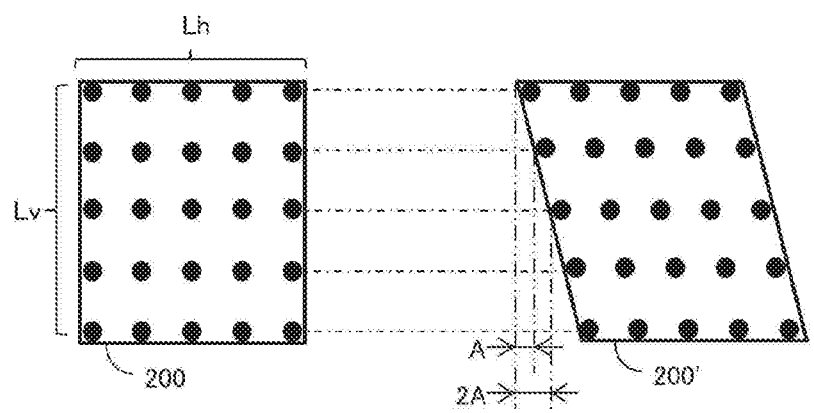
FIG. 3A is a diagram schematically showing electron-beam irradiated regions 200 and 200'.
Figure 3B:
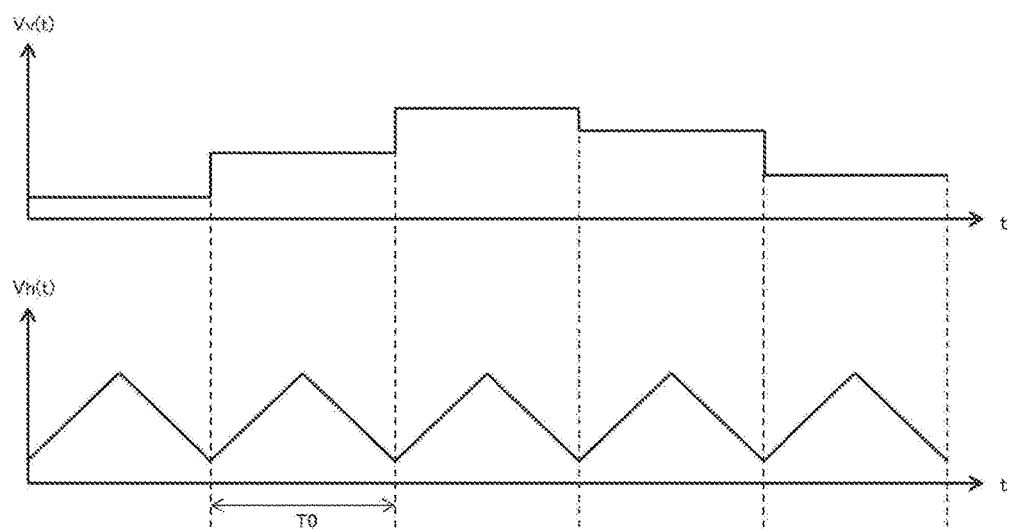
FIG. 3B is a graph schematically showing the voltages Vv(t) and Vh(t) to be applied to electrodes V and H, respectively, in a deflector 115 to obtain the irradiated region 200 shown in FIG. 3A.
Figure 3C:
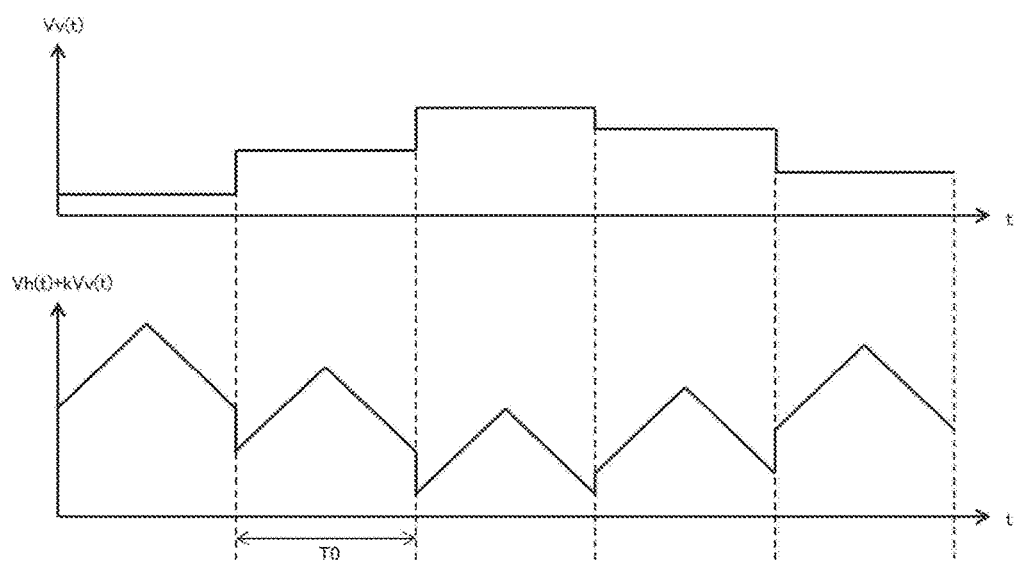
FIG. 3C is a graph schematically showing the voltages Vv(t) and Vh(t)+kVv(t) to be applied to the electrodes V and H, respectively, to correct distortion of the irradiated region 200' in the horizontal direction.
Figure 3E:
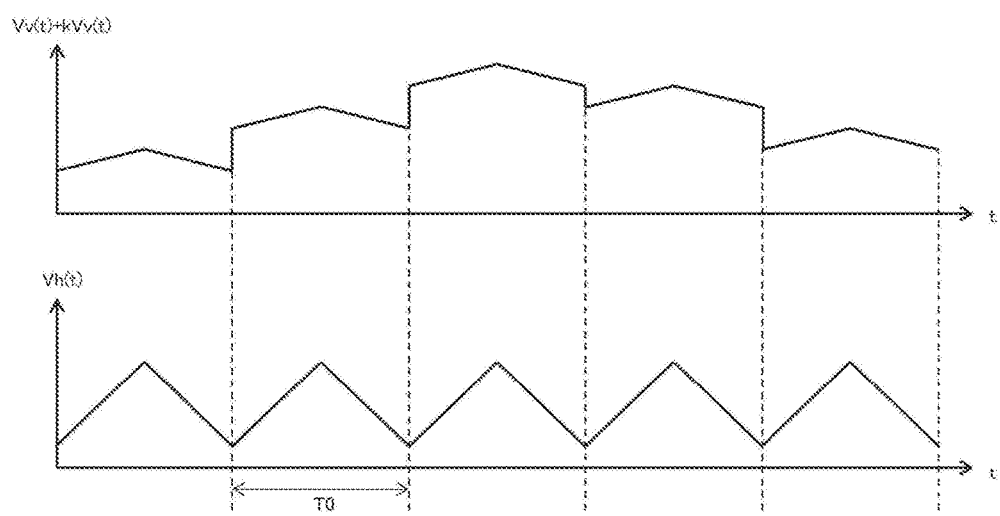
FIG. 3E is a graph schematically showing the voltages Vv(t)+kVh(t) and Vh(t) to be applied to the electrodes V and H, respectively, to correct distortion of the irradiated region 200" in the vertical direction.

FIG. 3A is a diagram schematically showing electron-beam irradiated regions 200 and 200';

FIG. 3B is a graph schematically showing the voltages $Vv(t)$ and $Vh(t)$ to be applied to the electrodes V and H, respectively, in the deflector 115 to obtain the irradiated region 200 shown in FIG. 3A;

FIG. 3C is a graph schematically showing the voltages $Vv(t)$ and $Vh(t)+kVv(t)$ to be applied to the electrodes V and H, respectively, to correct distortion of the irradiated region 200' in the horizontal direction;

FIG. 3D is a diagram schematically showing electron-beam irradiated regions 200 and 200"; and FIG. 3E is a graph schematically showing the voltages $Vv(t)+kVh(t)$ and $Vh(t)$ to be applied to the electrodes V and H, respectively, to correct distortion of the irradiated region 200" in the vertical direction.

Mode for Carrying Out this Embodiment

The left half of FIG. 3A is a diagram schematically showing an electron-beam irradiated region 200 as a target. As shown in the drawing, the irradiated region 200 as a target has a rectangular shape. However, the irradiated region 200 is discretely irradiated with an electron beam (see FIG. 1F). Therefore, the irradiation units in the horizontal direction are called dots, and the irradiation units in the vertical direction are called lines, for convenience sake. The number of dots (corresponding to the length in the horizontal direction) in the irradiated region 200 is represented by Lh (5 in the example shown in FIG. 3A), and the number of lines (corresponding to the length in the vertical direction) is represented by Lv (5 in the example shown in FIG. 3A).

FIG. 3B is a graph schematically showing the voltages Vv(t) and Vh(t) to be applied to the electrodes V and H in the deflector 115 to obtain the irradiated region 200 shown in FIG. 3A. More specifically, FIG. 3B schematically shows the relationship between time t and the voltages Vv(t) and Vh(t) to be applied to the electrodes V and H, respectively. It should be noted that the electrodes V and H in the deflector 115 are electrodes for deflecting the electron beam in the vertical direction and the horizontal direction, respectively. These voltages Vv(t) and Vh(t) are controlled by the electron beam controller 132 (FIG. 1A).

Once set at a value at a certain time, the voltage Vv(t) remains the same value during a predetermined period T0. After the period T0 has passed, the voltage Vv(t) is set at a different value. This is repeated N0 times (five times in the example shown in FIG. 3B). The voltage Vv(t) corresponds to a position (or a line) in the irradiated region 200 in the vertical direction. More specifically, where the value of the voltage Vv(t) is greater, the position is closer to the lower edge of the irradiated region 200 in the vertical direction. Accordingly, as such a voltage Vv(t) is applied to the electrodes V, scanning is performed with the electron beam in the vertical direction. Here, the period T0 corresponds to the number Lh of dots (the length in the horizontal direction) of the irradiated region 200. Meanwhile, the number N0 of repetitions corresponds to the number Lv of lines (the length in the vertical direction).

The voltage Vh(t) changes linearly in cycles of the period T0. More specifically, the voltage Vh(t) increases linearly in the first half of the period T0, and decreases linearly at the same rate in the second half of the period T0. This is also repeated N0 times. The voltage Vh(t) corresponds to a position (or a dot) in the irradiated region 200 in the horizontal direction. More specifically, where the value of the voltage Vh(t) is greater, the position is closer to the right edge of the irradiated region 200 in the horizontal direction. Accordingly, as such a voltage Vh(t) is applied to the electrodes H, scanning is performed with the electron beam in the horizontal direction.

As the voltages Vv(t) and Vh(t) shown in FIG. 3B are applied to the electrodes V and H, respectively, the irradiated region 200 should have a rectangular shape as shown in FIG. 3A. However, depending on the characteristics of the deflector 115, the irradiated region 200 might be distorted in the horizontal direction. Therefore, in a case where the irradiated region 200 is distorted in the horizontal direction, correction is performed so that the irradiated region 200 has a rectangular shape in this embodiment.

The right half of FIG. 3A is a diagram schematically showing an electron-beam irradiated region 200' that is distorted in the horizontal direction. As shown in the drawing, the irradiated region 200' is a parallelogram. In this parallelogram, there are no shifts in the vertical direction, as indicated by dot-and-dash lines. Therefore, as for the vertical direction, the electron beam controller 132 should apply the voltage Vv(t) shown in FIG. 3B to the electrodes V (see the upper half of FIG. 3C) without any change.

Meanwhile, as indicated by double-dot-and-dash lines in the drawing, the second line is shifted rightward by A in the horizontal direction with respect to the first line. In general, the nth (n=1 through Lv) line is shifted rightward by (n−1)*A. That is, the shift amount becomes larger in proportion to the position in the vertical direction, and the position in the vertical direction corresponds to the voltage Vv(t) as described above. Therefore, the electron beam controller 132 should apply the voltage Vh(t)+kVv(t) to the electrodes H (see the lower half of FIG. 3C).

Here, k represents a constant, and is set so that the electron-beam irradiated region 200' becomes closer to a rectangular shape (or preferably becomes a rectangular shape). As shown in the right half of FIG. 3A, in a case where the irradiated region 200' is a parallelogram distorted rightward (to the side at which the value of the voltage Vh(t) is greater), k is set at a negative value so that the positions of the second and later lines are shifted leftward in the horizontal direction. In a case where the irradiated region 200' is a parallelogram distorted leftward (to the side at which the value of the voltage Vh(t) is smaller), k is set at a positive value so that the positions of the second and later lines are shifted rightward in the horizontal direction. Where the distortion amount A is larger, the absolute value of k is set at a greater value.

As described above, in this embodiment, in a case where the irradiated region 200 is distorted in the horizontal direction, the voltage Vv(t) is applied to the electrodes V for deflecting the electron beam in the vertical direction, and the voltage Vh(t)+kVv(t) is applied to the electrodes H for deflecting the electron beam in the horizontal direction. In this manner, the distorted irradiated region 200' can be made closer to a rectangular shape.

The above described embodiment is designed on the assumption that the irradiated region 200 is distorted in the horizontal direction. On the other hand, the embodiment described next is designed on the assumption that the irradiated region 200 is distorted in the vertical direction. Different aspects will be mainly explained in the description below.

The upper half of FIG. 3D is the same as the left half of FIG. 3A, and the lower half of FIG. 3D is a diagram schematically showing an electron-beam irradiated region 200" distorted in the vertical direction. As shown in the drawing, the irradiated region 200" is a parallelogram. In this parallelogram, there are no shifts in the horizontal direction, as indicated by dot-and-dash lines. Therefore, as for the horizontal direction, the electron beam controller 132 should apply the voltage Vh(t) shown in FIG. 3B to the electrodes H (see the lower half of FIG. 3E).

Meanwhile, as indicated by double-dot-and-dash lines in the drawing, the second dot is shifted upward by B in the vertical direction with respect to the first dot. In general, the nth (n=1 through Lh) dot is shifted upward by (n−1)*B. That is, the shift amount becomes larger in proportion to the position in the horizontal direction, and the position in the horizontal direction corresponds to the voltage Vh(t) as described above. Therefore, the electron beam controller 132 should apply the voltage Vv(t)+kVh(t) to the electrodes V (see the upper half of FIG. 3E).

Here, k represents a constant, and is set so that the electron-beam irradiated region 200" becomes closer to a rectangular shape (or preferably becomes a rectangular shape). As shown in the lower half of FIG. 3D, in a case where the irradiated region 200" is a parallelogram distorted upward (to the side at which the value of the voltage Vv(t) is smaller), k is set at a positive value so that the positions of the second and later dots are shifted downward in the vertical direction. In a case where the irradiated region 200" is a parallelogram distorted downward (to the side at which the value of the voltage Vv(t) is greater), on the other hand, k is set at a negative value so that the positions of the second and later dots are shifted upward in the vertical direction. Where the distortion amount B is larger, the absolute value of k is set at a greater value.

As described above, in this embodiment, in a case where the irradiated region 200 is distorted in the vertical direction, the voltage Vh(t) is applied to the electrodes H for deflecting the electron beam in the horizontal direction, and the voltage Vv(t)+kVh(t) is applied to the electrodes V for deflecting the electron beam in the vertical direction. In this manner, the distorted irradiated region 200″ can be made closer to a rectangular shape.

REFERENCE SIGNS LIST

300, 300′, 300″ Irradiated region

Third Embodiment

Technical Field

This embodiment relates to an electron beam irradiation apparatus, and an electron beam control method and a program.

Related Art

An electron beam is emitted from an electron beam irradiation apparatus, to increase the etching resistance of a resist mask.

Problem to be Solved by this Embodiment

An etching rate in plasma etching is not spatially uniform, but has a predetermined distribution (being high in the vicinity of the central part, for example). Therefore, in a case where a sample surface is uniformly irradiated with an electron beam from an electron beam irradiation apparatus so that the etching resistance of the resist is uniformly increased on the entire surface, differences are caused in the etching amount in accordance with the etching rate distribution.

Therefore, this embodiment aims to provide an electron beam irradiation apparatus, and an electron beam control method and a program that can reduce the etching amount variation to be caused by an etching rate distribution.

Solution to Problem

<Aspect 1>

An electron beam irradiation apparatus comprising:

a deflector that deflects an electron beam; and a controller that scans the electron beam by controlling the deflector, wherein the controller controls the deflector so that a moving speed of the electron beam in a first scanning direction in a first region is slower than a moving speed of the first scanning direction in a second region, an etching rate of the second region being lower than an etching rate of the first region.

In this structure, movement of the electron beam in the first scanning direction in the first region is slower than that in the second region. Accordingly, the amount of electron beam irradiation in the first region becomes larger than that in the second region, and the etching resistance of the resist in the first region becomes higher than that in the second region. Even if the etching rate in the first region is higher than that in the second region in this structure, the portions to be etched by plasma etching can be reduced, and the etching amount differences to be caused by the etching rate distribution can be reduced, because the etching resistance of the resist in the first region is higher than that in the second region.

<Aspect 2>

The electron beam irradiation apparatus according to aspect 1, wherein a first electrode is provided on a deflector for scan the electron bean in the first scanning direction, and the controller controls the deflector so that a variation of a voltage per unit time applied on the first electrode during a first term in which the first region is scanned is smaller than a variation of the voltage per unit time applied on the first electrode during a second term in which the second region is scanned.

In this structure, movement of the electron beam in the first scanning direction during the first period is slower than that during the second period, and therefore, the amount of electron beam irradiation during the first period is larger than that during the second period. Accordingly, the etching resistance of the resist in the region to be irradiated with the electron beam during the first period becomes higher than the etching resistance of the resist in the region to be irradiated with the electron beam during the second period. Even if the etching rate in the region to be irradiated with the electron beam during the first period is high, the portions to be etched by plasma etching can be reduced, and the etching amount variation to be caused by the etching rate distribution can be reduced, because the etching resistance of the resist is high.

<Aspect 3>

The electrode irradiation apparatus according to aspect 2, wherein the second term is divided into a former term and a latter term, and the first term is between the former term of the second term and the latter term of the second term.

<Aspect 4>

The electrode irradiation apparatus according to aspect one of 1 to 3, wherein the etching rate is larger than a threshold in the first region.

<Aspect 5>

The electrode irradiation apparatus according to aspect one of 1 to 3, wherein the first region is substantially set on a center of a substrate.

<Aspect 6>

The electrode irradiation apparatus according to aspect one of 1 to 5, wherein a shape of the first region is substantially circle.

<Aspect 7>

The electrode irradiation apparatus according to aspect one of 1 to 5, wherein a shape of the first region is substantially rectangle.

<Aspect 8>

The electrode irradiation apparatus according to aspect one of 1 to 7, wherein the first scanning direction is a horizontal direction.

<Aspect 9>

An electron beam controlling method implemented by an electron beam irradiation apparatus that comprises a deflector that deflects an electron beam, and a controller that scans the electron beam by controlling the deflector, the method comprising controlling the deflector so that a moving speed of the electron beam in a first scan direction in a first region is slower than a moving speed of the first scanning direction in a second region, an etching rate of the second region being lower than an etching rate of the first region.

In this structure, movement of the electron beam in the first scanning direction in the first region is slower than that in the second region. Accordingly, the amount of electron beam irradiation in the first region becomes larger than that in the second region, and the etching resistance of the resist in the first region becomes higher than that in the second region. Even if the etching rate in the first region is higher than that in the second region in this structure, the portions to be etched by plasma etching can be reduced, and the etching amount differences to be caused by the etching rate distribution can be reduced, because the etching resistance of the resist in the first region is higher than that in the second region.

<Aspect 10>

A program that causes a computer to function as a controller that controls a deflector to scan an electron beam, the controller controls the deflector so that a moving speed of the electron beam in a first scan direction in a first region is slower than a moving speed of the first scanning direction in a second region, an etching rate of the second region being lower than an etching rate of the first region.

In this structure, movement of the electron beam in the first scanning direction in the first region is slower than that in the second region. Accordingly, the amount of electron beam irradiation in the first region becomes larger than that in the second region, and the etching resistance of the resist in the first region becomes higher than that in the second region. Even if the etching rate in the first region is higher than that in the second region in this structure, the portions to be etched by plasma etching can be reduced, and the etching amount differences to be caused by the etching rate distribution can be reduced, because the etching resistance of the resist in the first region is higher than that in the second region.

Effect of this Embodiment

According to this embodiment, movement of the electron beam in the first scanning direction in the first region is slower than that in the second region. Accordingly, the amount of electron beam irradiation in the first region becomes larger than that in the second region. Thus, the etching resistance of the resist mask in the first region becomes higher than that in the second region. Even if the etching rate in the first region is higher than that in the second region in this structure, the portions to be etched by plasma etching can be reduced, and the etching amount differences to be caused by the etching rate distribution can be reduced, because the etching resistance of the resist mask in the first region is higher than that in the second region.

Brief Description of Drawings

Figure 4A:
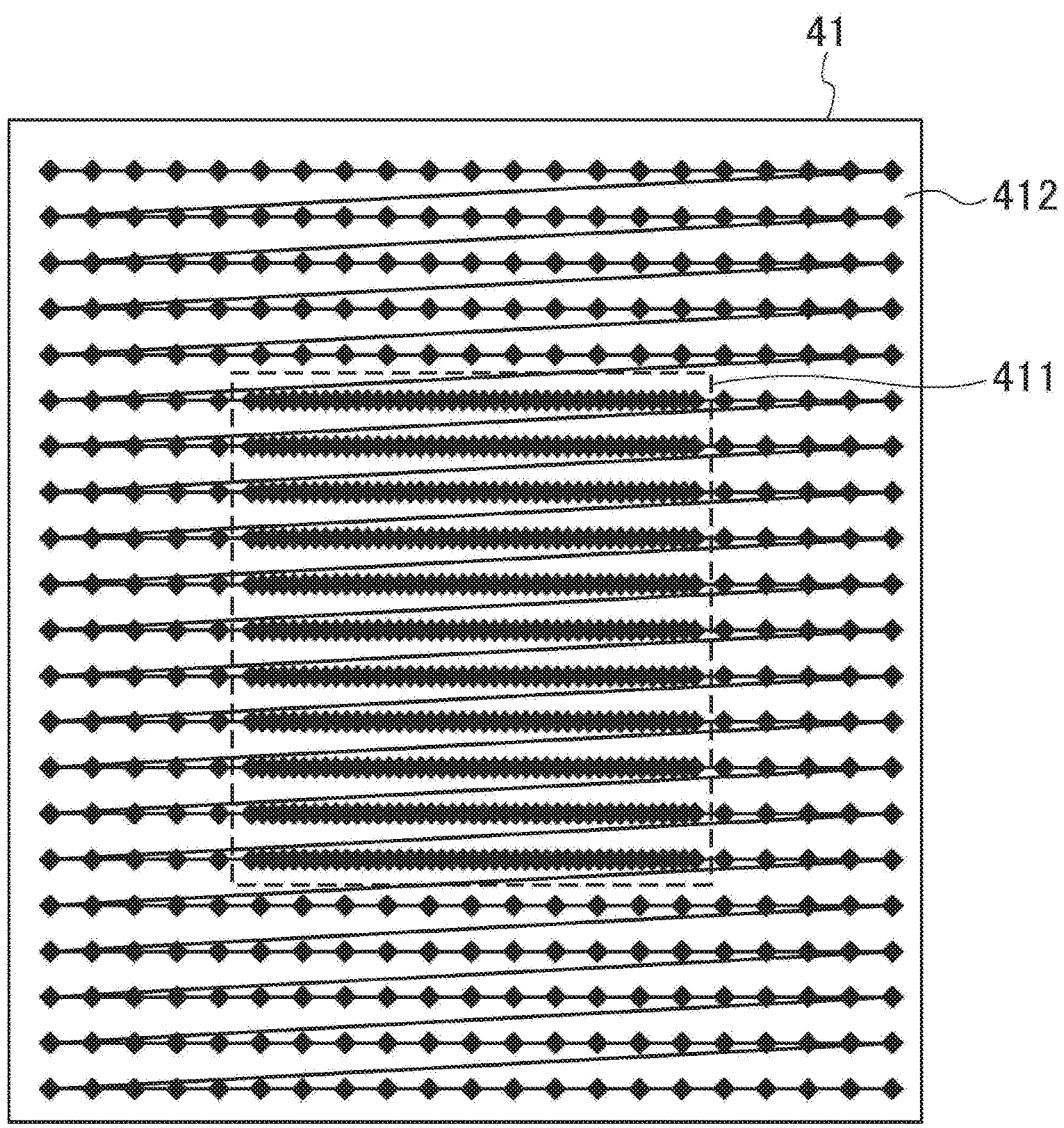
FIG. 4A is a diagram schematically showing an electron-beam irradiated region 41.
Figure 4B:
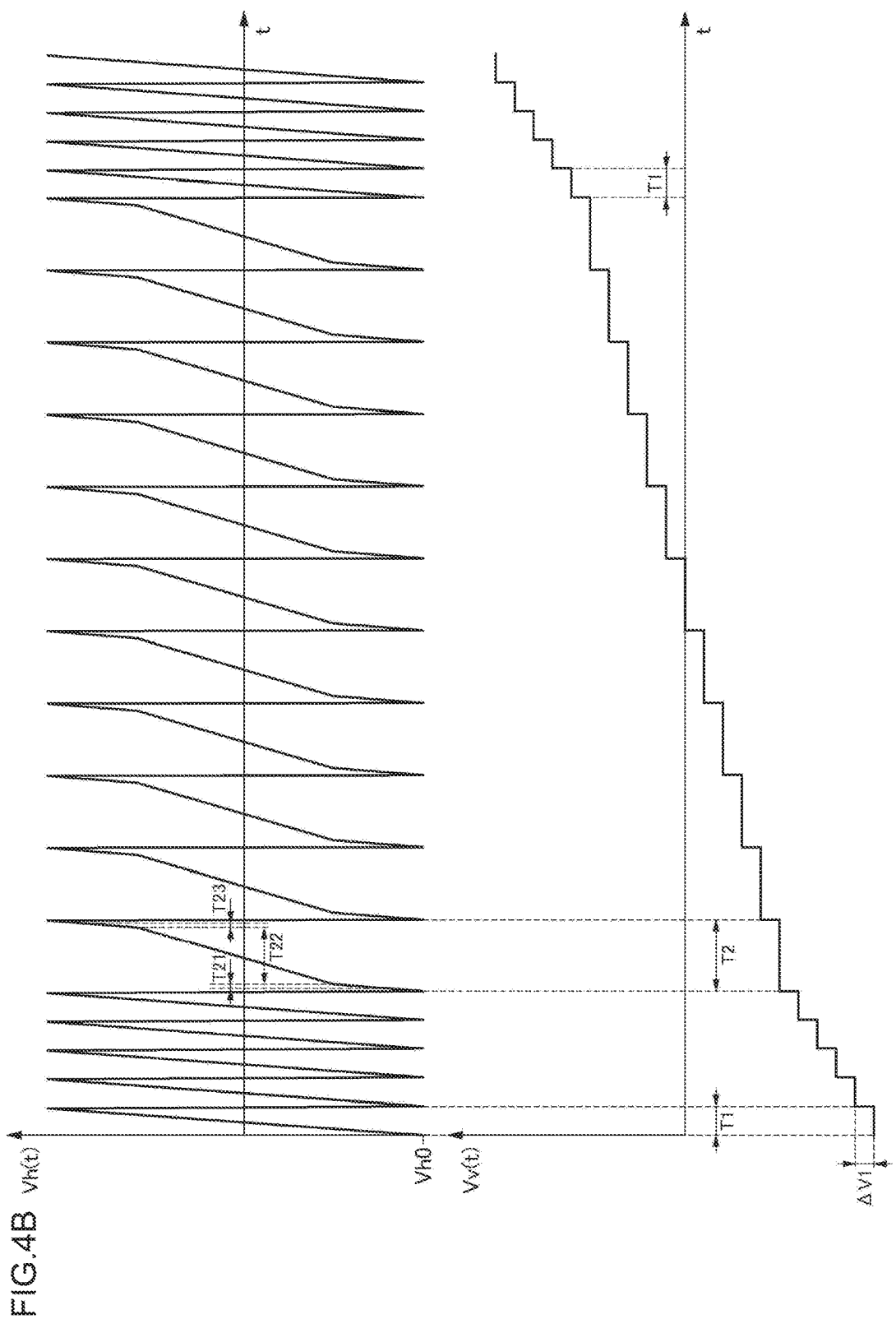
FIG. 4B is a graph schematically showing the voltages Vh(t) and Vv(t) to be applied to the electrodes H and V, respectively, in the deflector 115 to obtain the irradiated region 41 shown in FIG. 4A.
Figure 4C:
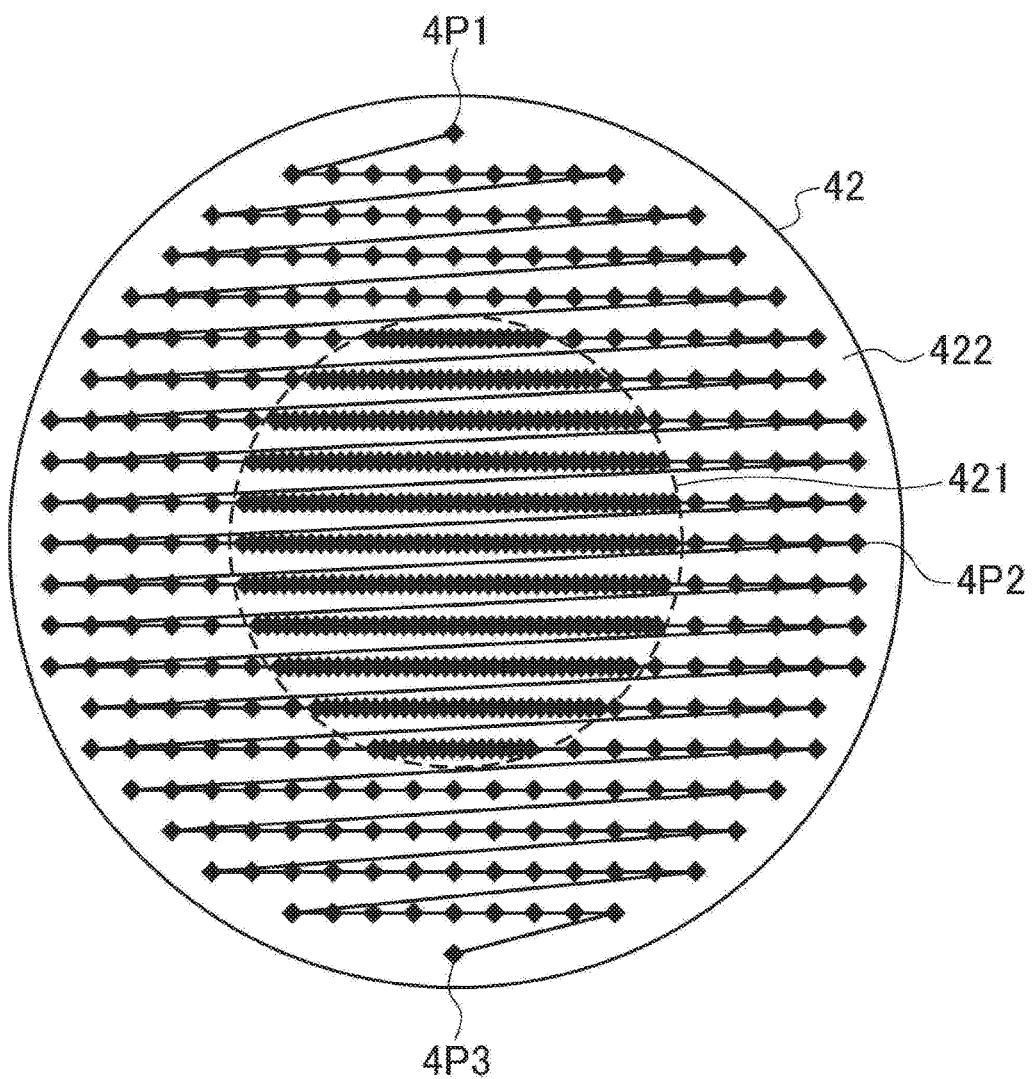
FIG. 4C is a diagram schematically showing an electron-beam irradiated region 42.
Figure 4E:
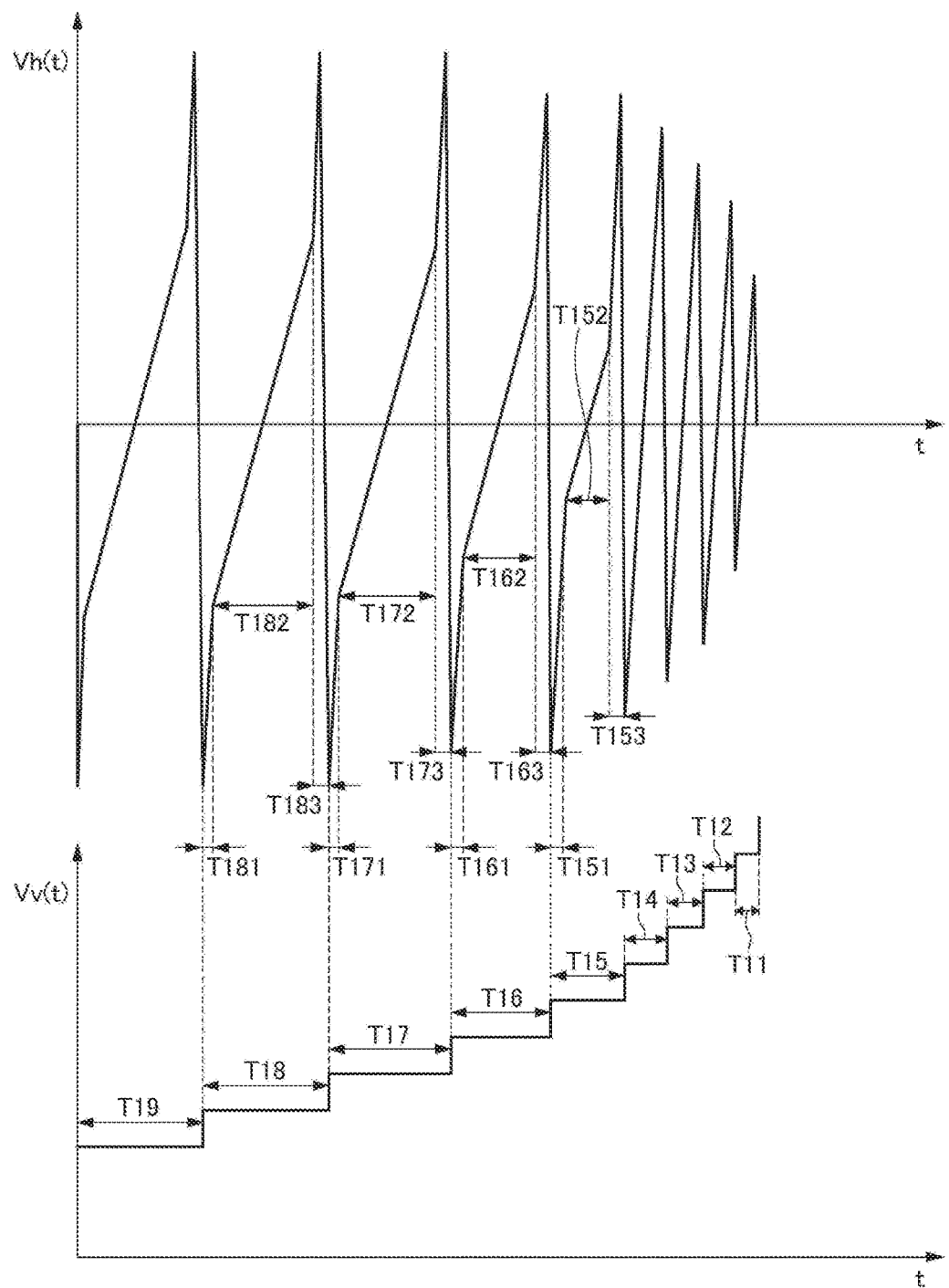
FIG. 4E is a graph schematically showing the voltages Vh(t) and Vv(t) to be applied to the electrodes H and V, respectively, in the deflector 115 in the portion from the point 4P2 to a point 4P3 in the irradiated region 42 shown in FIG. 4C.

FIG. 4A is a diagram schematically showing an electron-beam irradiated region 41;

FIG. 4B is a graph schematically showing the voltages Vh(t) and Vv(t) to be applied to the electrodes H and V, respectively, in the deflector 115 to obtain the irradiated region 41 shown in FIG. 4A;

FIG. 4C is a diagram schematically showing an electron-beam irradiated region 42;

FIG. 4D is a graph schematically showing the voltages Vh(t) and Vv(t) to be applied to the electrodes H and V, respectively, in the deflector 115 in the portion from a point 4P1 to a point 4P2 in the irradiated region 42 shown in FIG. 4C; and FIG. 4E is a graph schematically showing the voltages Vh(t) and Vv(t) to be applied to the electrodes H and V, respectively, in the deflector 115 in the portion from the point 4P2 to a point 4P3 in the irradiated region 42 shown in FIG. 4C.

Mode for Carrying Out this Embodiment

FIG. 4A is a diagram schematically showing an electron-beam irradiated region 41 as a target. The irradiated region 41 is part of a substrate on which a layer to be etched is formed. As shown in the drawing, the irradiated region 41 as a target has a rectangular shape. In practice, however, an electron beam is discretely emitted onto the positions of dots shown in FIG. 4A, for example. As indicated by the polygonal line in FIG. 4A, scanning is performed with an electron beam from the upper left corner toward the lower right corner in FIG. 4A.

The irradiated region 41 is divided into a first region 411 and a second region 412 having a lower etching rate than the first region 411, for example. The first region 411 is a region in which the etching rate is higher than a threshold value, and is set at a central part of the substrate. The first region 411 is a rectangle, for example. In the region located above the first region 411 of the second region 412, five lines are scanned in the horizontal direction, the five lines being located in different positions in the vertical direction. After that, in the region including the first region 411, eleven lines are scanned in the horizontal direction, for example, the eleven lines being located in different positions in the vertical direction. In the region located below the first region 411 of the second region 412, five lines are then scanned in the horizontal direction, the five lines being located in different positions in the vertical direction. This aspect will be described below.

As shown in FIG. 4A, in the first region 411, the intervals between the dots in the horizontal direction are shorter than those in the outer region. That is, the moving speed of the electron beam in the horizontal direction in the first region 411 shown in FIG. 4A is lower than the moving speed of the electron beam in the horizontal direction outside the first region 411 shown in FIG. 4A.

The processing to be performed by the controller 13 in this case is now described. The controller 13 controls the deflector 115 so that the moving speed of the electron beam in the horizontal direction in the first region 411 shown in FIG. 4A becomes lower than the moving speed of the electron beam in the horizontal direction in the second region 412 shown in FIG. 4A. In this structure, movement of the electron beam in the horizontal direction in the first region 411 in FIG. 4A is slower than that in the second region 412 in FIG. 4A. Accordingly, the amount of electron beam irradiation in the first region 411 becomes larger than that in the second region 412. Thus, the etching resistance of the resist in the first region 411 in FIG. 4A becomes higher than that in the second region 412 in FIG. 4A. Even if the etching rate in the first region 411 in FIG. 4A is higher than that in the second region 412 in this structure, the portions to be etched by plasma etching can be reduced, and the etching amount differences to be caused by the etching rate distribution can be reduced, because the etching resistance of the resist in the first region 411 is higher than that in the second region 412.

In this embodiment, the deflector 115 is an electrostatic deflector, for example. FIG. 4B is a graph schematically showing the voltages Vh(t) and Vv(t) to be applied to the electrodes H and V, respectively, in the deflector 115 to obtain the irradiated region 41 shown in FIG. 4A. More specifically, FIG. 4B schematically shows the relationship between time t and the voltages Vh(t) and Vv(t) to be applied to the electrodes H and V, respectively. It should be noted that the electrodes H and V in the deflector 115 are electrodes for deflecting the electron beam in the horizontal direction and the vertical direction, respectively. These voltages Vh(t) and Vv(t) are controlled by the electron beam controller 132 (FIG. 1A) in the controller 13. In the description below, these voltages Vh(t) and Vv(t) are controlled by the controller 13, for ease of explanation.

Once set at a value at a certain time, the voltage Vv(t) remains the same value during a predetermined period T1. After the period T1 has passed, the voltage Vv(t) is set at a value that is greater by a difference voltage ΔV1. This is repeated N1 times (five times in the example shown in FIG. 4B, which is equivalent to five lines). The voltage Vv(t) corresponds to a position (or a line) in the irradiated region 41 in the vertical direction. More specifically, where the value of the voltage Vv(t) is greater, the position is closer to the lower edge of the irradiated region 41 in the vertical direction. Accordingly, as such a voltage Vv(t) is applied to the electrodes V, the position of the electron beam in the vertical direction is moved.

Meanwhile, the voltage Vh(t) changes linearly in cycles of the period T1. More specifically, the voltage Vh(t) increases linearly along a first slope during the period T1. This is also repeated N1 times. The voltage Vh(t) corresponds to a position (or a dot) in the irradiated region 41 in the horizontal direction. More specifically, where the value of the voltage Vh(t) is greater, the position is closer to the right edge of the irradiated region 41 in the horizontal direction. Accordingly, as such a voltage Vh(t) is applied to the electrodes H, the irradiation position of the electron beam is moved in the horizontal direction.

After that, when being set at a value that is even greater by the difference voltage ΔV1, the voltage Vv(t) remains the same value during a predetermined period T2 (>T1). After the period T2 has passed, the voltage Vv(t) is set at a value that is greater by the difference voltage ΔV1. This is repeated N2 times (eleven times in the example shown in FIG. 4B, which is equivalent to eleven lines).

Meanwhile, the voltage Vh(t) changes polygonally in cycles of the period T2. More specifically, the voltage Vh(t) increases linearly along a first slope during an early period T21, increases linearly along a second slope that is gentler than the first slope during an intermediate period T22, and, during a later period T23, increases linearly along the same first slope as that during the early period T21. That is, the change in the voltage Vh(t) per unit time during the period T22 (which is equivalent to a slope of the voltage Vh(t) shown in FIG. 4B) is smaller than the change in the voltage Vh(t) per unit time during the period T21 and the period T23 (which is equivalent to a slope of the voltage Vh(t) shown in FIG. 4B). This is also repeated N2 times (eleven times in the example shown in FIG. 4B, which is equivalent to eleven lines).

After that, when being set at a value that is even greater by the difference voltage ΔV1, the voltage Vv(t) remains the same value during the predetermined period T1. After the period T1 has passed, the voltage Vv(t) is set at a value that is greater by the difference voltage ΔV1. This is repeated N1 times (five times in the example shown in FIG. 4B, which is equivalent to five lines).

Meanwhile, the voltage Vh(t) changes linearly in cycles of the period T1. More specifically, the voltage Vh(t) increases linearly along a first slope during the period T1. After the period T1 has passed, the voltage Vh(t) returns to the initial value Vh0. This is also repeated N times.

Specifically, the controller 13 in this embodiment controls the deflector 115 so that the change in the voltage Vh(t) per unit time during the period T22 in FIG. 4B becomes smaller than the change in the voltage Vh(t) per unit time during the periods T21 and T23 in FIG. 4B. In this structure, movement of the electron beam in the horizontal direction during the period T22 in FIG. 4B is slower than that during the periods T21 and T23 in FIG. 4B. Accordingly, the etching resistance of the resist in the region to be irradiated with the electron beam during the period T22 in FIG. 4B becomes higher than the etching resistance of the resist in the region to be irradiated with the electron beam during the periods T21 and T23 in FIG. 4B. Even if the etching rate in the region to be irradiated with the electron beam during the period T22 in FIG. 4B is high, the portions to be etched by plasma etching can be reduced, and the etching amount differences to be caused by the etching rate distribution can be reduced, because the etching resistance of the resist is high.

Although the moving speed of the electron beam is low in the horizontal direction in this embodiment, the moving speed of the electron beam may be low in any appropriate direction such as the vertical direction. In that case, the controller 13 may control the deflector 115 so that the moving speed of the electron beam in the first scanning direction in the first region 411 becomes lower than the moving speed of the electron beam in the first scanning direction in the second region 412. Here, the first scanning direction is an appropriate direction including a horizontal direction or a vertical direction.

In this structure, movement of the electron beam in the horizontal direction in the first region 411 is slower than that in the second region 412. Accordingly, the amount of electron beam irradiation in the first region 411 becomes larger than that in the second region 412. Thus, the etching resistance of the resist in the first region 411 becomes higher than that in the second region 412. Even if the etching rate in the first region 411 is higher than that in the second region 412 in this structure, the portions to be etched by plasma etching can be reduced, and the etching amount differences to be caused by the etching rate distribution can be reduced, because the etching resistance of the resist in the first region 411 is higher than that in the second region 412.

In an example of specific processing in this case, the controller 13 may also control the deflector 115 so that the change in the voltage to be applied to a first electrode per unit time during the first period (the period T22 in FIG. 4B, for example) during which the first region 411 is scanned becomes smaller than the change in the voltage to be applied to the first electrode per unit time during the second period (the period T21 and/or the period T23 in FIG. 4B, for example) during which the second region 412 is scanned. Here, the first electrode is an appropriate electrode including the electrodes H and V, and is an electrode to be provided for performing scanning with the electron beam in the first scanning direction.

In this structure, movement of the electron beam in the scanning direction during the first period is slower than that during the second period, and therefore, the amount of electron beam irradiation during the first period is larger than that during the second period. Accordingly, the etching resistance of the resist in the region to be irradiated with the electron beam during the first period becomes higher than the etching resistance of the resist in the region to be irradiated with the electron beam during the second period. Even if the etching rate in the region to be irradiated with the electron beam during the first period is high in this structure, the portions to be etched by plasma etching can be reduced, and the etching amount differences to be caused by the etching rate distribution can be reduced, because the etching resistance of the resist is high.

Here, the second period is divided into an early period (the period T21 in FIG. 4B, for example) and a later period (the period T23 in FIG. 4B, for example), and the first period (the period 122 in FIG. 4B, for example) is the period interposed between the early period (the period T21 in FIG. 4B, for example) of the second period and the later period (the period T23 in FIG. 4B, for example) of the second period.

Although the region in which the scanning speed is lowered is a rectangle in this embodiment, the region may be a triangle or a polygon such as a pentagon.

(Modification)

Next, a modification of this embodiment is described.

Although the region in which the scanning speed is lowered is a rectangle in this embodiment, the region has a round shape in this modification.

FIG. 4C is a diagram schematically showing an electron-beam irradiated region 42 as a target. The irradiated region 42 is part of a substrate on which a layer to be etched is formed. As shown in the drawing, the irradiated region 42 as a target has a round shape. In practice, however, an electron beam is discretely emitted onto the positions of dots shown in FIG. 4C, for example. As indicated by the polygonal line in FIG. 4C, scanning with an electron beam is performed from top to bottom in the entire irradiated region, and from left to right in the same positions in the vertical direction.

The irradiated region 42 is divided into a first region 421 and a second region 422 having a lower etching rate than the first region 421, for example. The first region 421 is a region in which the etching rate is higher than a threshold value, and is set at a central part of the substrate. The first region 421 has an almost round shape, for example. The round shape may include a true circle or an ellipse, and the lines forming the round shape may include not only a curved line but also polygonal lines. In the region located above the first region 421 of the second region 422, five lines are scanned in the horizontal direction, the five lines being located in different positions in the vertical direction. After that, in the region including the first region 421, eleven lines are scanned in the horizontal direction, for example, the eleven lines being located in different positions in the vertical direction. In the region located below the first region 421 of the second region 422, five lines are then scanned in the horizontal direction, the five lines being located in different positions in the vertical direction.

As shown in FIG. 4C, in the first region 421, the intervals between the dots in the horizontal direction are shorter than those in the outer region. That is, the moving speed of the electron beam in the horizontal direction in the first region 421 shown in FIG. 4C is lower than the moving speed of the electron beam in the horizontal direction outside the first region 421 shown in FIG. 4C.

The processing to be performed by the controller 13 in this case is now described. The controller 13 controls the deflector 115 so that the moving speed of the electron beam in the horizontal direction in the first region 421 shown in FIG. 4C becomes lower than the moving speed of the electron beam in the horizontal direction outside the first region 421 shown in FIG. 4C. In this structure, movement of the electron beam in the horizontal direction in the first region 421 in FIG. 4C is slower than that in the second region 422 in FIG. 4C. Accordingly, the amount of electron beam irradiation in the first region 421 becomes larger than that in the second region 422. Thus, the etching resistance of the resist in the first region 421 in FIG. 4C becomes higher than that in the second region 422 in FIG. 4C. Even if the etching rate in the first region 421 in FIG. 4C is higher than that in the second region 422 in this structure, the portions to be etched by plasma etching can be reduced, and the etching amount differences to be caused by the etching rate distribution can be reduced, because the etching resistance of the resist in the first region 421 is higher than that in the second region 422.

FIG. 4D is a graph schematically showing the voltages Vh(t) and Vv(t) to be applied to the electrodes H and V, respectively, in the deflector 115 in the portion from a point 4P1 to a point 4P2 in the irradiated region 42 in FIG. 4C. Likewise, FIG. 4E is a graph schematically showing the voltages Vh(t) and Vv(t) to be applied to the electrodes H and V, respectively, in the deflector 115 in the portion from the point 4P2 to a point 4P3 in the irradiated region 42 in FIG. 4C. FIGS. 4D and 4E schematically show the relationship between time t and the voltages Vh(t) and Vv(t) to be applied to the electrodes H and V, respectively.

The voltage Vv(t) is set at a value at a certain time. After a unit time Δt has passed, the voltage Vv(t) is set at a value that is even greater by a difference voltage ΔV2. The voltage Vv(t) remains the same value during a predetermined period T11. After the period T11 has passed, the voltage Vv(t) is set at a value that is greater by the difference voltage ΔV2. The voltage Vv(t) then remains the same value during a predetermined period T12 (>T11). After the period T12 has passed, the voltage Vv(t) is set at a value that is greater by the difference voltage ΔV2. The voltage Vv(t) then remains the same value during a predetermined period T13 (>T12). After the period T13 has passed, the voltage Vv(t) is set at a value that is greater by the difference voltage ΔV2. The voltage Vv(t) then remains the same value during a predetermined period T14 (>T13). After the period T14 has passed, the voltage Vv(t) is set at a value that is greater by the difference voltage ΔV2. The voltage Vv(t) corresponds to a position (or a line) in the irradiated region 42 in the vertical direction. More specifically, where the value of the voltage Vv(t) is greater, the position is closer to the lower edge of the irradiated region 42 in the vertical direction. Accordingly, as such a voltage Vv(t) is applied to the electrodes V, the position of the electron beam in the vertical direction is moved.

Meanwhile, the voltage Vh(t) linearly changes during the corresponding periods T11, T12, T13, and T14. More specifically, the voltage Vh(t) increases linearly along a first slope during the periods T11, T12, T13, and T14. The voltage Vh(t) corresponds to a position (or a dot) in the irradiated region 42 in the horizontal direction. More specifically, where the value of the voltage Vh(t) is greater, the position is closer to the right edge of the irradiated region 42 in the horizontal direction. Accordingly, as such a voltage Vh(t) is applied to the electrodes H, the irradiation position of the electron beam is moved in the vertical direction.

After that, when being set at a value that is even greater by the difference voltage ΔV2, the voltage Vv(t) remains the same value during a predetermined period T15 (>T14). After the period T15 has passed, the voltage Vv(t) is set at a value that is greater by the difference voltage ΔV2.

Meanwhile, the voltage Vh(t) changes polygonally during the period T15. More specifically, the voltage Vh(t) increases linearly along a first slope during an early period T151, increases linearly along a second slope that is gentler than the first slope during an intermediate period T152, and, during a later period T153, increases linearly along the same first slope as that during the early period T 51. That is, the change in the voltage Vh(t) per unit time during the period T152 (which is equivalent to a slope of the voltage Vh(t) shown in FIG. 4D) is smaller than the change in the voltage Vh(t) per unit time during the period T151 and the period T153 (which is equivalent to a slope of the voltage Vh(t) shown in FIG. 4D).

After that, when being set at a value that is even greater by the difference voltage ΔV2, the voltage Vv(t) remains the same value during a predetermined period T16 (>T15). After the period T16 has passed, the voltage Vv(t) is set at a value that is greater by the difference voltage ΔV2.

Meanwhile, the voltage Vh(t) changes polygonally during the period T16. More specifically, the voltage Vh(t) increases linearly along a first slope during an early period T161, increases linearly along a second slope that is gentler than the first slope during an intermediate period T162, and, during a later period T163, increases linearly along the same first slope as that during the early period T161. That is, the change in the voltage Vh(t) per unit time during the period T162 (which is equivalent to a slope of the voltage Vh(t) shown in FIG. 4D) is smaller than the change in the voltage Vh(t) per unit time during the period T161 and the period T163 (which is equivalent to a slope of the voltage Vh(t) shown in FIG. 4D).

After that, when being set at a value that is even greater by the difference voltage ΔV2, the voltage Vv(t) remains the same value during a predetermined period T17 (>T6). After the period T17 has passed, the voltage Vv(t) is set at a value that is greater by the difference voltage ΔV2.

Meanwhile, the voltage Vh(t) changes polygonally during the period T17. More specifically, the voltage Vh(t) increases linearly along a first slope during an early period T171, increases linearly along a second slope that is gentler than the first slope during an intermediate period T172, and, during a later period T173, increases linearly along the same first slope as that during the early period T171. That is, the change in the voltage Vh(t) per unit time during the period T172 (which is equivalent to a slope of the voltage Vh(t) shown in FIG. 4D) is smaller than the change in the voltage Vh(t) per unit time during the period T171 and the period T173 (which is equivalent to a slope of the voltage Vh(t) shown in FIG. 4D).

After that, when being set at a value that is even greater by the difference voltage ΔV2, the voltage Vv(t) remains the same value during a predetermined period T18 (>T17). After the period T18 has passed, the voltage Vv(t) is set at a value that is greater by the difference voltage ΔV2.

Meanwhile, the voltage Vh(t) changes polygonally during the period T18. More specifically, the voltage Vh(t) increases linearly along a first slope during an early period T181, increases linearly along a second slope that is gentler than the first slope during an intermediate period T182, and, during a later period T183, increases linearly along the same first slope as that during the early period T181. That is, the change in the voltage Vh(t) per unit time during the period T182 (which is equivalent to a slope of the voltage Vh(t) shown in FIG. 4D) is smaller than the change in the voltage Vh(t) per unit time during the period T181 and the period T183 (which is equivalent to a slope of the voltage Vh(t) shown in FIG. 4D).

After that, when being set at a value that is even greater by the difference voltage ΔV2, the voltage Vv(t) remains the same value during a predetermined period T19 (>T18). After the period T19 has passed, the voltage Vv(t) is set at a value that is greater by the difference voltage ΔV2. This is repeated three times, for example.

Meanwhile, the voltage Vh(t) changes polygonally during each period T19. More specifically, the voltage Vh(t) increases linearly along a first slope during an early period T191, increases linearly along a second slope that is gentler than the first slope during an intermediate period T192, and, during a later period T193, increases linearly along the same first slope as that during the early period T191. That is, the change in the voltage Vh(t) per unit time during the period T192 (which is equivalent to a slope of the voltage Vh(t) shown in FIG. 4D) is smaller than the change in the voltage Vh(t) per unit time during the period T191 and the period T193 (which is equivalent to a slope of the voltage Vh(t) shown in FIG. 4D).

After that, when being set at a value that is even greater by the difference voltage ΔV2, the voltage Vv(t) remains the same value during a predetermined period T 8. After the period T18 has passed, the voltage Vv(t) is set at a value that is greater by the difference voltage ΔV2.

Meanwhile, the voltage Vh(t) changes polygonally during the period T18. More specifically, the voltage Vh(t) increases linearly along a first slope during an early period T181, increases linearly along a second slope that is gentler than the first slope during an intermediate period T182, and, during a later period T183, increases linearly along the same first slope as that during the early period T181. That is, the change in the voltage Vh(t) per unit time during the period T182 (which is equivalent to a slope of the voltage Vh(t) shown in FIG. 4E) is smaller than the change in the voltage Vh(t) per unit time during the period T181 and the period T183 (which is equivalent to a slope of the voltage Vh(t) shown in FIG. 4E).

After that, when being set at a value that is even greater by the difference voltage ΔV2, the voltage Vv(t) remains the same value during a predetermined period T17. After the period T17 has passed, the voltage Vv(t) is set at a value that is greater by the difference voltage ΔV2.

Meanwhile, the voltage Vh(t) changes polygonally during the period T17. More specifically, the voltage Vh(t) increases linearly along a first slope during an early period T171, increases linearly along a second slope that is gentler than the first slope during an intermediate period T172, and, during a later period T173, increases linearly along the same first slope as that during the early period T171. That is, the change in the voltage Vh(t) per unit time during the period T172 (which is equivalent to a slope of the voltage Vh(t) shown in FIG. 4E) is smaller than the change in the voltage Vh(t) per unit time during the period T171 and the period T173 (which is equivalent to a slope of the voltage Vh(t) shown in FIG. 4E).

After that, when being set at a value that is even greater by the difference voltage ΔV2, the voltage Vv(t) remains the same value during a predetermined period T16. After the period T16 has passed, the voltage Vv(t) is set at a value that is greater by the difference voltage ΔV2.

Meanwhile, the voltage Vh(t) changes polygonally during the period T16. More specifically, the voltage Vh(t) increases linearly along a first slope during an early period T161, increases linearly along a second slope that is gentler than the first slope during an intermediate period T162, and, during a later period T163, increases linearly along the same first slope as that during the early period T161. That is, the change in the voltage Vh(t) per unit time during the period T162 (which is equivalent to a slope of the voltage Vh(t) shown in FIG. 4E) is smaller than the change in the voltage Vh(t) per unit time during the period T161 and the period T163 (which is equivalent to a slope of the voltage Vh(t) shown in FIG. 4E).

After that, when being set at a value that is even greater by the difference voltage ΔV2, the voltage Vv(t) remains the same value during a predetermined period T15. After the period T15 has passed, the voltage Vv(t) is set at a value that is greater by the difference voltage ΔV2.

Meanwhile, the voltage Vh(t) changes polygonally during the period T15. More specifically, the voltage Vh(t) increases linearly along a first slope during an early period T151, increases linearly along a second slope that is gentler than the first slope during an intermediate period T152, and, during a later period T153, increases linearly along the same first slope as that during the early period T151. That is, the change in the voltage Vh(t) per unit time during the period T152 (which is equivalent to a slope of the voltage Vh(t) shown in FIG. 4E) is smaller than the change in the voltage Vh(t) per unit time during the period T151 and the period T153 (which is equivalent to a slope of the voltage Vh(t) shown in FIG. 4E).

The voltage Vv(t) remains the same value during a predetermined period T14. After the period T14 has passed, the voltage Vv(t) is set at a value that is greater by the difference voltage ΔV2. The voltage Vv(t) then remains the same value during a predetermined period T13. After the period T13 has passed, the voltage Vv(t) is set at a value that is greater by the difference voltage ΔV2. The voltage Vv(t) then remains the same value during a predetermined period T12. After the period T12 has passed, the voltage Vv(t) is set at a value that is greater by the difference voltage ΔV2. The voltage Vv(t) then remains the same value during a predetermined period T11. After the period T11 has passed, the voltage Vv(t) is set at a value that is greater by the difference voltage ΔV2.

Meanwhile, the voltage Vh(t) linearly changes during the corresponding periods T11, T12, T13, and T14. More specifically, the voltage Vh(t) increases linearly along a first slope during the periods T11, T12, T13, and T14.

Specifically, the controller 13 in this modification controls the deflector 115 so that the change in the voltage Vh(t) per unit time during each period T152 in FIGS. 4D and 4E becomes smaller than the change in the voltage Vh(t) per unit time during each of the periods T151 and T153 in FIGS. 4D and 4E. In this structure, movement of the electron beam in the horizontal direction during each period T152 in FIGS. 4D and 4E is slower than that during each of the periods T151 and T153 in FIGS. 4D and 4E. Accordingly, the etching resistance of the resist in the region to be irradiated with the electron beam during each period T152 in FIGS. 4D and 4E becomes higher than the etching resistance of the resist in the region to be irradiated with the electron beam during each of the periods T151 and T153 in FIGS. 4D and 4E. Even if the etching rate in the region to be irradiated with the electron beam during each period T152 in FIGS. 4D and 4E is high, the portions to be etched by plasma etching can be reduced, and the etching amount differences to be caused by the etching rate distribution can be reduced, because the etching resistance of the resist is high.

Likewise, the controller 13 controls the deflector 115 so that the change in the voltage Vh(t) per unit time during each period T162 in FIGS. 4D and 4E becomes smaller than the change in the voltage Vh(t) per unit time during each of the periods T161 and T163 in FIGS. 4D and 4E. In this structure, movement of the electron beam in the horizontal direction during each period T162 in FIGS. 4D and 4E is slower than that during each of the periods T161 and T163 in FIGS. 4D and 4E. Accordingly, the etching resistance of the resist in the region to be irradiated with the electron beam during each period T162 in FIGS. 4D and 4E becomes higher than the etching resistance of the resist in the region to be irradiated with the electron beam during each of the periods T161 and T163 in FIGS. 4D and 4E. Even if the etching rate in the region to be irradiated with the electron beam during each period T162 in FIGS. 4D and 4E is high, the portions to be etched by plasma etching can be reduced, and the etching amount differences to be caused by the etching rate distribution can be reduced, because the etching resistance of the resist is high.

A program for performing each process of the controller according to this embodiment and its modification may be recorded in a computer-readable recording medium. The program recorded in the recording medium may be installed into a computer, and be executed by a processor. In this manner, the above described processes to be performed by the controller according to this embodiment and its modification may be performed.

Although the deflector 115 has been described as an electrostatic deflector in this embodiment and its modification, the deflector 115 is not necessarily an electrostatic deflector. Instead, the deflector 115 may be a magnetic deflector, and currents are applied to the electrodes H and V of the deflector 115 in that case.

The region in which the amount of electron beam irradiation is varied is not necessarily a rectangular- or round-shaped central region. The region may have any appropriate shape, be located in any appropriate position, and be located not only in one position but in two or more positions. In a case where there are two or more regions in which the amount of electron beam irradiation is varied, the regions may vary in size, the amount of electron beam irradiation may vary between regions, and the amounts of electron beam irradiation are not limited to the two types of being high and being low.

This electron beam generator can be used not only in an electron beam irradiation apparatus but also in an exposure device or an inspection device.

REFERENCE SIGNS LIST

41 Irradiated region
411 First region
412 Second region

Fourth Embodiment

Technical Field

This embodiment relates to an electron beam irradiation apparatus, an electron beam position detecting system, and an electron beam position detecting method and a program.

Related Art

In an electron beam irradiation apparatus, the position of an electron beam in a plane almost perpendicular to the traveling direction of the electron beam (this position will be hereinafter referred to as the beam position) is detected so as to correct an electron-beam irradiated region.

Problem to be Solved by this Embodiment

However, a microchannel plate (MCP) with which a beam position can be directly observed is expensive. A silicon photodiode may be placed in each predetermined area, but this method is also expensive.

A fluorescent plate with which a beam position can be detected is inexpensive, but there is a possibility of in-column particle contamination.

Therefore, this embodiment aims to provide an electron beam irradiation apparatus, an electron beam position detecting system, and an electron beam position detecting method and a program that can lower the costs for beam position detection and reduce contamination.

Solution to Problem

<Aspect 1>

An electron beam irradiation apparatus comprising:
a deflector that deflects an electron beam;
a controller that controls the electron beam by controlling the deflector;
a plate in which a plurality of holes whose spatial arrangements are unique in each of predetermined regions are provided;
a collector that collects an electron which has passed through the holes among the electron beam; and
an ammeter that measures a current due to the electron collected by the collector, wherein
the controller detects a position of the electron beam in a plane substantially perpendicular to a traveling direction of the electron beam using a distribution of positions of the current measured by the ammeter when the electron beam is scanned for each of the regions of the plate.

In this structure, each region has a unique spatial distribution of positions (spots) where the current has been measured. Thus, it is possible to determine which region an electron beam is passing through. As the plate, the collector, and the ammeter are used to detect the position of an electron beam, the costs for beam position detection can be lowered. Further, no dust is generated in the electron beam irradiation apparatus, and thus, contamination can be reduced. Since the plate is not easily broken, beam position detection can be stably performed over a lone period of time.

<Aspect 2>

The electron beam irradiation apparatus according to aspect 1, wherein each of the holes is smaller than a diameter of the electron beam.

In this structure, the positions (spots) where the current has been measured have smaller diameters than the electron beam diameter, and each of the regions has a unique spatial distribution of these spots. Thus, it is possible to determine which region the electron beam is passing through.

<Aspect 3>

The electron beam irradiation apparatus according to aspect 1 or 2, wherein a second hole, different from the holes, are provided in each of the regions, a diameter of the second hole being substantially identical to a diameter of the electron beam, and
the controller controls the deflector so that a position of the electron beam in the plane substantially perpendicular to the traveling direction of the electron beam is positioned at the second hole based on the measured current.

In this structure, the position of the electron beam in the horizontal direction can be adjusted to the position of a second through hole.

<Aspect 4>

The electron beam irradiation apparatus according to aspect 3, wherein the second hole locates at substantially a center of each of the corresponding region.

In this structure, the position of the electron beam in the horizontal direction can be adjusted to the position of the center of the corresponding region.

<Aspect 5>

The electron beam irradiation apparatus according to aspect one of 1 to 4, wherein a third hole is provided in the plate, a diameter of the third hole being larger than a diameter of the electron beam.

When the electron beam is passing through almost the center of the third through hole, the entire electron beam passes through the third through hole and reaches the collector in this structure. Thus, the ammeter can measure the current amount provided at once by the electron beam.

<Aspect 6>

The electron beam irradiation apparatus according to aspect 5, wherein the third hole locates at substantially a center of the plate.

In this structure, the current amount provided at once by the electron beam can be measured without fail.

<Aspect 7>

The electron beam irradiation apparatus according to aspect one of 1 to 6, wherein a fourth hole is provided in the plate, a diameter of the fourth hole being smaller than a diameter of the electron beam.

When the electron beam moves across the fourth through hole in this structure, the spatial distribution of the electron density of the electron beam can be measured from the number of electrons captured by the collector, which is equivalent to the current value measured by the ammeter.

<Aspect 8>

The electron beam irradiation apparatus according to aspect one of 1 to 6 further comprising a metallic member between the plate and the collector, an opening being provided in the metallic member, wherein
a negative voltage is applied on the metallic member.

In this structure, the metallic member is negatively charged, and secondary electrons emitted onto and returned by the collector are further reflected by the metallic member. Therefore, these secondary electrons are also captured by the collector. Thus, secondary electrons can be prevented from scattering to the outside.

<Aspect 9>

An electron beam position detecting system comprising:
a plate in which a plurality of holes whose spatial arrangements are unique in each of predetermined regions are provided;
a collector that collects an electron which has passed through the holes among the electron beam;
an ammeter that measures a current due to the electron collected by the collector; and
a controller that detects a position of the electron beam in a plane substantially perpendicular to a traveling direction of the electron beam using a distribution of positions of the current measured by the ammeter when the electron beam is scanned for each of the regions of the plate.

<Aspect 10>

An electron beam position detecting method comprising:
by a collector, collecting, when an electron beam is scanned for each of predetermined regions of a plate in which a plurality of holes whose spatial arrangements are unique in each of the predetermined regions are provided, an electron which has passed through the holes among the electron beam;
by an ammeter, measuring a current due to the electron collected by the collector; and
by a controller, detecting a position of the electron beam in a plane substantially perpendicular to a traveling direction of the electron beam using a distribution of positions of the current measured by the ammeter when the electron beam is scanned for each of the regions of the plate.

<Aspect 11>

A program executed by a computer of an electron beam position detecting system comprising: a plate in which a plurality of holes whose spatial arrangements are unique in each of predetermined regions are provided; a collector that collects an electron which has passed through the holes among the electron beam; and an ammeter that measures a current due to the electron collected by the collector, the program causes the computer to execute:

detecting a position of the electron beam in a plane substantially perpendicular to a traveling direction of the electron beam using a distribution of positions of the current measured by the ammeter when the electron beam is scanned for each of the regions of the plate.

Effect of this Embodiment

In an electron beam irradiation apparatus according to this embodiment, each region has a unique spatial distribution of positions (spots) where the current has been measured. Thus, it is possible to determine which region an electron beam is passing through. As the plate, the collector, and the ammeter are used to detect the position of an electron beam, the costs for beam position detection can be lowered. Further, no dust is generated in the electron beam irradiation apparatus, and thus, contamination can be reduced. Since the plate is not easily broken, beam position detection can be stably performed over a lone period of time.

Brief Description of Drawings

Figure 5B:
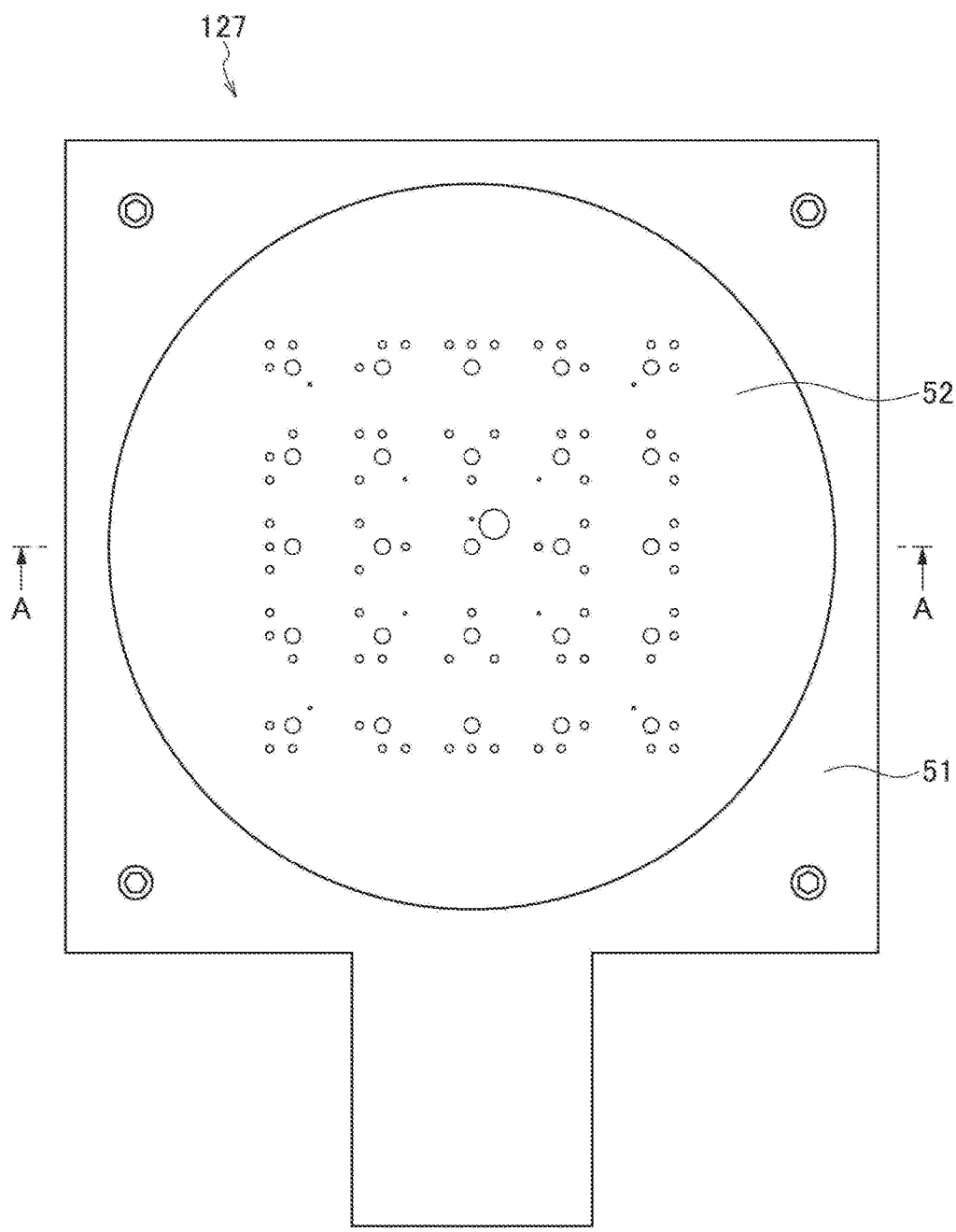
FIG. 5B is a top view of a measurement unit 127 according to this embodiment.
Figure 5C:
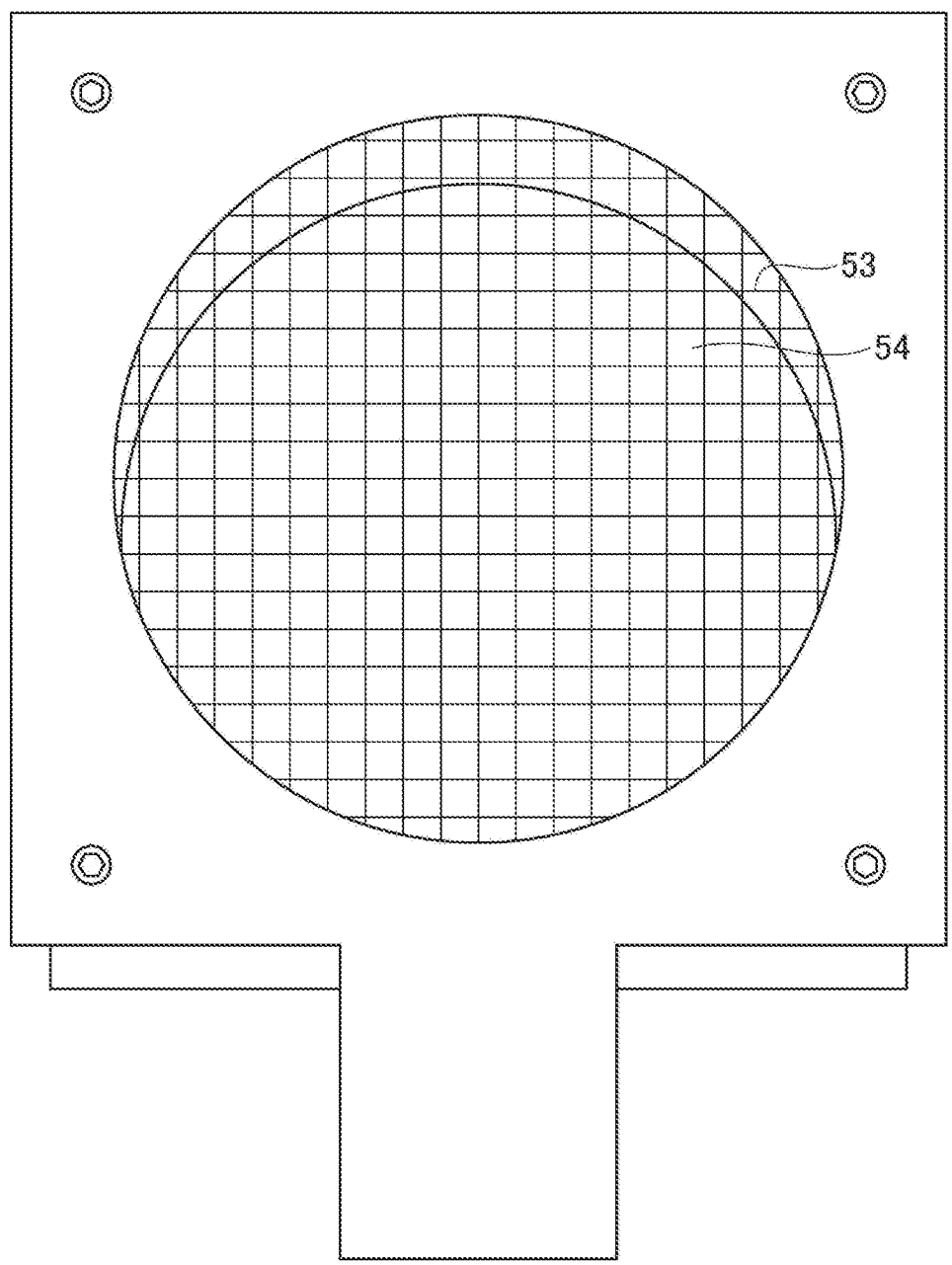
FIG. 5C is a top view of the measurement unit 127 according to this embodiment, with a plate 52 having been removed.
Figure 5D:
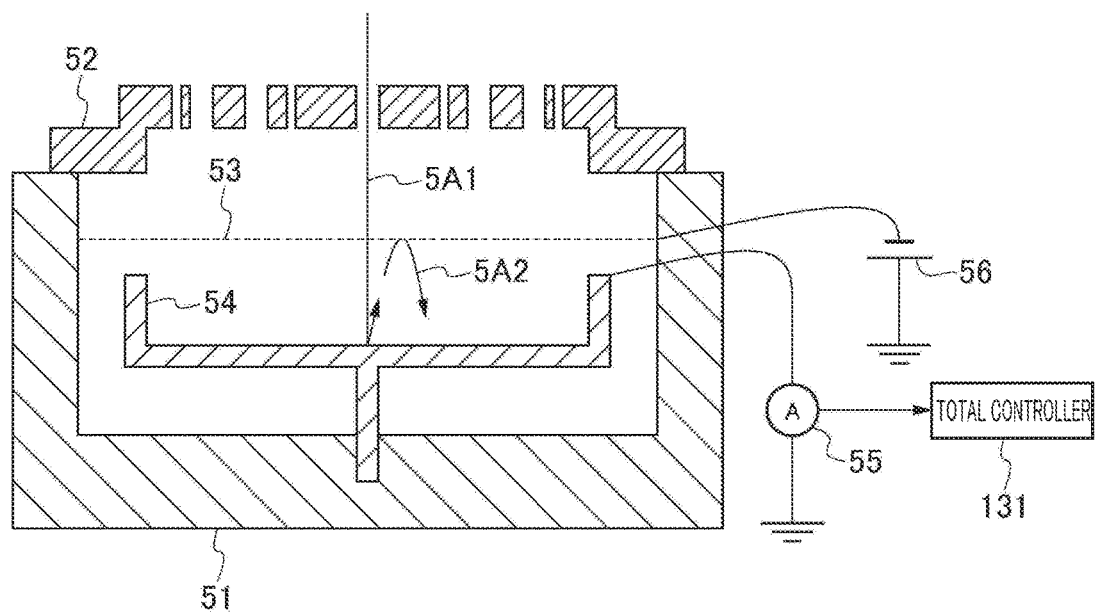
FIG. 5D is a schematic cross-sectional view taken along the A-A section line defined in FIG. 5B.
Figure 5E:
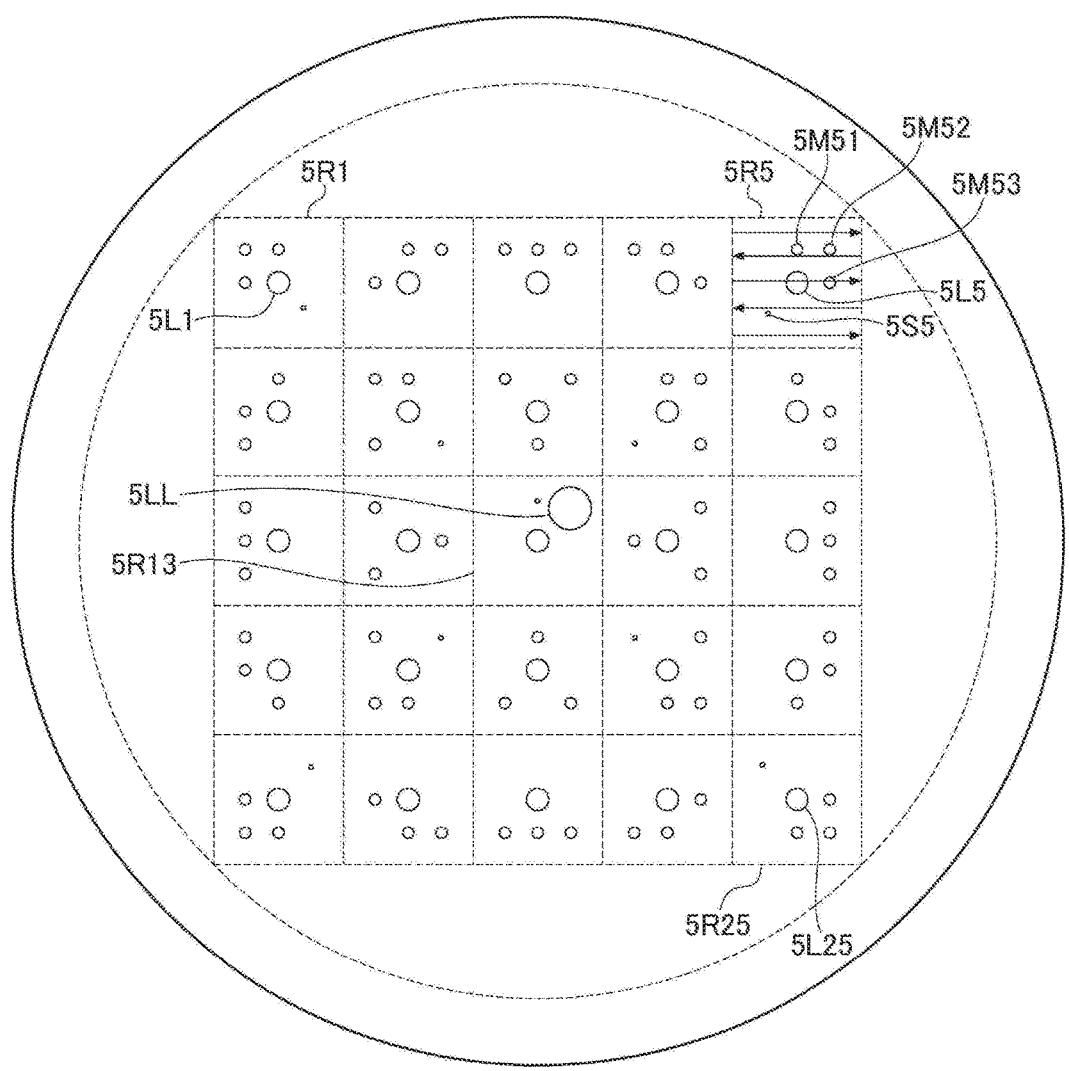
FIG. 5E is a diagram showing an example layout of through holes in the plate 52.
Figure 5F:
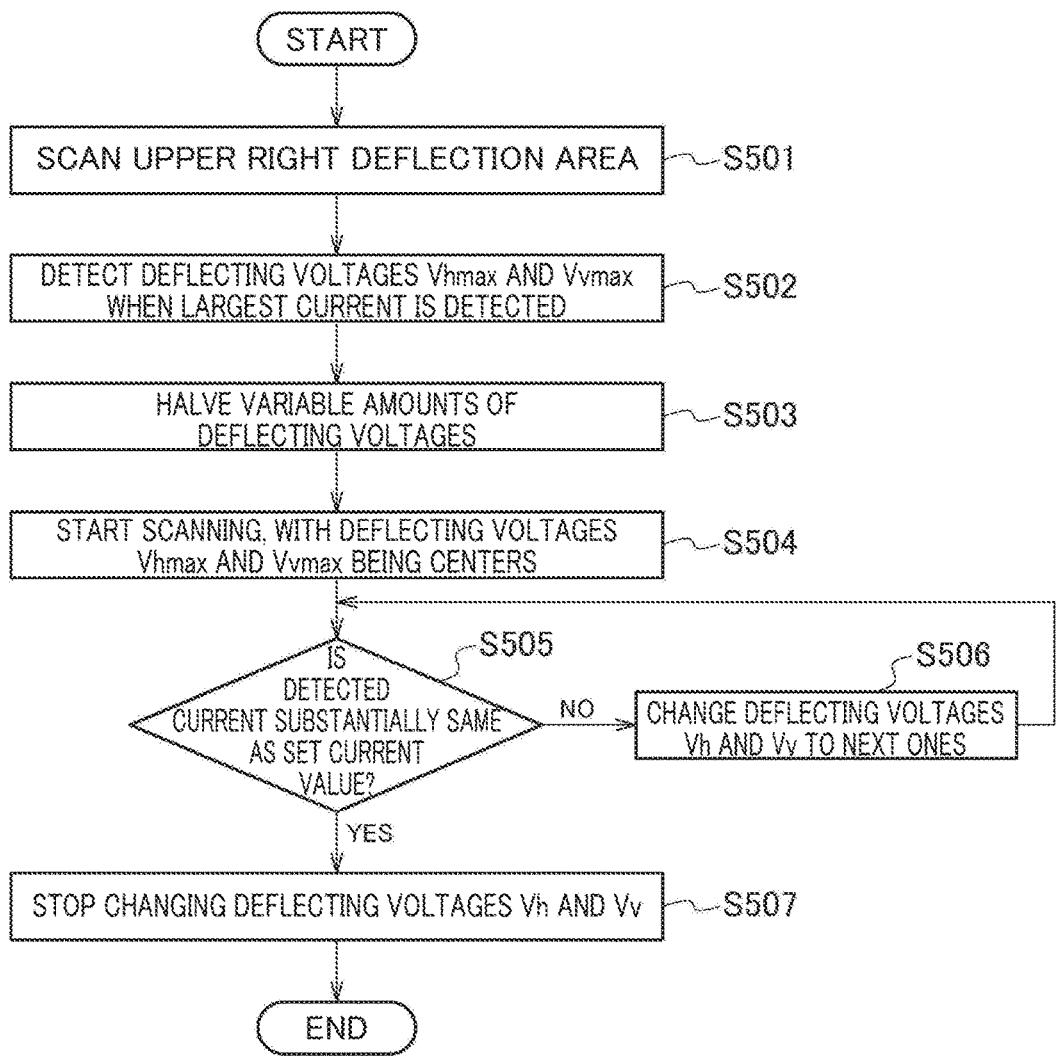
FIG. 5F is a flowchart showing an example of a process of adjusting the position of an electron beam to the center of an upper right region of the plate 52.

FIG. 5A is a diagram schematically showing the configuration of an electron beam position detecting system 500 according to this embodiment;

FIG. 5B is a top view of a measurement unit 127 according to this embodiment;

FIG. 5C is a top view of the measurement unit 127 according to this embodiment, with a plate 52 having been removed;

FIG. 5D is a schematic cross-sectional view taken along the A-A section line defined in FIG. 5B;

FIG. 5E is a diagram showing an example layout of through holes in the plate 52; and FIG. 5F is a flowchart showing an example of a process of adjusting the position of an electron beam to the center of an upper right region of the plate 52.

Mode for Carrying Out this Embodiment

In this embodiment, a special plate 52 is used for detecting the position of an electron beam. With this plate 52, the electron beam irradiation position is automatically adjusted prior to introduction of a sample.

FIG. 5A is a diagram schematically showing the configuration of an electron beam position detecting system 500 according to this embodiment. The electron beam position detecting system 500 detects the position of an electron beam. As shown in FIG. 5A, the electron beam position detecting system 500 includes the plate 52, a collector 54 placed below the plate 52, an ammeter 55 connected to the collector 54, and a controller 13. In the plate 52, through holes are formed to pass an electron beam EB emitted from an electron beam generator 112. The ammeter 55 is connected to a total controller 131 in the controller 13. In accordance with a control command from the total controller 131, an electron beam controller 132 controls the voltage to be applied to electrodes 5115 provided in a deflector 151.

FIG. 5B is a top view of a measurement unit 127 according to this embodiment. As shown in FIG. 5B, the measurement unit 127 includes a housing 51 and the plate 52 provided on the housing 51. As shown in FIG. 5B, through holes are formed in the plate 52.

FIG. 5C is a top view of the measurement unit 127 according to this embodiment, with the plate 52 having been removed. As shown in FIG. 5C, the measurement unit 127 further includes a grid-like metallic member (also called a mesh) 53 and the collector 54 that collects electrons.

FIG. 5D is a schematic cross-sectional view taken along the A-A section line defined in FIG. 5B. As shown in FIG. 5D, the metallic member 53 is provided between the plate 52 and the collector 54, and is secured in the housing 51. The metallic member 53 is also connected to the negative pole of a power source 56, and a negative voltage is applied to the metallic member 53. As a result, the metallic member 53 is negatively charged, and secondary electrons emitted onto and returned by the collector 54 as indicated by an arrow 5A1 are further reflected by the metallic member 53 as indicated by an arrow 5A2. Therefore, these secondary electrons are also captured by the collector 54. In this manner, secondary electrons can be prevented from scattering to the outside of the housing 51.

The collector 54 captures the electrons having passed through the through holes among the electrons in the electron beam generated by the electron beam generator 112. Here, the collector 54 according to this embodiment is a Faraday cup.

The ammeter 55 detects the current caused by the electrons captured by the collector 54. A current value signal indicating the current value measured by the ammeter 55 is transmitted to the controller 13.

FIG. 5E is a diagram showing an example layout of through holes in the plate 52. As shown in FIG. 5E, four through holes having different diameters are formed as an example of through holes in this embodiment. The through holes are arranged so as not to interfere with one another in this embodiment.

As shown in FIG. 5E, regions are set in the plate 52. For example, 25 regions 5R1 through 5R25 (surrounded by dashed lines) are set beforehand in the plate 52, and each of the regions 5R1 through 5R25 set in advance has a unique spatial distribution of through holes (such as a unique spatial layout of through holes, unique shapes of through holes, or a unique combination of through hole shapes). The diameter of a first through hole is approximately ⅔ of the beam diameter of the electron beam, for example. Since each of the regions set beforehand in the plate 52 has a unique spatial distribution of through holes, each of the regions also has a unique spatial distribution of current. Taking advantage of this fact, the controller 13 detects the position of the electron beam in the horizontal direction from the distribution of positions of the current measured by the ammeter 55 when each of the regions of the plate 52 is scanned with the electron beam. As a result, each of the regions has a unique spatial distribution of positions (spots) where the current has been measured. Thus, it is possible to determine which region the electron beam is passing through.

As an example of through holes, first through holes (three first through holes 5M51, 5M52, and 5M53, for example) that are smaller than the electron beam diameter are formed. In the plate 52, each of the regions has a unique spatial layout of the first through holes. The diameter of a first through hole is approximately ⅔ of the beam diameter of the electron beam, for example. Since each of the regions set beforehand in the plate 52 has a unique spatial layout of the first through holes, each of the regions also has a unique spatial distribution of current. The position of the entire irradiation range of the electron beam does not shift. Taking advantage of this fact, the controller 13 detects the position of the electron beam in a plane almost perpendicular to the traveling direction of the electron beam, from the distribution of positions of the current measured by the ammeter 55 when each of the regions of the plate 52 is scanned with the electron beam. As a result, the positions (spots) where the current has been measured have smaller diameters than the electron beam diameter, and each of the regions has a unique spatial distribution of these spots. Thus, it is possible to determine which region the electron beam is passing through.

In the plate 52, second through holes 5L1 through 5L25 each having substantially the same diameter as the electron beam diameter are formed in the respective regions. If the position of the electron beam in a plane almost perpendicular to the traveling direction of the electron beam is adjusted to the position of a second through hole, the current to be measured is maximized. Taking advantage of this fact, the controller 13 controls the deflector 151 in accordance with the measured current so that position of the electron beam in a plane almost perpendicular to the traveling direction of the electron beam is adjusted to a second through hole. In this manner, the position of the electron beam in the horizontal direction can be adjusted to the position of a second through hole. Here, the second through holes 5L1 through 5L25 are located almost at the centers of the corresponding regions. In this manner, the position of the electron beam in the horizontal direction can be adjusted to the position of the center of the corresponding region. To enable the controller 13 to adjust the position of the electron beam in the horizontal direction to the center of each region, the diameters of the second through boles 5L1 through 5L25 are preferably at least 1.5 times larger than the diameter of the first through holes (such as the first through holes 5M51, 5M52, and 5M53) surrounding the respective second through holes. The specific processing will be described later in conjunction with the flowchart in FIG. 5F.

In the plate 52, a third through hole 5LL having a larger diameter than the electron beam diameter is further formed. When the electron beam is passing through almost the center of the third through hole 5LL, the entire electron beam passes through the third through hole 5LL and reaches the collector 54. Thus, the ammeter 55 can measure the current amount provided at once by the electron beam. The third through hole 5LL is located almost at the center (in the region 5R13) of the plate 52. With this arrangement, the current amount provided at once by the electron beam can be measured without fail.

In the plate 52, nine fourth through holes (such as a fourth through hole 5S5) each having a smaller diameter than the electron beam diameter are further formed. These fourth through holes are designed for measuring the beam profile of the electron beam. When the electron beam moves across the fourth through holes 5S1 through 5S25, the spatial distribution of the electron density of the electron beam can be measured from the number of electrons captured by the collector 54, which is equivalent to the current value measured by the ammeter 55. In this embodiment, the diameters of the fourth through holes (such as the fourth through hole 5S5) are smaller than the diameters of the first through holes (such as the first through holes 5M51, 5M52, and 5M53), for example.

Referring now to FIG. 5F, a process of adjusting the position of the electron beam in the horizontal direction to the center of the corresponding region is described. FIG. 5F is a flowchart showing an example of a process of adjusting the position of an electron beam to the center of the upper right region of the plate 52. In the process shown in this flowchart, the position of the electron beam is adjusted to the position of the second through hole 5L5, as the diameter of the second through hole 5L5 formed in the upper right region 5R5 of the plate 52 is substantially the same as the diameter of the electron beam. Here, the voltages to be applied to the electrodes H and V, respectively, in the deflector 115 are represented by Vh and Vv (these voltages will be hereinafter referred to as deflecting voltages). The deflecting voltage Vh is the voltage for scanning in the horizontal direction, and the deflecting voltage Vv is the voltage for scanning in the vertical direction.

(Step S501) The deflecting voltages Vh and Vv for the electron beam that can scan the upper right region 5R5 of the plate 52 are calculated and set beforehand from the position and the electron energy. For example, the deflecting voltages Vh and Vv are 1 to 3V, and the variable amount is 2V.

First, the controller 13 controls the deflector 115 so that the upper right deflection area corresponding to the upper right region 5R5 of the plate 52 is scanned in the horizontal direction at predetermined first horizontal intervals during each predetermined first vertical interval.

(Step S502) The controller 13 next detects the deflecting voltages when the current detected by the ammeter 55 is the largest. Here, these deflecting voltages are detected as deflecting voltages Vhmax and Vvmax. At the time of the deflecting voltages Vhmax and Vvmax, the electron beam passes through almost the center of the upper right region 5R5 of the plate 52. The controller 13 then stores the deflecting voltages Vhmax and Vvmax at the time of the largest detected current into a memory (not shown). Here, the deflecting voltages Vh and Vv at the time of the largest detected current are 2.1 V and 2.2 V, respectively. With this, the center of the upper right region 5R5 of the plate 52 can be detected with low position accuracy.

(Step S503) The controller 13 next halves the variable amount of the deflecting voltage Vh and the variable amount of the deflecting voltage Vv, for example. Where the variable amount is set at 1 V, which is a half of 2 V, for example, the deflecting voltage Vh has a value between 1.6 V and 2.6 V, with the variable amount being 1 V with respect to 2.1 V. The deflecting voltage Vv has a value between 1.7 V and 2.7 V, with the variable amount being 1 V with respect to 2.2 V.

(Step S504) The controller 13 next controls the deflector 115 so that scanning is started under the condition that the variable amount of the deflecting voltage Vh and the variable amount of the deflecting voltage Vv with respect to the deflecting voltages Vhmax and Vvmax are half the respective variable amounts in step S501. Here, scanning may be performed at second horizontal intervals that are shorter than the first horizontal intervals, during each second vertical interval that is shorter than the first vertical intervals. With this, the center of the upper right region 5R5 of the plate 52 can be detected with higher position accuracy that than in step S502.

(Step S505) Every time the deflecting voltages Vh and Vv are changed, the controller 13 determines whether the current detected by the ammeter 55 is substantially the same as a predetermined set current value. Here, a detected current that is substantially the same as the set current value falls within a predetermined range based on the set current value. The set current value is the amount of charge per unit time in the electron beam generated by the electron beam generator 112.

(Step S506) If the detected current is not substantially the same as the predetermined set current value in step S505, the controller 13 changes the deflecting voltages Vh and Vv to the next deflecting voltages Vh and Vv, and the process returns to step S505.

(Step S507) If the detected current is substantially the same as the predetermined set current value in step S505, on the other hand, the electron beam is supposedly passing through the second through hole 5L5 in the upper right region 5R5 of the plate 52. Therefore, the controller 13 stops changing the deflecting voltages Vh and Vv. Since the second through hole 5L5 is located at the center of the upper right region 5R5 of the plate 52, the electron beam is passing through the center of the upper right region 5R5 of the plate 52 at this point. In this manner, the deflecting voltages Vhmax and Vvmax almost at the center of the upper right region 5R5 of the plate 52 are detected in the first scanning, and the position of the electron beam can be adjusted to the center of the upper right region 5R5 of the plate 52 in the next scanning. The process shown in the flowchart then comes to an end.

As described above, the electron beam irradiation apparatus according to this embodiment includes: the deflector 115 that deflects an electron beam; the controller 13 that controls the deflector 115 so that scanning with the electron beam is performed; the plate 52 in which each predetermined region has a unique spatial layout of through holes; the collector 54 that captures electrons having passed through the through holes among the electrons in the electron beam generated by the electron beam generator 112; and the ammeter 55 that measures the current caused by the electrons captured by the collector 54. Using the distribution of positions of the current measured by the ammeter 55 when each of the regions of the plate 52 is scanned with an electron beam, the controller 13 detects the position of the electron beam in a plane almost perpendicular to the traveling direction of the electron beam.

In this structure, each of the regions has a unique spatial distribution of positions (spots) where the current has been measured. Thus, it is possible to determine which region an electron beam is passing through. As the plate 52, the collector 54, and the ammeter 55 are used to detect the position of an electron beam, the costs for beam position detection can be lowered. Further, no dust is generated in the electron beam irradiation apparatus, and thus, contamination can be reduced. Since the plate 52 is not easily broken, beam position detection can be stably performed over a lone period of time.

Although the first through holes according to this embodiment each have an almost round shape, the first through holes do not necessarily have a round shape. The shapes of the first through holes may vary among regions. For example, the first through holes may have the shapes of different numbers among the regions. The through holes may have a round shape, a rectangular shape, a triangular shape, or some other polygonal shape.

A program for performing each process of the controller according to this embodiment and its modification may be recorded in a computer-readable recording medium. The program recorded in the recording medium may be installed into a computer, and be executed by a processor. In this manner, the above described processes to be performed by the controller according to this embodiment and its modification may be performed.

Although the metallic member 53 is a grid-like member in this embodiment, the metallic member 53 does not necessarily have a grid-like structure. Instead, regular hexagonal openings may be formed in a honeycomb fashion in the metallic member 53. The metallic member 53 should at least have openings formed therein.

This electron beam generator can be used not only in an electron beam irradiation apparatus but also in an exposure device or an inspection device.

REFERENCE SIGNS LIST

3 Controller
51 Housing
52 Plate
53 Metallic member
54 Collector
55 Ammeter
56 Power source
127 Measurement unit
131 Total controller
132 Electron beam controller
151 Deflector
500 Electron beam position detecting system
5115 Electrode Fifth Embodiment Technical Field This embodiment relates to an electron beam irradiation apparatus.

Related Art

The applicant has already suggested an electron beam irradiation apparatus that emits an electron beam onto a sample and performs a surface treatment. In this electron beam irradiation apparatus, a lift mechanism that lifts up and down a stage is provided, and an applicator pin is provided above a sample on the stage. As the stage is lifted up by the lift mechanism, and the applicator pin is brought into contact with the surface of the sample on the stage, the potential of the surface of the sample is connected to a ground potential, and thus, is stabilized.

In such an electron beam irradiation apparatus, however, dust generation and outgassing are caused, and the dust and the gas from the lift mechanism are released in the vacuum chamber. As a result, the atmosphere in the vacuum chamber is contaminated.

Problem to be Solved by this Embodiment

This embodiment is to provide an electron beam irradiation apparatus that can prevent contamination of the atmosphere in the vacuum chamber due to dust generation and outgassing caused by the lift mechanism when an applicator pin is pressed against the surface of a sample on a sample stage to achieve conduction between the sample and the applicator pin.

Solution to Problem

<Aspect 1>

An electron beam irradiation apparatus comprising:
a sample stage that holds a sample in a vacuum chamber;
an electron source that generates an electron beam for irradiating the sample on the sample stage; and
a potential controller that controls a potential of the sample on the sample stage, wherein the potential controller comprising:

an applicator pin above the sample on the sample stage; and an applicator pin lift mechanism that presses the applicator pin against a surface of the sample on the sample stage by moving the applicator pin up and down, the applicator bin lift mechanism disposed outside a vacuum chamber.

<Aspect 2>

The electron beam irradiation apparatus according to aspect 1, the applicator pin comprises a spring pin.

<Aspect 3>

The electron beam irradiation apparatus according to aspect 1 or 2, wherein the applicator pin is attached to an upper end of a support member extending vertically, a lower end of the supporting member penetrates through a bottom of the vacuum chamber and protrudes outside the vacuum chamber, a portion between the lower end of the supporting member and the bottom of the vacuum chamber is tightly covered with the bellows that can be expanded and contracted, and the applicator pin lift mechanism is connected to the lower end of the supporting member.

<Aspect 4>

The electron beam irradiation apparatus according to aspect 3, wherein the support member has a tubular structure, and a conductor line electrically connected to the applicator pin extends inside the supporting member, and is pulled out via a feedthrough provided at the lower end of the supporting member <Aspect 5>

The electron beam irradiation apparatus according to aspect one of 1 to 4, wherein the applicator pin is grounded.

<Aspect 6>

The electron beam irradiation apparatus according to aspect one of 1 to 5, wherein the applicator pin comprises a pair of pin members, and the potential controller further comprises a detector that detects conduction between one of the pin members and another one of the pin members by applying a voltage to one of the pin members.

<Aspect 7>

The electron beam irradiation apparatus according to aspect 6, wherein when the conduction is not detected by the detector, the potential controller retries to apply a voltage to one of the pin members.

<Aspect 8>

The electron beam irradiation apparatus according to aspect 6, wherein when the conduction is not detected by the detector, the potential controller retries to press the applicator pin against the surface of the sample performed by the applicator pin lift mechanism.

Effect of this Embodiment

In an electron beam irradiation apparatus, it is possible to prevent contamination of the atmosphere in the vacuum chamber due to dust generation and outgassing caused by a movement mechanism when an applicator pin is pressed against the surface of a sample on a sample stage to achieve conduction between the sample and the applicator pin.

Brief Description of Drawings

Figure 6A:
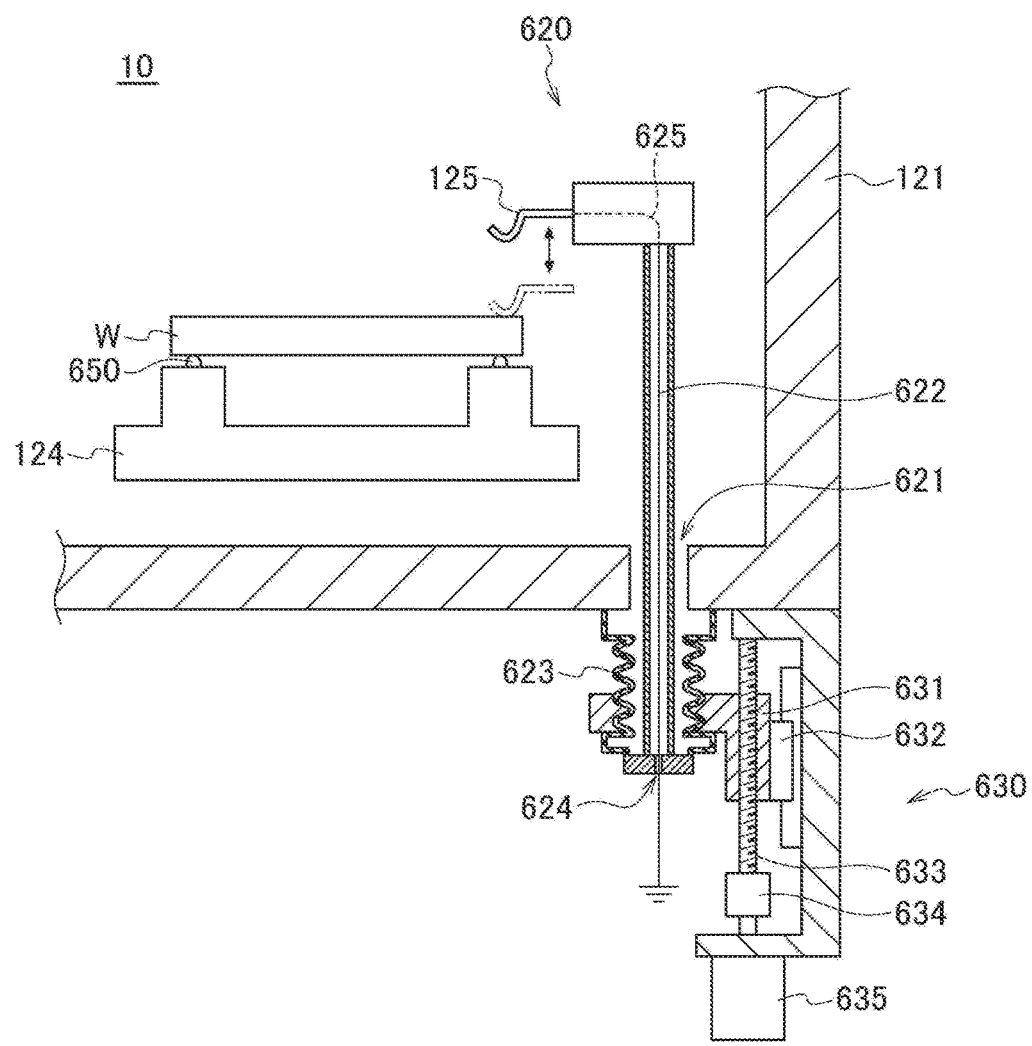
FIG. 6A is a schematic enlarged view of the structure of an applicator pin of an electron beam irradiation apparatus.
Figure 6B:
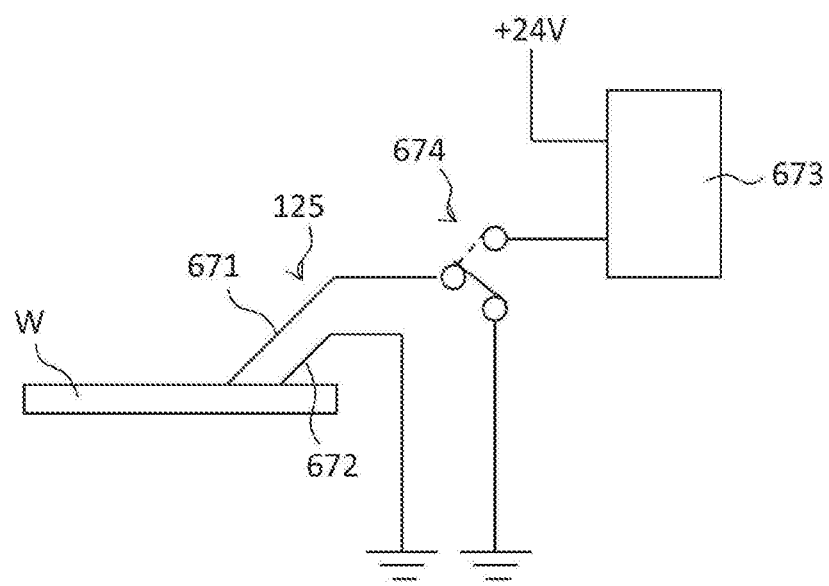
FIG. 6B is a diagram schematically showing the wiring in a potential controller.
Figure 6C:
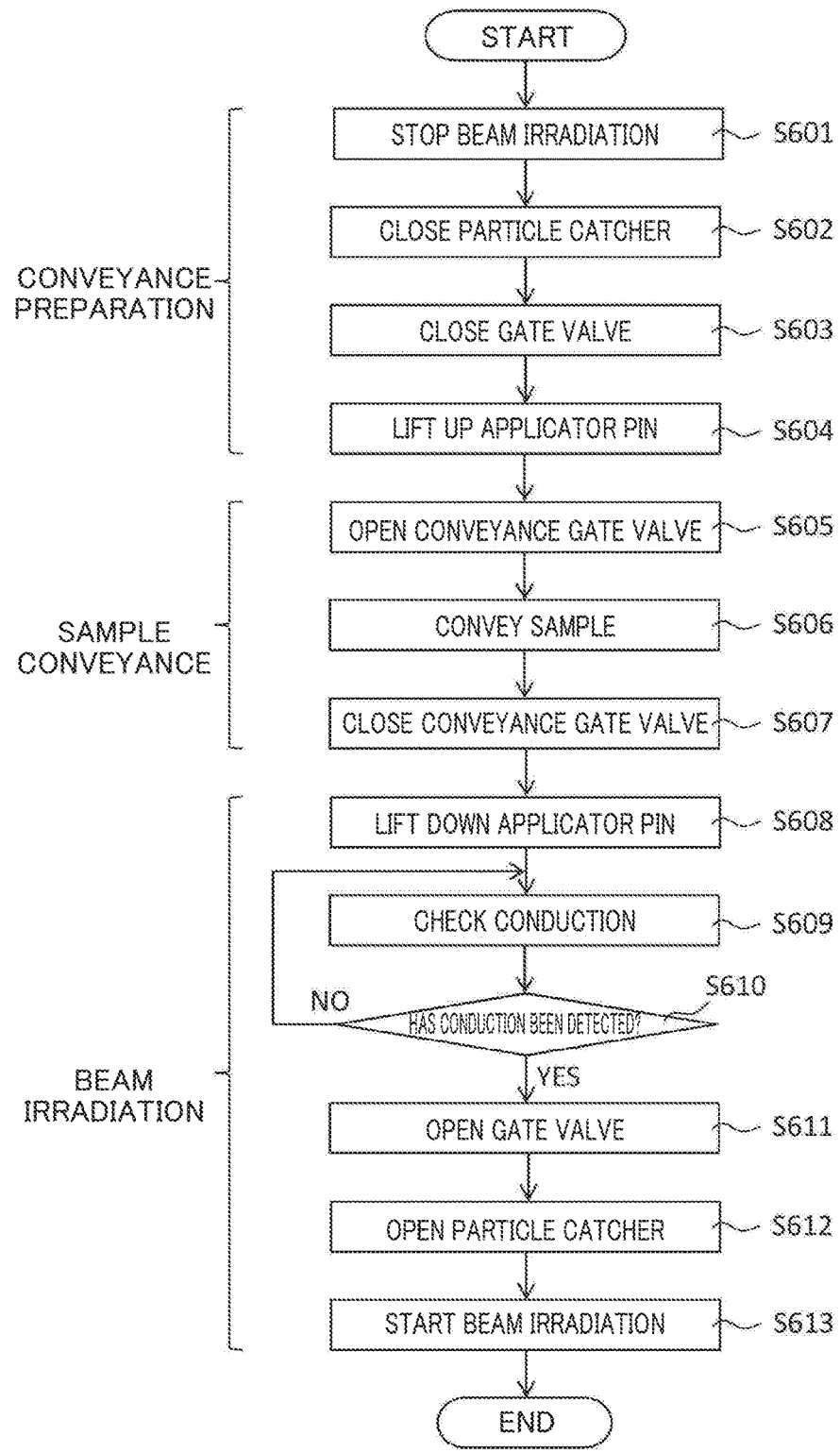
FIG. 6C is a flowchart showing an example operation of the electron beam irradiation apparatus.
Figure 6E:
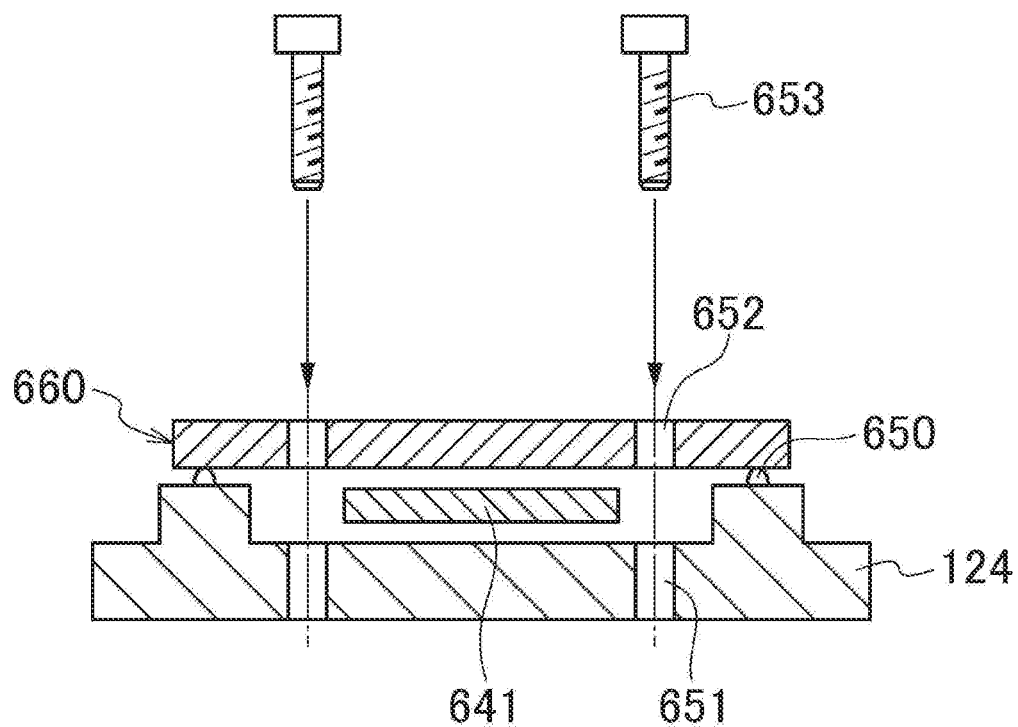
FIG. 6E is a cross-sectional view of the structure taken along the A-A line defined in FIG. 6D.
Figure 6F:
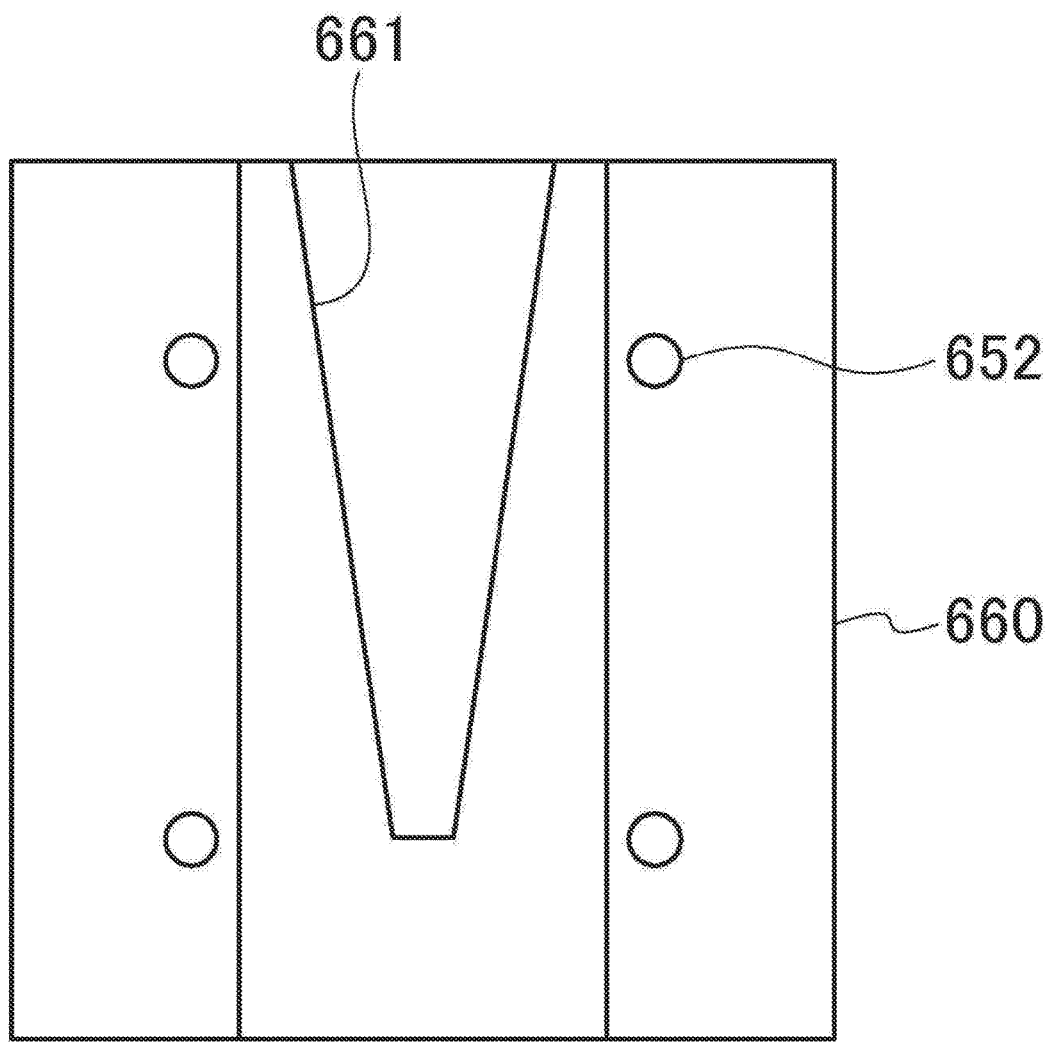
FIG. 6F is a plan view of a teaching plate.

FIG. 6A is a schematic enlarged view of the structure of an applicator pin of an electron beam irradiation apparatus;

FIG. 6B is a diagram schematically showing the wiring in a potential controller;

FIG. 6C is a flowchart showing an example operation of the electron beam irradiation apparatus;

FIG. 6D of a plan view of a structure for robot hand teaching;

FIG. 6E is a cross-sectional view of the structure taken along the A-A line defined in FIG. 6D; and FIG. 6F is a plan view of a teaching plate.

Mode for Carrying Out this Embodiment (Sample Potential Control)

FIG. 6A is a schematic enlarged view of an applicator pin 125 of an electron beam irradiation apparatus 10 according to this embodiment.

As shown in FIG. 6A, the electron beam irradiation apparatus 10 includes: a sample stage 124 that holds a sample W in a vacuum chamber 121; a power source 112 (see FIG. 1A) that generates an electron beam to be emitted onto the sample W on the sample stage 124; and a potential controller 620 that controls the potential of the sample W on the sample stage 124.

As described above, in the electron beam irradiation apparatus 10, the irradiation energy is determined in accordance with the difference between the potential of the power source (electron beam generator) 112 (−0.2 to −5 kV, for example) and the potential of the sample W. Therefore, if the potential of the sample W is floating, the irradiation energy becomes unstable. To counter this, the potential controller 620 is used to control the potential of the sample W (by connecting the sample W to a ground potential, for example).

As shown in FIG. 6A, the potential controller 620 has: the applicator pin 125 placed above the sample W on the sample stage 124; and an applicator pin lift mechanism 630 that is disposed outside the vacuum chamber 121, and can move the applicator pin 125 up and down and press the applicator pin 125 against the surface of the sample W on the sample stage 124.

The applicator pin 125 preferably has a spring pin. In a case where an insulating film is formed on the surface of the sample W, when the applicator pin lift mechanism 630 presses the spring pin against the surface of the sample W, the spring pin is rubbed against the surface of the sample W, so that part of the insulating film is scraped off with the spring pin. As a result, the spring pin penetrates through the insulating film on the surface of the sample W, and can reach the conductive part of the sample W without fail.

In the example shown in the drawing, the applicator pin 125 is attached to the upper end of a supporting member 622 that extends vertically. The lower end of the supporting member 622 penetrates through the bottom of the vacuum chamber 121 and protrudes outside the vacuum chamber 121.

In an area surrounding the lower end of the supporting member 622, a bellows 623 that can be expanded and contracted is provided coaxially with the supporting member 622, and the portion between the lower end of the supporting member 622 and the bottom of the vacuum chamber 121 is tightly covered with the bellows 623 that can be expanded and contracted.

Outside the vacuum chamber 121, the applicator pin lift mechanism 630 is connected to the lower end of the supporting member 622.

More specifically, as shown in FIG. 6A, the applicator pin lift mechanism 630 has: a ball screw 633; a motor 635 connected to the ball screw 633 via a coupling 634; an attachment member 631 that can move up and down along the ball screw 633; and a linear guide 632 that guides the attachment member 631. The attachment member 631 is attached to the lower end of the supporting member 622.

As the ball screw 633 is rotated by power generated by the motor 635, the attachment member 631, together with the supporting member 622 and the applicator pin 125, is moved up and down along the ball screw 633.

When the applicator pin lift mechanism 630 is operated, dust, generation and outgassing are caused the applicator pin lift mechanism 630. However, as the portion between the lower end of the supporting member 622 and the bottom of the vacuum chamber 121 is tightly covered with the bellows 623 that can be expanded and contracted, the dust and the gas generated from the applicator pin lift mechanism 630 are blocked by the bellows 623, and do not enter the vacuum chamber 121 through a through hole 621 formed in the bottom of the vacuum chamber 121.

In the example shown in the drawing, the applicator pin 125 is connected to the ground potential. More specifically, the supporting member 622 has a tubular structure. A conductor line 625 electrically connected to the applicator pin 125 extends inside the tube of the supporting member 622, is pulled out via a feedthrough 624 provided at the lower end of the supporting member 622, and is connected to the ground potential.

FIG. 6B is a diagram schematically showing the wiring in the potential controller 620.

As shown in FIG. 6I, the applicator pin 125 has a pair of pin members 671 and 672.

The potential controller 620 further has a detector 673 that detects conduction between the pin member 671 and the other pin member 672 by applying a voltage (a positive voltage, for example) to the pin member 671 and a different voltage to the other pin member 672.

A relay 674 is provided between the pin member 671 and the detector 673. As the relay 674 is switched, the pin member 671 is connected to the ground potential (0 V) or an output voltage (a positive voltage) of the detector 673.

As the detector 673 detects conduction between the pin member 671 and the other pin member 672, a check can be easily made to determine whether conduction is established between the sample W and the applicator pin 125 when the applicator pin 125 is pressed against the surface of the sample W on the sample stage 124.

In a case where conduction between the sample W and the applicator pin 125 has not been detected by the detector 673, the potential controller 620 operates the relay 674 so that the detector 673 again applies a voltage to the pin member 671. According to the results of tests conducted by the inventors, even in a case where conduction between the sample W and the applicator pin 125 has not been detected by the detector 673, there is a possibility that conduction between the sample W and the applicator pin 125 can be detected when the detector 673 again applies a voltage to the pin member 671.

In a modification, if conduction between the sample W and the applicator pin 125 has not been detected by the detector 673, the potential controller 620 may perform control so that the applicator pin lift mechanism 630 again presses the applicator pin 125 against the surface of the sample W. In such an aspect, there is also a possibility that conduction between the sample W and the applicator pin 125 can be detected.

Referring now to FIG. 6C, an example operation of the electron beam irradiation apparatus 10 is described. FIG. 6C is a flowchart showing the steps in the process of conveying the next sample W after irradiation of a sample W with an electron beam is completed, and irradiating the next sample W with an electron beam.

In the example shown in FIG. 6C, preparation is first made to convey a sample W. Specifically, irradiation of a surface-treated sample W with an electron beam is stopped (step S601), and the particle catcher 11B (see FIG. 1A) is inserted into the vacuum tube 111 (step S602). With this, particles are prevented from falling onto the sample W from the gate valve to be operated later. The gate valve 11A is then closed (step S603). As a result, the inside of the vacuum tube 111 (particularly the portion in the vicinity of the electron beam generator 112) and the inside of the main chamber 121 are separated from each other. The applicator pin lift mechanism 630 then lifts up the applicator pin 125, so that the applicator pin 125 is separated from the surface of the sample W (step S604).

Conveyance of the sample W is then performed. Specifically, the conveyance gate valve 122 is opened (step S605). The surface-treated sample W is then pulled out from the main chamber 121, and the next sample W is taken into the main chamber 121 (step S606). The conveyance gate valve 122 is then closed (step S607).

The next sample W is then irradiated with an electron beam. Specifically, the applicator pi lift mechanism 630 lifts the applicator pin 125 down, so that the applicator pin 125 is brought into contact with the surface of the sample W (step S608).

In this embodiment, the applicator pin lift mechanism 630 is located outside the vacuum chamber 121. Thus, the atmosphere in the vacuum chamber 121 is prevented from being contaminated by the dust and the gas generated from the applicator pin lift mechanism 630.

The detector 673 then applies a voltage (a positive voltage, for example) to the pin member 671, so that conduction between the pin member 671 and the other pin member 672 is detected (step S609). The potential controller 620 then determines whether conduction has been detected by the detector 673 (step S610).

If the potential controller 620 determines that conduction has not been detected by the detector 673 (NO in step S610), the relay 674 is switched, and a voltage is again applied to the pin member 671 from the detector 673. Steps S609 and S610 are then carried out again.

If the potential controller 620 determines that conduction has been detected by the detector 673 (YES in step S610), connection of the surface potential of the sample W to the ground potential is guaranteed. When evacuation of air from the main chamber 121 is completed, the gate valve 11A is opened (step S611), the particle catcher 11B is pulled out from the vacuum tube 111 (step S612). The sample W is then irradiated with an electron beam (step S613).

According to this embodiment, the applicator pin lift mechanism 630 for achieving conduction by pressing the applicator pin 125 against the surface of the sample W on the sample stage 124 is located outside the vacuum chamber 121, as described above. Thus, the atmosphere in the vacuum chamber 121 is prevented from being contaminated by the dust and the gas generated from the applicator pin lift mechanism 630.

Also, according to this embodiment, when the applicator pin 125 is pressed against the surface of the sample W on the sample stage 124, the applicator pin 125 is moved up and down by the applicator pin lift mechanism 630, but the sample stage 124 holding the sample W is not moved up and down. Thus, the sample stage 124 can stably hold the sample W, which is to be irradiated with an electron beam, in a predetermined position.

Also, according to this embodiment, the applicator pin 125 has a spring pin. Therefore, in a case where an insulating film is formed on the surface of the sample W, part of the insulating film on the surface of the sample W is scraped off with the spring pin when the spring pin is pressed against the surface of the sample W by the applicator pin lift mechanism 630. As a result, the spring pin penetrates through the insulating film on the surface of the sample W, and can reach the conductive part of the sample W without fail.

Further, according to this embodiment, the detector 673 applies a voltage to the pin member 671 of the applicator pin 125, to detect conduction between the pin member 671 and the other pin member 672. Thus, a check can be easily made to determine whether conduction is achieved between the sample W and the applicator pin 125 when the applicator pin 125 is pressed against the surface of the sample W on the sample stage 124.

(Installation of a Measurement Unit)

Referring back to FIG. 1A, the measurement unit 127 that measures an electron beam is immovably installed in the vacuum chamber 121 in this embodiment.

If the measurement unit 127 is designed to be movable in the vacuum chamber 121, the cable electrically connected to the measurement unit 127 is moved and bent when the measurement unit 127 is moved. Therefore, the bent cable might be brought into contact with a component existing nearby and be rubbed against the component. As a result, dust might be generated.

In this embodiment, on the other hand, the measurement unit 127 that measures an electron beam is immovably installed in the vacuum chamber 121. Thus, dust generation to be caused by movement of the measurement unit 127 can be prevented.

(Robot Hand Teaching Method)

Referring now to FIGS. 6D through 6F, a method of teaching a robot hand 641 that carries a sample W is described. FIG. 6D is a plan view of a structure for teaching the robot hand 641. FIG. 6E is a cross-sectional view taken along the A-A line defined in FIG. 6D. FIG. 6F is a plan view of a teaching plate 660.

As shown in FIGS. 6D and 6E, the electron beam irradiation apparatus 10 according to this embodiment further includes the teaching plate 660. A transparent resin is used as the material of the teaching plate 660, for example.

As shown in FIG. 6F, a scratch line 661 in the same shape as the robot hand 641 is formed in the surface of the teaching plate 660. In the teaching plate 660, positioning holes 652 (four positioning holes 652 in the example shown in the drawing) are also formed to surround the scratch line 661.

In the sample stage 124, on the other hand, positioning holes 651 (four positioning holes 651 in the example shown in the drawing) corresponding to the positioning holes 652 of the teaching plate 660 are formed. The positioning holes 651 are located in the region surrounded by sample supporting pins 650 that support a sample W.

When teaching is performed on the robot hand 641 in the electron beam irradiation apparatus 10 having the above structure, the teaching plate 660, instead of a sample W, is first placed on the sample stage 124. The teaching plate 660 is held by the top edges of the sample supporting pins 650 protruding from the sample stage 124.

As shown in FIG. 6E, positioning pins 653 are then inserted into both the positioning holes 652 of the teaching plate 660 and the positioning holes 651 of the sample stage 124. With this, the teaching plate 660 is accurately secured in a predetermined position with respect to the sample stage 124.

The robot hand 641 is then extended from a conveyance chamber 640 into the main chamber 121 through the conveyance gate valve 122. The robot hand 641 is inserted into the space between the sample stage 124 and the teaching plate 660.

The position of the robot hand 641 is then checked from above the teaching plate 660 by the human eye or a detector such as a CCD sensor. Teaching is then performed on the robot hand 641, to adjust the position of the robot hand 641 to the scratch line 661 on the teaching plate 660.

By the above described teaching method, even a less-experienced engineer can easily perform teaching on the robot hand 641.

The above described teaching may be performed in an atmosphere at atmospheric pressure or in a vacuum atmosphere. In a vacuum atmosphere, the teaching is performed in the same manner as in the case with electron beam irradiation. Teaching in a vacuum atmosphere is preferable, because the influence of distortion of the main chamber 121 can be taken into account.

REFERENCE SIGNS LIST

10 Electron beam irradiation apparatus
121 Vacuum chamber (main chamber)
122 Conveyance gate valve
124 Sample stage (stage)
125 Applicator pin
620 Potential controller
621 Through hole
622 Supporting member
623 Bellows
624 Feedthrough
625 Conductor line
630 Applicator pin lift mechanism
631 Attachment member
632 Linear guide
633 Ball screw
634 Coupling
635 Motor
640 Conveyance chamber
641 Robot hand
650 Sample supporting pin
651 Positioning hole
652 Positioning hole
653 Positioning pin
660 Teaching plate
661 Scratch line
671 Pin member
672 Pin member
673 Detector
674 Relay Sixth Embodiment Technical Field This embodiment relates to a connector that connects pipes having different flange sizes.

Related Art

Figure 7A:
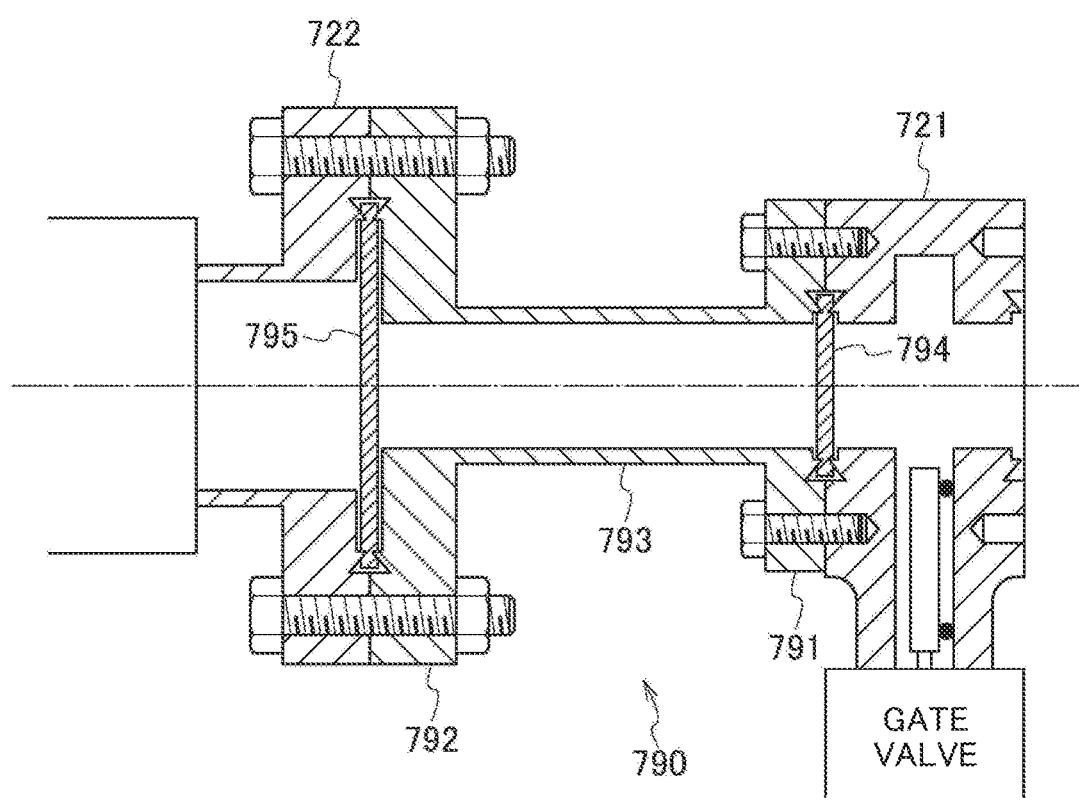
FIG. 7A is a schematic view of an example of a conventional connecting pipe.

FIG. 7A is a schematic view of an example of a conventional connecting pipe 790 that connects pipes having different flange sizes. As shown in FIG. 7A, in a case where an ICF70-compliant flange 721 on the column side of an electron beam irradiation apparatus and an ICF114-compliant flange 722 on the turbo-molecular pump side of the electron beam irradiation apparatus are to be connected, for example, the connecting pipe 790 (also called a nipple for different types) is used. The connecting pipe 790 has an ICF70-compliant first flange portion 791 and an ICF114-compliant second flange portion 792. The first flange portion 791 of the connecting pipe 790 is screwed to the flange 721 on the column side, with a first gasket 794 being interposed in between. The second flange portion 792 is screwed to the flange 722 on the turbo-molecular pump side, with a second gasket 795 being interposed in between.

If the pipe distance can be shortened, space can be saved, and evacuation efficiency can be increased. Also, the withstand load of the connecting part can be increased in a case where the pipe extends horizontally.

In the conventional connecting pipe 790, however, a tubular main body 793 exists between the first flange portion 791 and the second flange portion 792, and the length of the entire connecting pipe 790 is 100 mm, for example. To shorten the pipe distance, the length of the main body 793 needs to be shortened. However, if the main body 793 is made shorter than the screws, the heads of the screws physically interfere with the second flange portion 792 when the first flange portion 791 is to be screwed to the flange 721. As a result, the first flange portion 791 cannot be screwed to the flange 721. Therefore, there is a limit to reductions in the pipe distance in the conventional connecting pipe 790.

Problem to be Solved by this Embodiment

This embodiment is to provide a connector that can shorten the pipe distance when pipes having different flange sizes are connected.

Solution to Problem

<Aspect 1>

A connector that connects pipes one of which has a small-diameter flange and another of which has a large-diameter flange, the connector comprising:

a first flange member disposed on the small-diameter flange in an overlapping manner; and a second flange member disposed between the first flange member and the large-diameter flange in an overlapping manner, wherein the second flange member comprises a protruding part that enters the first flange member, first securing hole is formed in the first flange member coaxially with a securing hole of the small-diameter flange, and second securing hole is formed in each of the first flange member and the second flange member coaxially with a securing hole of the large-diameter flange.

<Aspect 2>

The connector according to aspect 1, wherein a top edge of the protruding part is tapered.

<Aspect 3>

The connector according to aspect 1 or 2, wherein an outer diameter of each of the first flange member and the second flange member is identical to an outer diameter of the lager-diameter flange.

<Aspect 4>

A method of connecting pipes one of which has a small-diameter flange and another of which has a large-diameter flange, using the connector according to aspect one of 1 to 3, the method comprising:

placing the first flange member on the small-diameter flange in an overlapping manner;

inserting a screw collectively into both the first securing hole and the securing hole of the small-diameter flange to screw the first flange member to the small-diameter flange;

inserting a first sealing member into an inside of the first flange member;

placing the second flange member on the first flange member in an overlapping manner to interpose the first sealing member between a protruding part entering the first flange member and the small-diameter flange;

placing the large-diameter flange on the second flange member in an overlapping manner while interposing a second sealing member between the second flange member and the large-diameter flange; and inserting a screw collectively into the second securing hole of the first flange member, the second securing hole of the second flange member, and the securing hole of the large-diameter flange, to collectively screw the first flange member and the second flange member to the large-diameter flange.

<Aspect 5>

The method according to aspect 4, wherein each of the first sealing member and the second sealing member is a gasket or an O-ring.

<Aspect 6>

An electron beam irradiation apparatus comprising.

a column;

a turbo-molecular pump; and the connector according to aspect one of 1 to 3, the connector connecting a flange at a side of the column and a flange at a side of the turbo-molecular pump.

Effect of this Embodiment

The pipe distance can be shortened when pipes having different flange sizes are connected.

Brief Description of Drawings

Figure 7B:
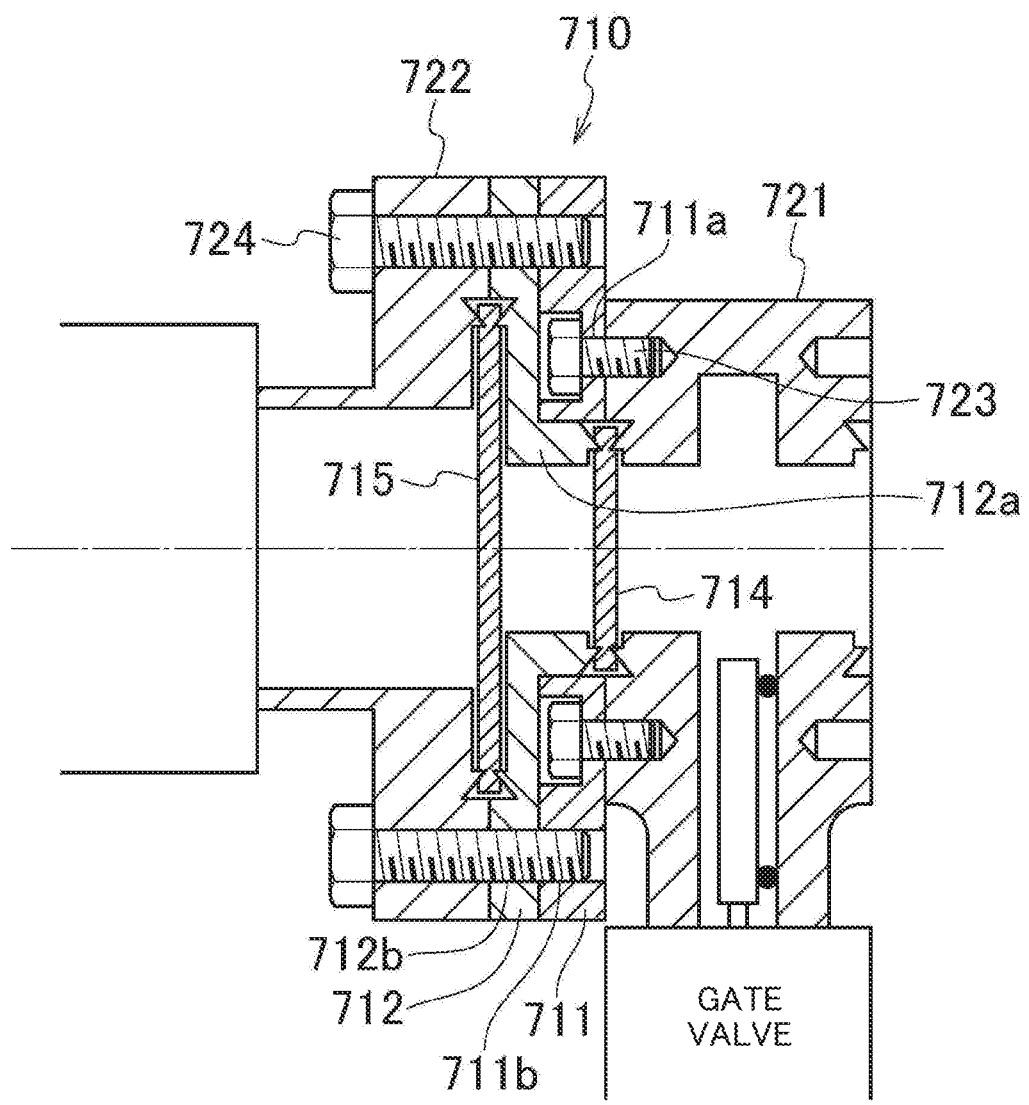
FIG. 7B is a schematic view of an example of a connector according to this embodiment.
Figure 7C:
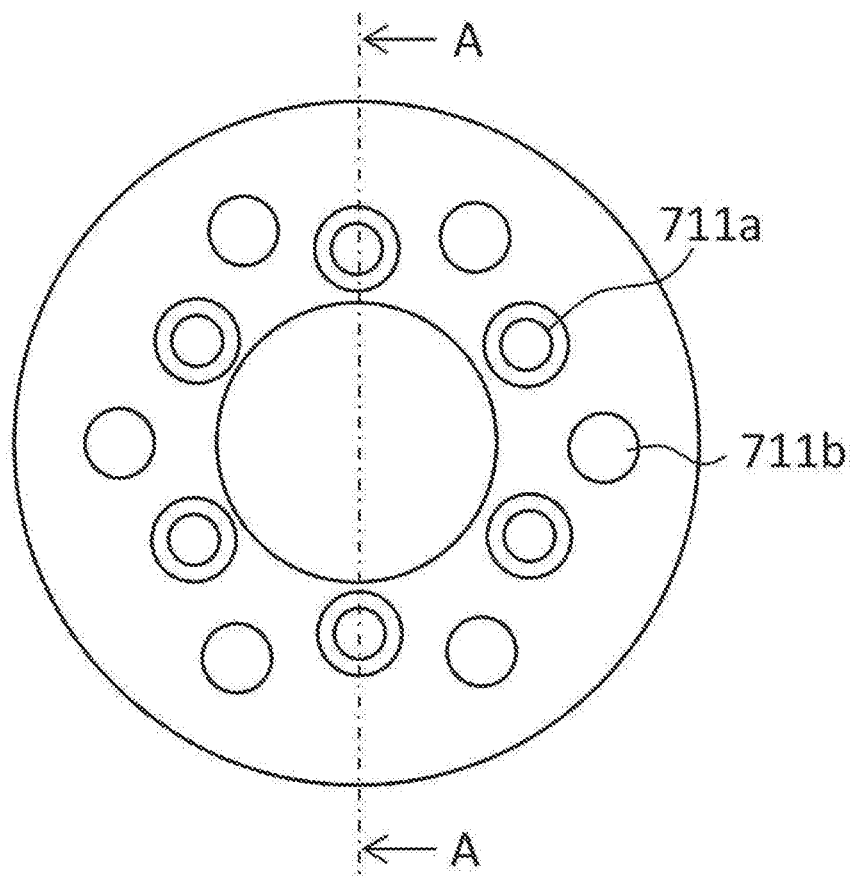
FIG. 7C is a plan view of a first flange member of the connector shown in FIG. 7B.
Figure 7D:
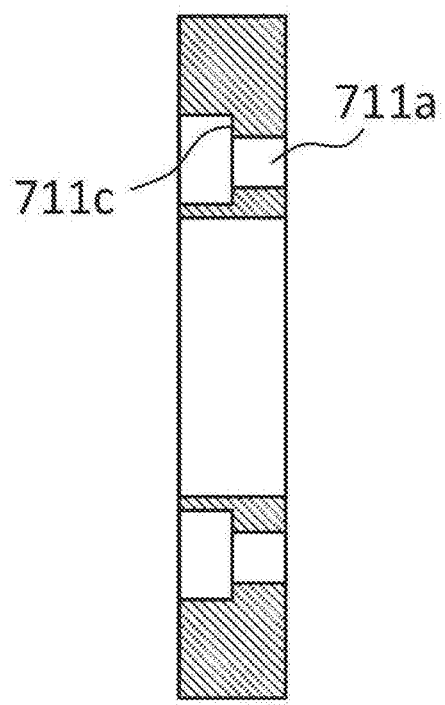
FIG. 7D is a cross-sectional view of the first flange member taken along the A-A line defined in FIG. 7C.
Figure 7E:
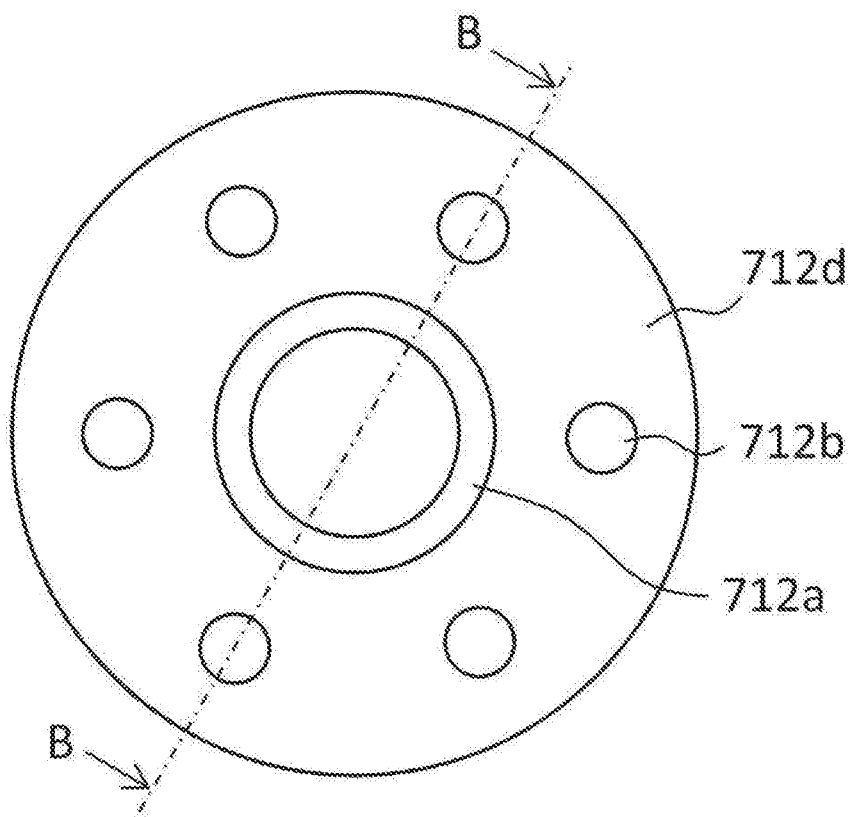
FIG. 7E is a plan view of a second flange member of the connector shown in FIG. 7B.
Figure 7F:
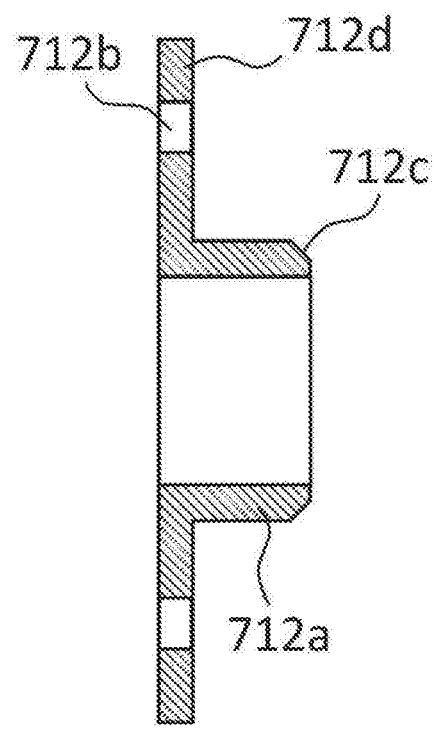
FIG. 7F is a cross-sectional view of the second flange member taken along the B-B line defined in FIG. 7E.
Figure 7G:
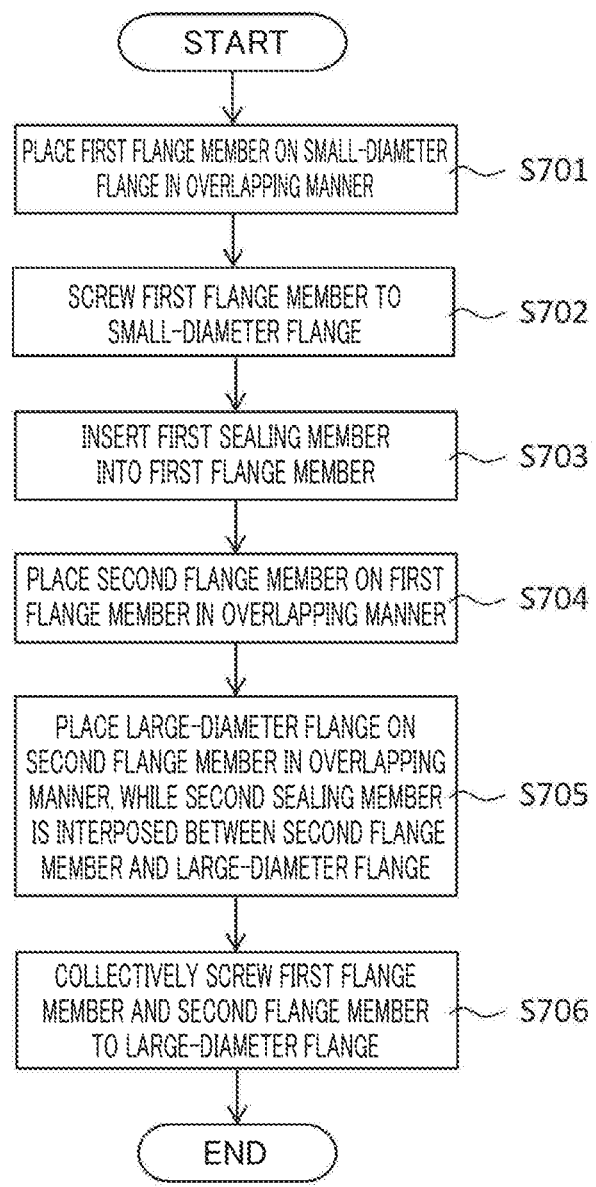
FIG. 7G is a flowchart showing an example of a method of connecting pipes having different flange sizes, using the connector shown in FIG. 7B.

FIG. 7A is a schematic view of an example of a conventional connecting pipe;

FIG. 7B is a schematic view of an example of a connector according to this embodiment;

FIG. 7C is a plan view of a first flange member of the connector shown in FIG. 7B;

FIG. 7D is a cross-sectional view of the first flange member taken along the A-A line defined in FIG. 7C;

FIG. 7E is a plan view of a second flange member of the connector shown in FIG. 7B;

FIG. 7F is a cross-sectional view of the second flange member taken along the B-B line defined in FIG. 7E; and FIG. 7G is a flowchart showing an example of a method of connecting pipes having different flange sizes, using the connector shown in FIG. 7B.

Mode for Carrying Out this Embodiment

FIG. 7B is a schematic view of an example of a connector 710 according to this embodiment. The connector 710 is used for connecting pipes that differ in flange size. Specifically, the connector 710 is used for connecting a small-diameter flange 721 (an ICF70-compliant flange, for example) provided on the side of the column portion 11 (see FIG. 1A) of an electron beam irradiation apparatus 10, and a large-diameter flange 722 (an ICF114-compliant flange, for example) provided on the side of the turbo-molecular pump 118, for example.

As shown in FIG. 7B, the connector 710 includes a first flange member 711 disposed on the small-diameter flange 721 in an overlapping manner, and a second flange member 712 disposed between the first flange member 711 and the large-diameter flange 722 in an overlapping manner.

FIG. 7C is a plan view of the first flange member 711. FIG. 7D is a cross-sectional view of the first flange member 711, taken along the A-A line defined in FIG. 7C.

As shown in FIGS. 7C and 7D, the first flange member 711 is in the form of a ring-like disk. The inner diameter of the first flange member 711 is larger than the inner diameter of the small-diameter flange 721. When the first flange member 711 is placed on the small-diameter flange 721 in an overlapping manner, part (an inner-diameter part) of the small-diameter flange 721 is exposed. Meanwhile, the outer diameter of the first flange member 711 is equal to the outer diameter of the large-diameter flange 722.

As shown in FIG. 7C, in the first flange member 711, first securing holes 711a (six first securing holes 711a in the example shown in the drawing) corresponding to the securing holes of the small-diameter flange 721 are formed coaxially with the securing holes of the small-diameter flange 721. As shown in FIG. 7D, a countersink 711c for housing the head of a screw is formed at one end of each of the first securing holes 711a.

As shown in FIG. 7C, in the first flange member 711, second securing holes 711b (six second securing holes 711b in the example shown in the drawing) corresponding to the securing holes of the large-diameter flange 722 are also formed coaxially with the securing holes of the large-diameter flange 722.

FIG. 7E is a plan view of the second flange member 712. FIG. 7F is a cross-sectional view of the second flange member 712, taken along the B-B line defined in FIG. 7E.

As shown in FIGS. 7E and 7F, the second flange member 712 has a main body 712d in the form of a ring-like disk, and a protruding part 712a that enters the first flange member 711. The protruding part 712a has a cylindrical shape, and is designed to extend coaxially from the main body 712d. Meanwhile, the outer diameter of the main body 712d is equal to the outer diameter of the large-diameter flange 722.

As shown in FIG. 7E, in the main body 712d of the second flange member 712, second securing holes 712b (six second securing holes 712b in the example shown in the drawing) corresponding to the securing holes of the large-diameter flange 722 are formed coaxially with the securing holes of the large-diameter flange 722.

As shown in FIG. 7F, a tapered part 712c is formed at the top edge of the protruding part 712a of the second flange member 712, so that the later described first sealing member 714 is easily squashed.

Referring now to FIG. 7G, a method of using the connector 710 is described. FIG. 7G is a flowchart showing an example of a method of connecting pipes having different flange sizes, using the connector 710.

In the example shown in FIG. 7G the first flange member 711 is first placed coaxially on the small-diameter flange 721 in an overlapping manner (step S701). Circumferential positioning is then performed so that the first securing holes 711a of the first flange member 711 face the securing holes of the small-diameter flange 721.

Screws are then inserted into both the first securing holes 711a of the first flange member 711 and the securing holes of the small-diameter flange 721, so that the first flange member 711 is screwed to the small-diameter flange 721 (step S702). Since a countersink 711c is formed at one end of each first securing hole 711a, the head of each screw is housed in the corresponding countersink 711c, and does not protrude outside the first flange member 711.

A first sealing member 714 is then inserted coaxially into the first flange member 711 (step S703). The first sealing member 714 may be a metallic gasket, or may be an O-ring made of resin.

The second flange member 712 is then placed on the first flange member 711 in an overlapping manner (step S704). The protruding part 712a of the second flange member 712 enters the first flange member 711, and the first sealing member 714 is interposed between the protruding part 7124 and the small-diameter flange 721. As the protruding part 712a enters the first flange member 711, the second flange member 712 is maintained in this state. Circumferential positioning is then performed so that the second securing holes 712b of the second flange member 712 face the second securing holes 711b of the first flange member 711.

The large-diameter flange 722 is then placed on the second flange member 712 in an overlapping manner, while a second sealing member 715 is interposed between the main body 712d of the second flange member 712 and the large-diameter flange 722 (step S705). The second sealing member 715 may be a metallic gasket, or may be an O-ring made of resin. Circumferential positioning is then performed so that the securing holes of the large-diameter flange 722 face the second securing holes 712b of the second flange member 712 and the second securing holes 711b of the first flange member 711.

Screws are then inserted collectively into the second securing holes 711b of the first flange member 711, the second securing holes 712b of the second flange member 712, and the securing holes of the large-diameter flange 722, so that the first flange member 711 and the second flange member 712 are collectively screwed to the large-diameter flange 722 (step S706). At this stage, the first sealing member 714 is squashed between the protruding part 712a of the second flange member 712 and the small-diameter flange 721, so that the second flange member 712 and the small-diameter flange 721 are tightly connected. Also, the second sealing member 715 is squashed between the main body 712d of the second flange member 712 and the large-diameter flange 722, so that the second flange member 712 and the large-diameter flange 722 are tightly connected.

According to this embodiment described above, the first flange member 711 is screwed to the small-diameter flange 721, and the first flange member 711 and the second flange member 712 are collectively screwed to the large-diameter flange 722, so that the small-diameter flange 721 and the large-diameter flange 722 are tightly connected via the connector 710. Unlike the conventional connecting pipe 790, the connector 710 does not require the tubular main body 793 (see FIG. 7A), and accordingly, the pipe distance can be greatly shortened. According to the results of tests conducted by the inventors, the pipe distance of the conventional connecting pipe 790 is 100 mm, but the pipe distance in this embodiment can be shortened to 17.5 mm. Thus, space can be saved, and evacuation efficiency can be increased. Also, the withstand load of the connecting part can be increased in a case where the pipe extends horizontally.

Also, according to this embodiment, the tapered part 712c is formed at the top edge of the protruding part 712a of the second flange member 712. Accordingly, when the first sealing member 714 is squashed between the protruding part 712a of the second flange member 712 and the small-diameter flange 721, the load to be applied from the protruding part 712a onto the first sealing member 714 becomes greater, and it becomes easier to squash the first sealing member 714.

Further, according to this embodiment, the outer diameter of the first flange member 711 and the outer diameter of the second flange member 712 are both equal to the outer diameter of the large-diameter flange 722. Thus, neither the first flange member 711 nor the second flange member 712 protrudes in a radial direction, and space can be saved.

REFERENCE SIGNS LIST

710 Connector
711 First flange member
711a First securing hole
711b Second securing hole
711c Countersink
712 Second flange member
712a Protruding part
712b Second securing hole
712c Tapered part
712d Main body
714 First sealing member
715 Second sealing member
721 Small-diameter flange
722 Large-diameter flange Seventh Embodiment Technical Field This embodiment relates to an electron beam generator, and more particularly, to an electron beam generator that generates electron beams.

Related Art

Some electron beam irradiation apparatuses each emit one electron beam onto a sample, and some electron beam irradiation apparatuses each emit electron beams onto a sample. In the latter case, an electron beam generator needs to generate more than one electron beam. In such a case, a diaphragm having openings formed therein is provided. As an electron beam passes through the openings, the electron beam is divided into electron beams.

Problem to be Solved by this Embodiment

In such an electron beam generator, however, an electron beam is cut off by the diaphragm, resulting in poor efficiency.

Therefore, this embodiment aims to provide an electron beam generator that efficiently generates electron beams, and an electron beam irradiation apparatus that includes such an electron beam generator.

Solution to Problem

<Aspect 1>
An electron beam generator comprising:
a photoelectric surface that emits light by receiving light;
a diaphragm facing the photoelectric surface;
a first insulator between the diaphragm and the photoelectric surface;
a plurality of electrodes between the diaphragm and the first insulator; and
a second insulator between the diaphragm and the plurality of electrodes,
wherein an opening is provided on each of the diaphragm, the second insulator, the plurality of electrodes and the first insulator so that a plurality of positions on the photoelectric surface are exposed.
<Aspect 2>
An electron beam generator comprising:
a first insulator on which a plurality of openings are provided;
a photoelectric surface comprising a plurality of photoelectric elements which are located at least part of the plurality of openings, the photoelectric surface emitting an electron beam by receiving light;
a diaphragm facing the first insulator,
a plurality of electrodes between the diaphragm and the first insulator; and
a second insulator between the diaphragm and the plurality of electrodes,
wherein an opening is provided on each of the diaphragm, the second insulator and the plurality of electrodes so that each of the plurality of photoelectric elements is exposed.
<Aspect 3>
An electron beam generator comprising:
a photoelectric surface that emits an electron beam by receiving light;
a plurality of electrodes apart from the photoelectric surface, an opening being provided on each of the electrodes at a position facing at least a part of the photoelectric surface;
first and second insulators on which an opening is provided, the plurality of electrodes being between the first and the second insulators so as not block the opening of the plurality of electrodes, a distant between the first insulator and the photoelectric surface being closer than a distance between the second insulator and the photoelectric surface; and
a diaphragm facing the second insulator, an opening being provided on the diaphragm, the diaphragm not blocking the opening of the second insulator.
<Aspect 4>
The electron beam generator according to aspect one of 1 to 3, wherein a voltage can be applied on each of the plurality of electrodes independently.
<Aspect 5>
The electron beam generator according to aspect one of 1 to 4, wherein one of a first voltage and a second voltage can be switchably applied on each of the plurality of electrodes, the first voltage being for emitting the electron beam, the second voltage being for not emitting the electron beam.
<Aspect 6>
The electron beam generator according to aspect one of 1 to 4, wherein one of a first voltage higher than a threshold and a second voltage lower than the threshold can be switchably applied on each of the plurality of electrodes, the threshold being determined according to a work function of the photoelectric surface and a frequency of the light irradiated on the photoelectric surface.
<Aspect 7>
The electron beam generator according to aspect one of 1 to 6, wherein each of the plurality of electrodes are formed of a plurality of poles.

This electron beam generator can be used not only in an electron beam irradiation apparatus but also in an exposure device or an inspection device.

Effect of this Embodiment

It is possible to efficiently generate electron beams.

Brief Description of Drawings

Figure 8A:
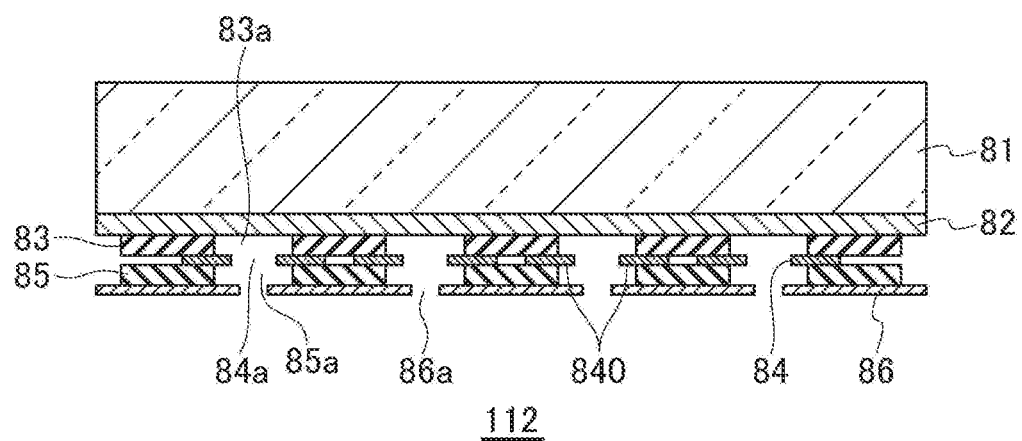
FIG. 8A is a cross-sectional view of an electron beam generator 112 according to this embodiment.
Figure 8B:
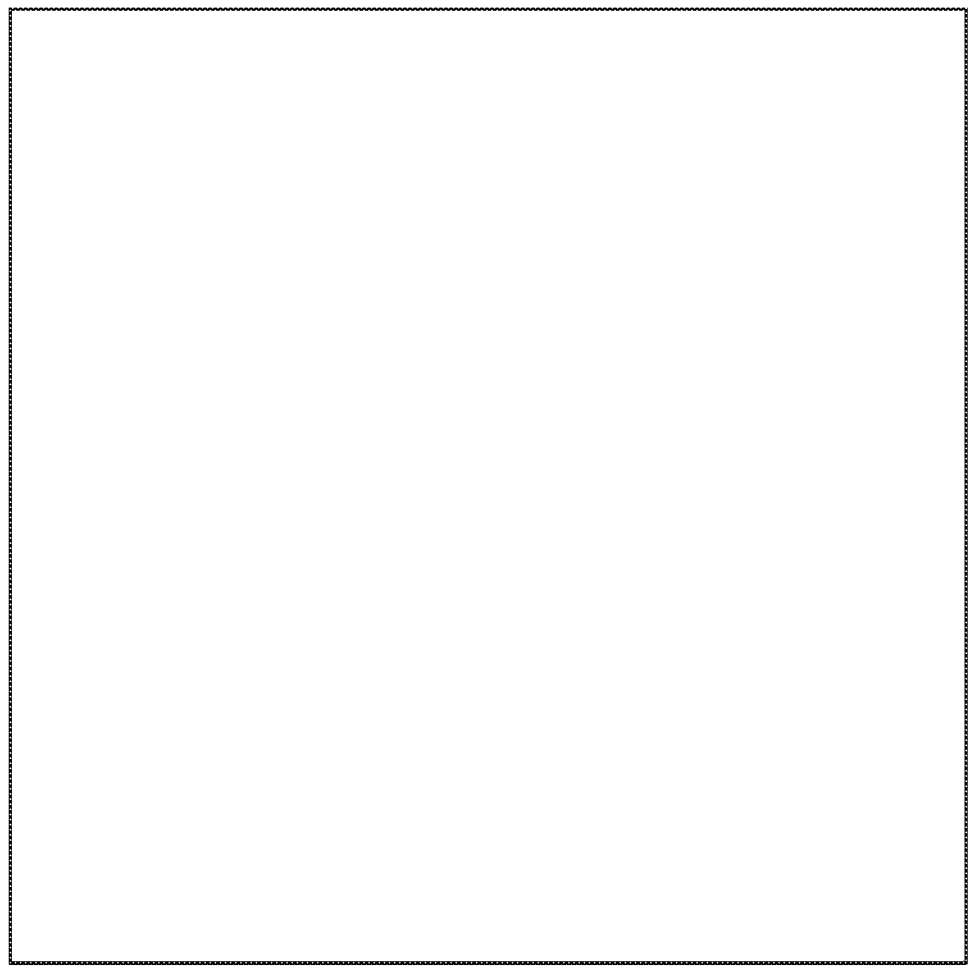
FIG. 8B is a diagram showing a photoelectric surface 82 viewed from below.
Figure 8D:
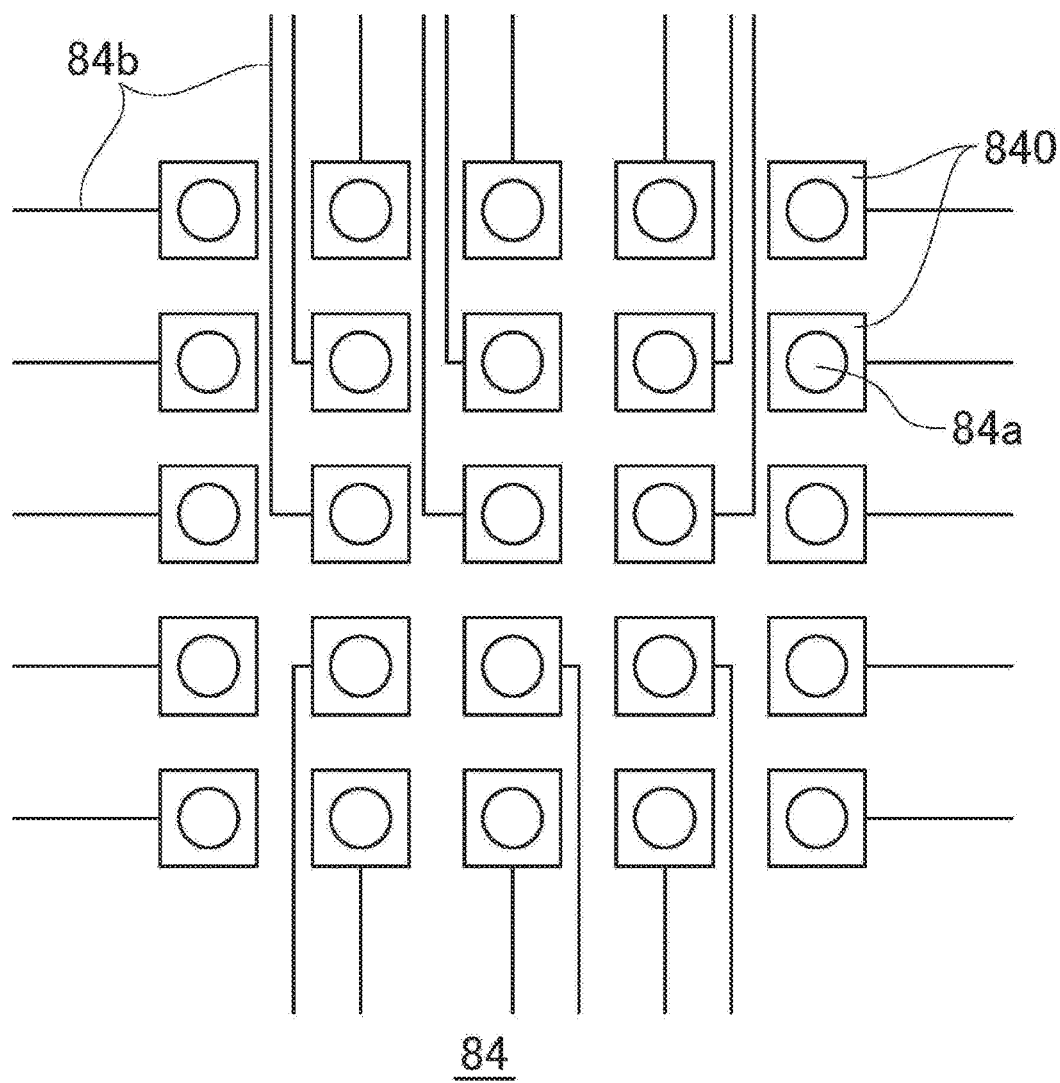
FIG. 8D is a diagram of an electrode array 84 viewed from below.
Figure 8F:
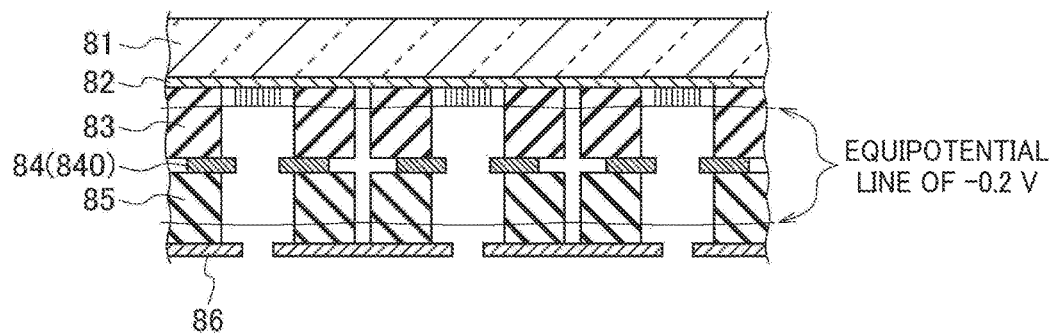
FIG. 8F is a simulation result showing the shape of electron beams emitted in a case where the voltage applied to each electrode 840 is −1.00 V.
Figure 8H:
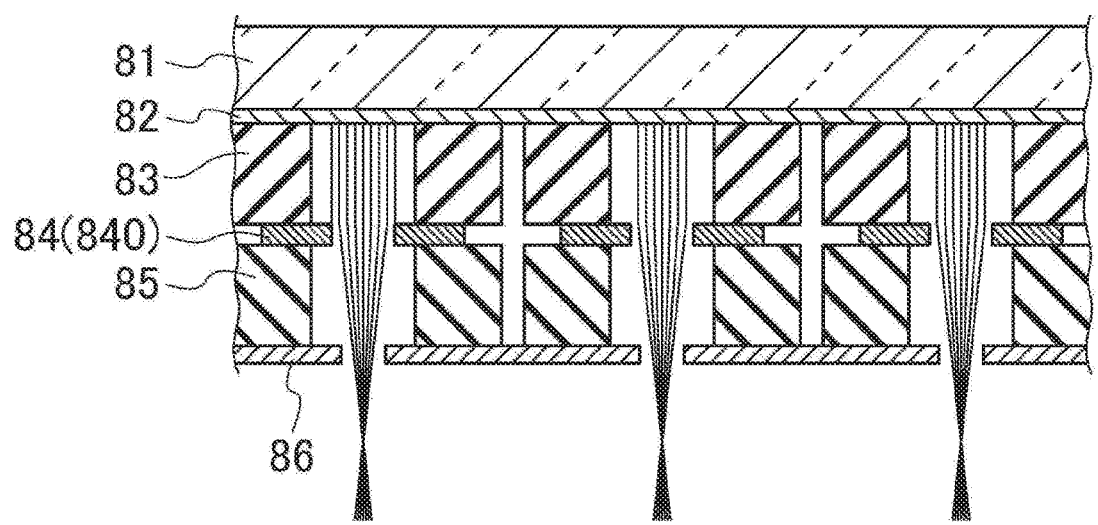
FIG. 8H is a simulation result showing the shape of electron beams emitted in a case where the voltage applied to each electrode 840 is −0.13 V.
Figure 8I:
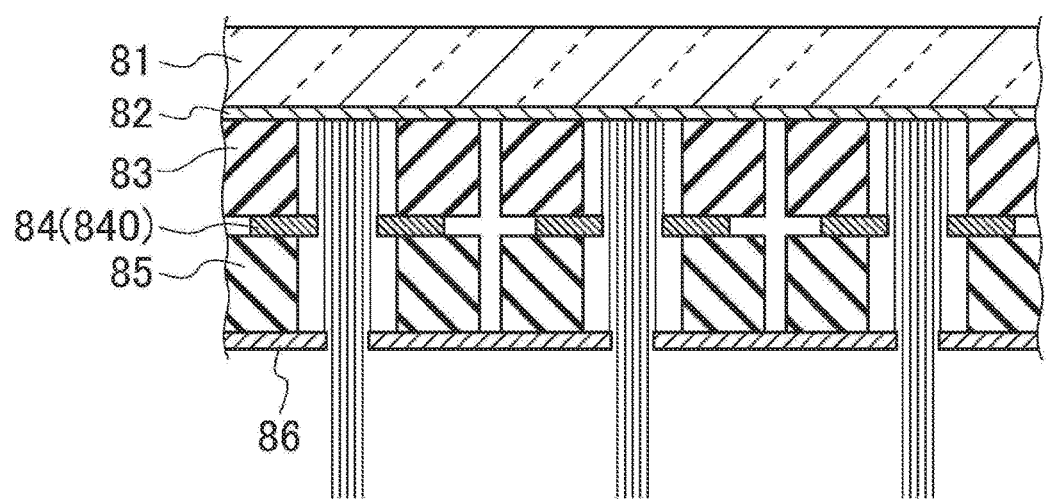
FIG. 8I is a simulation result showing the shape of electron beams emitted in a case where the voltage applied to each electrode 840 is 0.00 V.
Figure 8J:
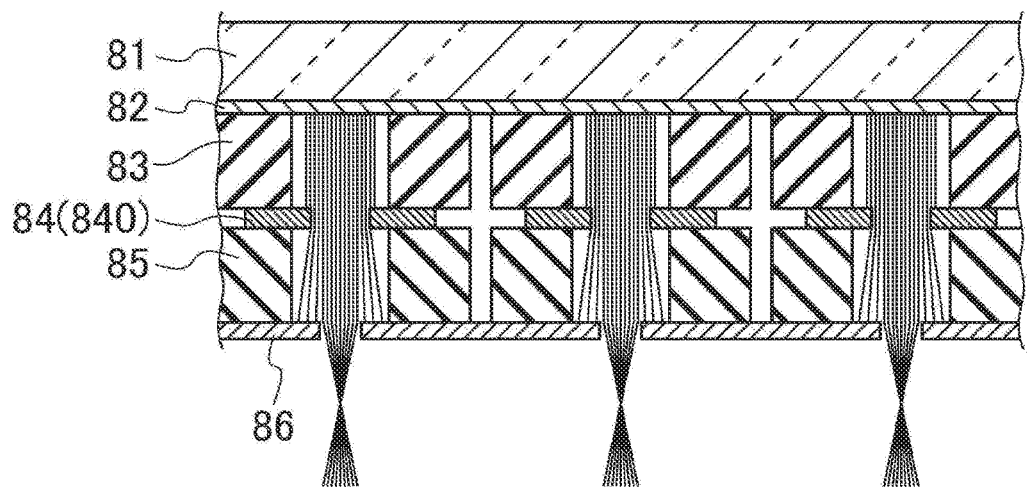
FIG. 8J is a simulation result showing the shape of electron beams emitted in a case where the voltage applied to each electrode 840 is +2.00 V.
Figure 8L:
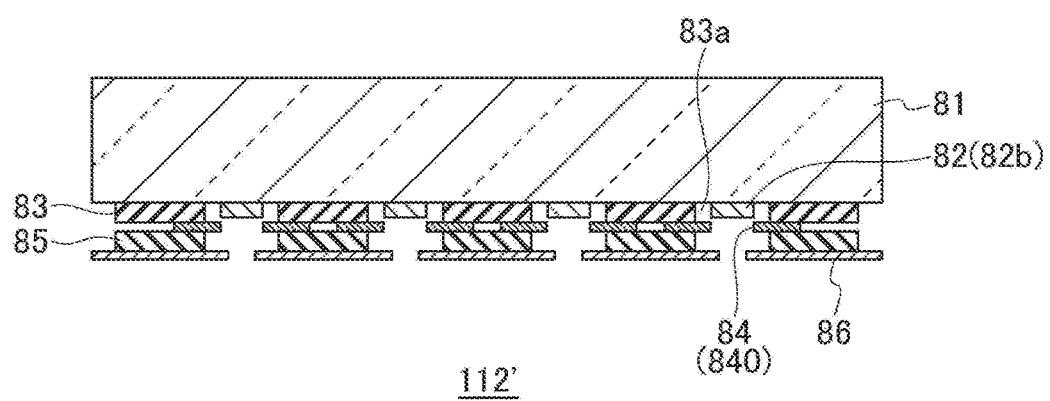
FIG. 8L is a cross-sectional view of an electron beam generator 112' according to a modification of FIG. 8A.
Figure 8M:
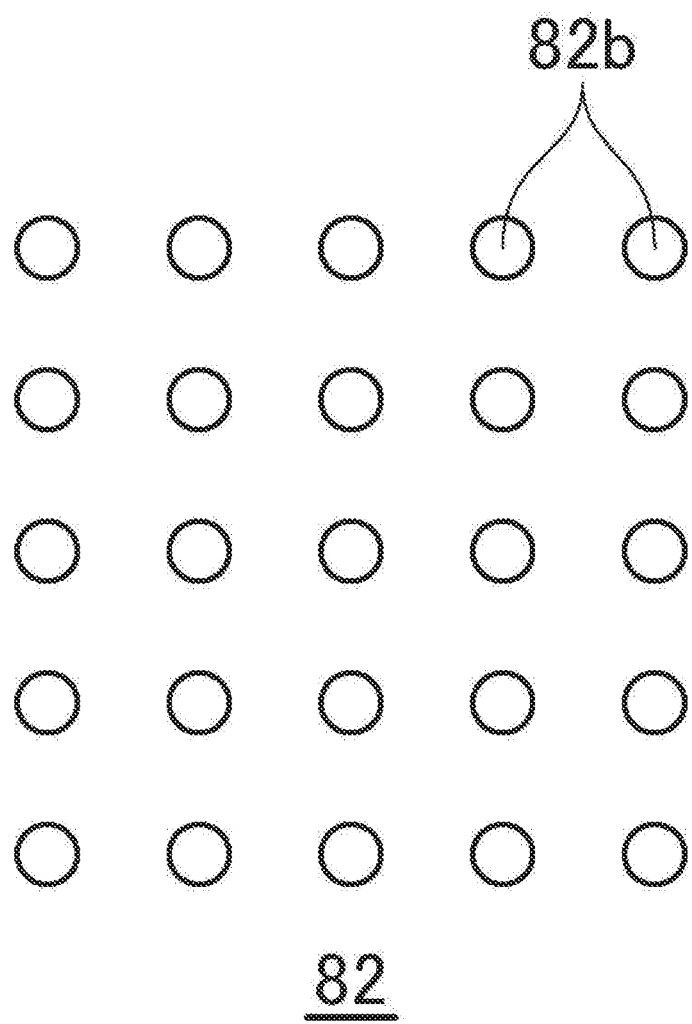
FIG. 8M is a diagram showing a photoelectric surface 82 viewed from below.
Figure 8N:
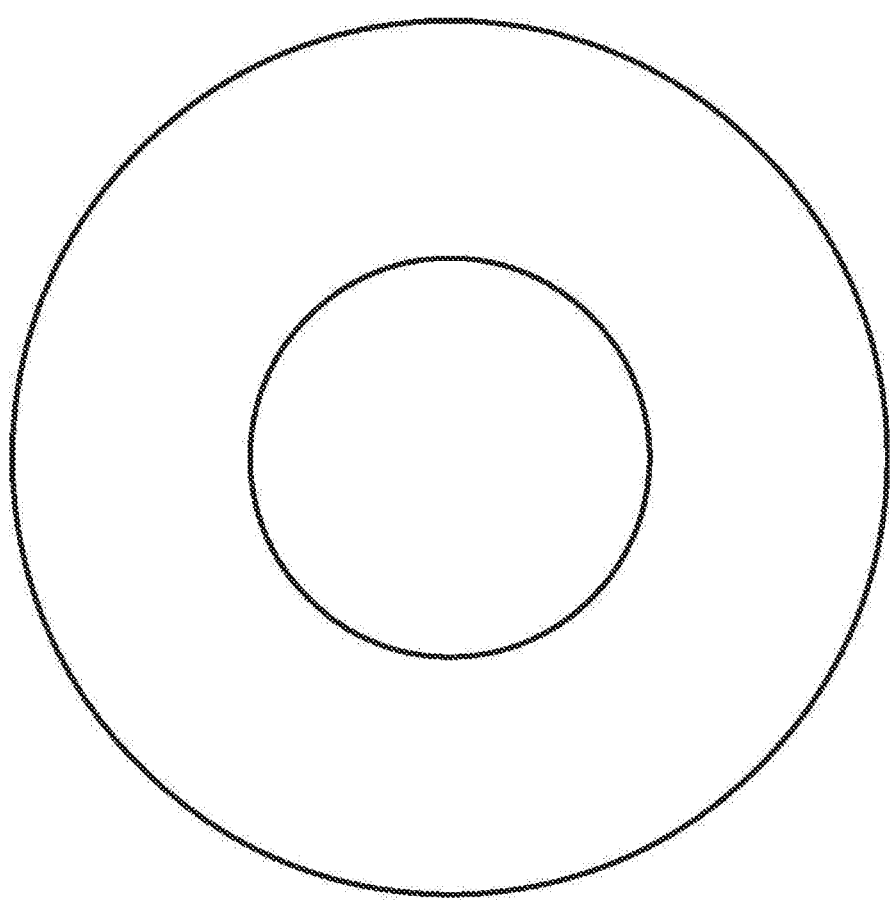
FIG. 8N is a diagram showing a variation of an electrode 840.
Figure 8O:
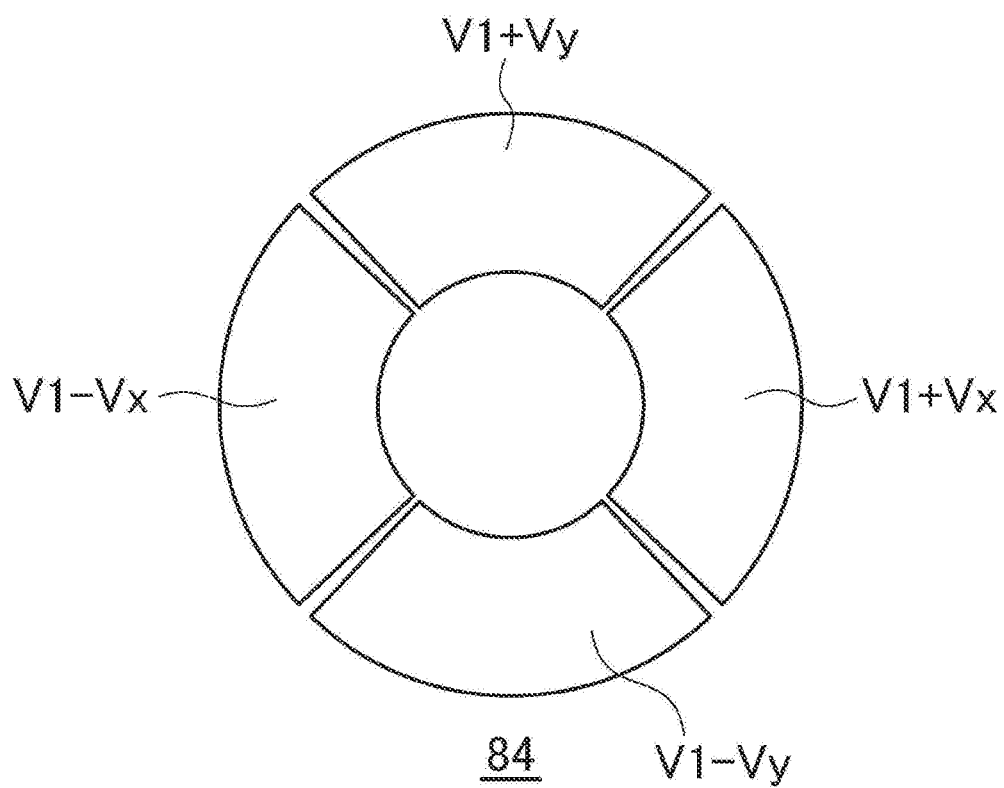
FIG. 8O is a diagram showing a variation of an electrode 840.

FIG. 8A is a cross-sectional view of an electron beam generator 112 according to this embodiment;

FIG. 8B is a diagram showing a photoelectric surface 82 viewed from below;

FIG. 8C is a diagram showing an insulating layer 83 viewed from below;

FIG. 8D is a diagram of an electrode array 84 viewed from below;

FIG. 8E is a diagram showing a diaphragm 86 viewed from below;

FIG. 8F is a simulation result showing the shape of electron beams emitted in a case where the voltage applied to each electrode 840 is −1.00 V;

FIG. 8G is a simulation result showing the shape of electron beams emitted in a case where the voltage applied to each electrode 840 is −0.50 V;

FIG. 8H is a simulation result showing the shape of electron beams emitted in a case where the voltage applied to each electrode 840 is −0.13 V;

FIG. 8I is a simulation result showing the shape of electron beams emitted in a case where the voltage applied to each electrode 840 is 0.00 V;

FIG. 8J is a simulation result showing the shape of electron beams emitted in a case where the voltage applied to each electrode 840 is +2.00 V;

FIG. 8K is a simulation result showing the shapes of electron beams emitted in a case where the voltages applied to adjacent electrodes 840a through 840c are −0.50 V, −0.13 V, and −0.50 V, respectively;

FIG. 8L is a cross-sectional view of an electron beam generator 112' according to a modification of FIG. 8A:

FIG. 8M is a diagram showing a photoelectric surface 82 viewed from below;

FIG. 8N is a diagram showing a variation of an electrode 840;

FIG. 8O is a diagram showing a variation of an electrode 840;

FIG. 8P is a diagram showing a variation of an electrode 840; and

Figure 8Q:
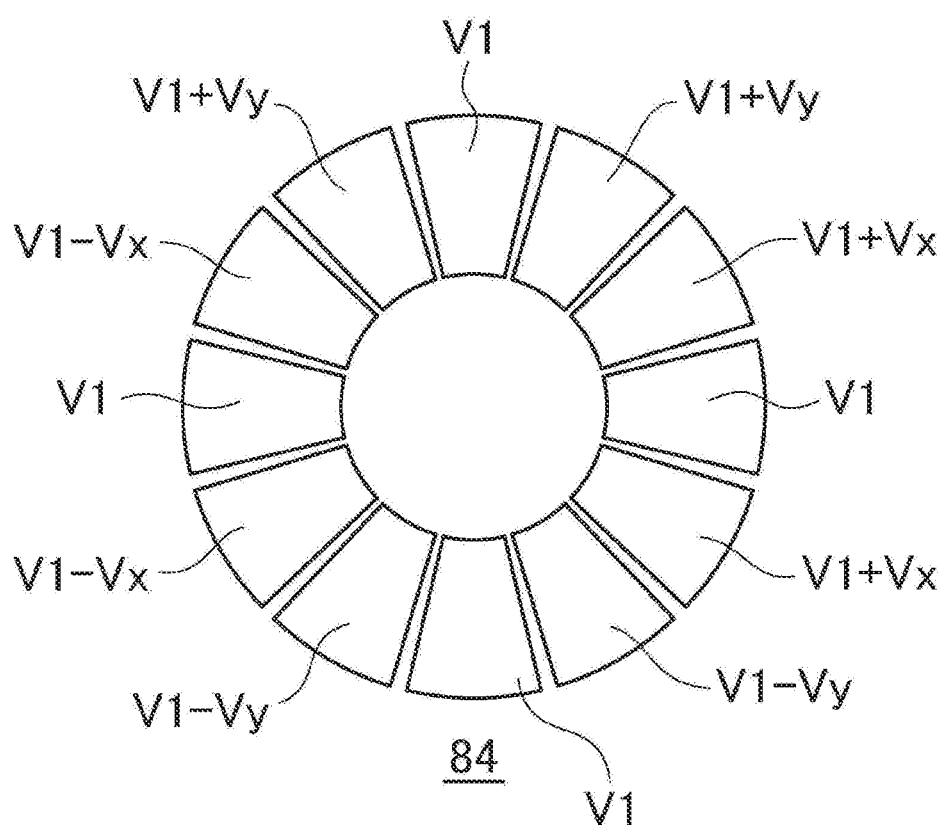
FIG. 8Q is a diagram showing a variation of an electrode 840.

FIG. 8Q is a diagram showing a variation of an electrode 840.

Mode for Carrying Out this Embodiment

FIG. 8A is a cross-sectional view of an electron beam generator 112 according to this embodiment. The electron beam generator 112 includes a substrate 81 made of an insulator such as glass, a photoelectric surface 82, an insulating layer 83, an electrode array 84 formed with electrodes 840, an insulating layer 85, and a diaphragm 86. The electron beam generator 112 is controlled by the electron beam controller 132 shown in FIG. 1A. However, the electron beam controller 132 may be part of the electron beam generator 112.

FIG. 8B is a diagram showing the photoelectric surface 82 viewed from below. The photoelectric surface 82 is made of a photoelectron generating material with a low work function. The photoelectric surface 82 is a rectangle, and is formed on the substrate 81 (see FIG. 8A). A reference voltage (such as GND) is applied to the photoelectric surface 82. Receiving light such as ultraviolet or laser light, the photoelectric surface 82 emits an electron beam.

FIG. 8C is a diagram showing the insulating layer 83 viewed from below. The insulating layer 83 is formed with a ceramic or kapton sheet, for example. The insulating layer 83 has a rectangular external shape, and openings 83a having almost round shapes are formed and arranged in a matrix fashion in the insulating layer 83. The insulating layer 83 is disposed immediately below the photoelectric surface 82 (see FIG. 8A). With this arrangement, part of the photoelectric surface 82 is covered with the insulating layer 83, but the remaining part (which is the portions facing the openings 83a) of the photoelectric surface 82 is exposed.

FIG. 8D is a diagram of the electrode array 84 viewed from below. Each electrode 840 has an almost square external shape, and an opening 84a having an almost round shape is formed in each electrode 840. These openings 84a are smaller than the openings 83a of the insulating layer 83. Such electrodes 840 are arranged in a matrix fashion immediately below the insulating layer 83 (see FIG. 8A). More specifically, the electrode array 84 is positioned so that the opening 84a of each electrode 840 is located at the center of each corresponding opening 83a of the insulating layer 83. The distance from the photoelectric surface 82 to the electrode array 84 is several μm to several mm, for example.

Also, as shown in FIG. 8D, wiring lines 84b (not shown in FIG. 8A) are connected to the respective electrodes 840 and extend outward. Under the control of the electron beam controller 132 (FIG. 1A), a predetermined voltage (described later in detail) is applied to each electrode 840 via each corresponding wiring line 84b. The wiring lines 84b may be printed on the insulating layer 83 or the insulating layer 85.

In FIG. 8A, the insulating layer 85 has the same shape as the insulating layer 83, and openings 85a are also formed in the insulating layer 85. Although the electrodes 840 are interposed between the two insulating layers 83 and 85, the openings 84a of the electrodes 840 are not blocked.

FIG. 8E is a diagram showing the diaphragm 86 viewed from below. The diaphragm 86 is made of a metal such as tantalum or molybdenum. The diaphragm 86 has a rectangular external shape, and openings 86a having almost round shapes are formed and arranged in a matrix fashion in the diaphragm 86. These openings 86a are smaller than the openings 84a of the electrodes 840. Such a diaphragm 86 is disposed immediately below the insulating layer 85 (see FIG. 8A). More specifically, the diaphragm 86 is positioned so that each opening 86a of the diaphragm 86 is located at the center of each corresponding opening 85a of the insulating layer 85. In other words, the diaphragm 86 covers the insulating layer 85 so that the insulating layer 85 is not exposed.

An anode (not shown) is further provided below the diaphragm 86, and a voltage that is higher than the reference voltage by several volts to several tens of kV is applied thereto.

As described above with reference to FIGS. 8A through 8E, the diaphragm 86 faces the photoelectric surface 82 in the electron beam generator 112. The insulating layer 83 is provided between the diaphragm 86 and the photoelectric surface 82. The electrodes 840 are also provided between the diaphragm 86 and the insulating layer 83. The insulating layer 85 is further provided between the diaphragm 86 and the electrodes 840. To expose appropriate portions of the photoelectric surface 82, the openings 86a, 85a, 84a, and 83a are formed in the diaphragm 86, the insulating layer 85, the electrodes 840, and the insulating layer 83, respectively.

In other words, in the structure of the electron beam generator 112, each of the electrodes 840 has an opening 84a at a portion facing at least part of the photoelectric surface 82, and is located at a distance from the photoelectric surface 82. The electrodes 840 are interposed between the insulating layers 83 and 85 having the openings 83a and 85a formed therein so as not to block the openings 84a of the electrodes 840. Also, the diaphragm 86 having the openings 86a formed therein is positioned to face the insulating layer 85 so as not to block at least part of each of the openings 85a of the insulating layer 85.

In the electron beam generator 112 having the above described structure, electron beams emitted from the exposed portions of the photoelectric surface 82 pass through the openings 86a, 85a, 84a, and 83a.

The electron beam generator 112 operates as follows.

Under the control of the electron beam controller 132 (FIG. 1A), an on-voltage for emitting electron beams and an off-voltage for emitting no electron beams are switchably applied to each electrode 840. The on-voltage is a voltage equal to or higher than the reference voltage to be applied to the photoelectric surface 82, and the off-voltage is a lower voltage than the reference voltage. In a case where the reference voltage is GND, for example, the on-voltage is 0 to several volts, and the off-voltage is a negative voltage of several volts.

In a case where the off-voltage is applied to an electrode 840, a negative barrier appears on the photoelectric surface 82, and therefore, no electron beams are emitted.

In a case where the on-voltage is applied to an electrode 840, no barriers appear. Accordingly, electron beams are extracted, and are emitted through the openings 84a of the electrodes 840.

In a case where this electron beam generator 112 is used in an electron beam irradiation apparatus, the electron beam controller 132 may apply the on-voltage or the off-voltage to all the electrodes 840 at once. In a case where this electron beam generator 112 is used in an exposure device or an inspection device, on the other hand, the electron beam controller 132 is preferably capable of applying the on-voltage or the off-voltage to the electrodes 840 separately from one another. In this manner, each electron-beam irradiated area can be finely controlled, and a drawing pattern for an exposure device can be formed, for example.

With this structure in which the openings 86a of the diaphragm 86 are located at the portions facing the respective openings 84a of the electrodes 840, an electron beam from the photoelectric surface 82 is hardly cut off by the diaphragm 86, and can be efficiently used in irradiating a sample W. Also, since the energy of collision with the diaphragm 86 is low, X-rays are hardly generated, and there is no need to take any measures against X-rays.

The insulating layers 83 and 85 are further provided to face the photoelectric surface 82. Even if an electron beam collides with a gas and generates positive ions, the positive ions hardly reach the photoelectric surface 82, and the photoelectric surface 82 is prevented from deteriorating.

As the distance from the substrate 81 to the diaphragm 86 can be made shorter, the optical path length can be shortened accordingly. Since any large current does not flow from the photoelectric surface 82 to the diaphragm 86, resolution degradation due to the Boersch effect can be prevented.

Further, when a sample W is not to be irradiated with any electron beam (so-called blanking), the deflector 115 (FIG. 1A) does not need to greatly deflect an electron beam, and the off-voltage should be applied to an electrode 840, for example. Since any electron beam is not generated, contamination can be reduced.

The electron beam controller 132 is preferably capable of applying a voltage to the diaphragm 86. An applied voltage can deflect an emitted electron beam, and the electron beam generator 112 can also serve as a deflector.

Next, the results of simulations performed on the electron beam generator 112 shown in FIG. 8A are described. In FIG. 8A, the substrate 81 is a glass substrate. The insulating layers 83 and 85 each have a thickness of 10 μm, and the openings 83a and 85a each have a diameter of 10 μm. Each electrode 840 has a thickness of 2 μm, and each opening 84a has a diameter of 6 μm. The diaphragm 86 has a thickness of 2 μm, and each opening 86a has a diameter of 4 μm. The distance between the center of the opening 84a of one electrode 840 and the center of the opening 84a of an adjacent electrode 840 is 30 μm.

As a calculation condition, the electron emission energy Eem is 0.2 eV. The electron emission energy Eem is expressed by the following equation.

$$Eem = h\nu - W$$

Here, h represents Planck's constant, ν represents the frequency of light (such as ultraviolet light) emitted onto the photoelectric surface 82, and W represents the work function of the photoelectric surface 82.

FIGS. 8F through 8J are simulation results showing the shapes of electron beams emitted in cases where the voltages applied to each electrode 840 are −1.00 V, −0.50 V, −0.13 V, 0.00 V, and +2.00) V, respectively.

In FIGS. 8F and 8G, the applied voltages (−1.00 V and −0.50 V) are lower than the electron emission energy Eem, and therefore, an equipotential line of −0.2 V is formed between the photoelectric surface 82 and the electrode array 84. Because of this negative barrier, electron beams do not reach the electrode array 84.

In FIG. 8H, the applied voltage is higher than the electron emission energy Eem, and therefore, any barrier is not formed between the photoelectric surface 82 and the electrode array 84. Since the applied voltage is a negative voltage (−0.13 V), electron beams are bent (or are narrowed) in directions away from the inner circumferential edges of the electrodes 840 (or in directions toward the centers of the openings 84a), and then pass through the openings 86a of the diaphragm 86.

In FIG. 8I, the applied voltage is higher than the electron emission energy Eem, and therefore, any barrier is not formed between the photoelectric surface 82 and the electrode array 84. Since the applied voltage is 0.00 V, electron beams pass through the openings 84a of the electrodes 840, and then pass through the openings 86a of the diaphragm 86.

In FIG. 8J, the applied voltage is higher than the electron emission energy Eem, and therefore, any barrier is not formed between the photoelectric surface 82 and the electrode array 84. Since the applied voltage is a positive voltage (+2.00 V), electron beams are bent (or are spread) in directions toward the inner circumferential edges of the electrodes 840 (or in directions away from the centers of the openings 84a), and then pass through the openings 86a of the diaphragm 86.

As described above, when a higher voltage than the threshold voltage (−0.2 V in this example) corresponding to the electron emission energy Eem (−0.2 eV in this example) is applied to the electrodes 840, electron beams are emitted. That is, a voltage that is equal to or higher than the threshold voltage, and a voltage that is lower than the threshold voltage are switchably applied to the electrodes 840.

FIG. 8K is a simulation result showing the shapes of electron beams emitted in a case where the voltages applied to adjacent electrodes 840*a* through 840*c* are −0.50 V, −0.13 V, and −0.50 V, respectively. As shown in the drawing, since −0.50 V (<Eem) is applied to the electrodes 840*a* and 840*c*, no electron beams reach the electrodes 840*a* and 840*c*. Since −0.13 V (>Eem) is applied to the electrode 840*b*, on the other hand, an electron beam passes through the opening 86*a* of the diaphragm 86 corresponding to the electrode 840*b*. In this manner, control can be performed to determine whether to emit an electron beam for each electrode 840.

FIG. 8L is a cross-sectional view of an electron beam generator 112' according to a modification of FIG. 8A. Different aspects from FIG. 8A will be mainly explained in the description below.

FIG. 8M is a diagram showing the photoelectric surface 82 viewed from below. The shape of the photoelectric surface 82 differs from that in the electron beam generator 112 shown in FIG. 8A. The photoelectric surface 82 is formed with photoelectric elements 82*b* that have an almost round shape and are arranged in a matrix fashion. Such a photoelectric surface 82 is formed on the substrate 81 (see FIG. 8L).

Referring back to FIG. 8L, the shapes of the insulating layer 83, the electrode array 84, the insulating layer 85, and the diaphragm 86 are the same as those shown in FIGS. 8C through 8E. However, the insulating layer 83 is formed on the substrate 81 so that the photoelectric elements 82*b* are housed in the openings 83*a*.

As described above, in the electron beam generator 112', the insulating layer 83 having the openings 83*a* formed therein is formed on the substrate 81. Each photoelectric element 82*b* of the photoelectric surface 82 is disposed at least part of each corresponding opening 83*a*. The diaphragm 86 faces the insulating layer 83. The electrodes 840 are provided between the diaphragm 86 and the insulating layer 83. The insulating layer 85 is also provided between the diaphragm 86 and the electrodes 840. To expose each of the photoelectric elements 82*b*, the openings 86*a*, 85*a*, and 84*a* are formed in the diaphragm 86, the insulating layer 85, and the electrodes 840, respectively.

In other words, in the structure of the electron beam generator 112', each of the electrodes 840 has an opening 84*a* at a portion facing at least part of the photoelectric surface 82, and is located at a distance from the photoelectric surface 82. The electrodes 840 are interposed between the insulating layers 83 and 85 having the openings 83*a* and 85*a* formed therein so as not to block the openings 84*a* of the electrodes 840. Also, the diaphragm 86 having the openings 86*a* formed therein is positioned to face the insulating layer 85 so as not to block at least part of each of the openings 85*a* of the insulating layer 85.

As electron beams from the photoelectric elements 82*b* of the photoelectric surface 82 pass through the openings 84*a*, 85*a*, and 86*a*, the electron beam generator 112' shown in FIG. 8L operates in the same manner as the electron beam generator 112 shown in FIG. 8A.

FIGS. 8N through 8Q are diagrams showing variations of electrodes 840. As shown in each of the drawings, the external shape of an electrode 840 may be almost round. An electrode 840 may have a round hole (FIG. 8N), four poles (FIG. 8O), eight poles (FIG. 8P), 12 poles (FIG. 8Q), or the like. In a case where an electrode 840 is formed with poles as shown in FIGS. 8O through 8Q, a lens voltage V1, an x-direction deflecting voltage Vx, and a y-direction deflecting voltage Vy are applied as shown in each of the drawings, so that the electrode 840 functions as a lens and a deflector.

As described above in this embodiment, the electrodes 840 having the openings 84*a* formed therein are provided to face the photoelectric surface 82, and the diaphragm 86 having the openings 86*a* formed at portions facing the openings 84*a* is also provided. Accordingly, electron beams to be cut off by the diaphragm 86 can be reduced, and electron beams can be efficiently generated.

REFERENCE SIGNS LIST

81 Substrate
82 Photoelectric surface
82*b* Photoelectric element
83 Insulating layer
83*a* Opening
84 Electrode array
840 Electrode
84*a* Opening
84*b* Wiring line
85 Insulating layer
85*a* Opening
86 Diaphragm
86*a* Opening
112, 112' Electron beam generator

What is claimed is:

1. An electron-beam irradiated region correction method implemented in an electron beam irradiation apparatus that is designed to irradiate a rectangular region as a target with an electron beam by applying a voltage V1(t) to a first electrode to perform scanning in a first direction with an electron beam from an electron beam generator, and applying a voltage V2(t) to a second electrode to perform scanning in a second direction with the electron beam, the voltage V1(t) varying with time t, the voltage V2(t) varying with time t, the second direction being perpendicular to the first direction, the electron-beam irradiated region correction method comprising correcting an electron-beam irradiated region to have a rectangular shape by applying a voltage V1(t)+kV2(t) (k being a constant) to the first electrode and applying the voltage V2(t) to the second electrode, when the electron-beam irradiated region is not a rectangular region but a parallelogram region distorted in the first direction.

2. The electron-beam irradiated region correction method according to claim 1, wherein the constant k is set to make the electron-beam irradiated region closer to a rectangular shape.

3. The electron-beam irradiated region correction method according to claim 1, wherein an absolute value of the constant k is set at a greater value when the distortion in the first direction is larger.

4. The electron-beam irradiated region correction method according to claim 1, wherein the voltage V2(t) repeats N0 times a process of changing to another value after a period T0 has passed since the voltage V2(t) became a certain value, the voltage V1(t) repeats N0 times a process of linearly changing in cycles of the period T0, the period T0 corresponds to a length of the rectangular shape in the first direction, and the number N0 of times corresponds to a length of the rectangular shape in the second direction.

5. The electron-beam irradiated region correction method according to claim 1, wherein
the voltage $V1(t)$ repeats N0 times a process of changing to another value after a period T0 has passed since the voltage $V1(t)$ became a certain value,
the voltage $V2(t)$ repeats N0 times a process of linearly changing in cycles of the period T0,
the period T0 corresponds to a length of the rectangular shape in the second direction, and the number N0 of times corresponds to a length of the rectangular shape in the first direction.

6. An electron beam irradiation apparatus that is designed to irradiate a rectangular region as a target with an electron beam by applying a voltage $V1(t)$ to a first electrode to perform scanning in a first direction with an electron beam from an electron beam generator, and applying a voltage $V2(t)$ to a second electrode to perform scanning in a second direction with the electron beam, the voltage $V1(t)$ varying with time t, the voltage $V2(t)$ varying with time t, the second direction being perpendicular to the first direction,
the electron beam irradiation apparatus comprising
an electron beam control device that applies a voltage $V1(t)+kV2(t)$ (k being a constant) to the first electrode and applies the voltage $V2(t)$ to the second electrode, when an electron-beam irradiated region is not a rectangular region but a parallelogram region distorted in the first direction,
whereby the electron beam control device corrects the electron-beam irradiated region to have a rectangular shape.

7. An electron beam irradiation apparatus comprising:
an electron beam generator that generates an electron beam;
a first electrode that deflects the electron beam from the electron beam generator in a first direction;
a second electrode that deflects the electron beam from the electron beam generator in a second direction perpendicular to the first direction; and
an electron beam control device that controls voltages to be applied to the first electrode and the second electrode, wherein
the electron beam irradiation apparatus is designed to irradiate a rectangular region as a target with an electron beam by applying a voltage $V1(t)$ to the first electrode to perform scanning in the first direction with the electron beam from the electron beam generator, and applying a voltage $V2(t)$ to the second electrode to perform scanning in the second direction with the electron beam, the voltage $V1(t)$ varying with time t, the voltage $V2(t)$ varying with time t, and,
when an electron-beam irradiated region is not a rectangular region but a parallelogram region distorted in the first direction, the electron beam control device applies a voltage $V1(t)+kV2(t)$ (k being a constant) to the first electrode and applies the voltage $V2(t)$ to the second electrode, to correct the electron-beam irradiated region to have a rectangular shape.

\* \* \* \* \*